US011404003B2

(12) United States Patent
Jeong et al.

(10) Patent No.: US 11,404,003 B2
(45) Date of Patent: Aug. 2, 2022

(54) PIXEL AND A DISPLAY DEVICE HAVING THE SAME

(71) Applicant: SAMSUNG DISPLAY CO., LTD., Yongin-si (KR)

(72) Inventors: Min Jae Jeong, Yongin-si (KR); Jun Hyun Park, Yongin-si (KR); Hyun Joon Kim, Yongin-si (KR); Kyung Hoon Chung, Yongin-si (KR); Jang Mi Kang, Yongin-si (KR); Hae Min Kim, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 0 days.

(21) Appl. No.: 17/190,587

(22) Filed: Mar. 3, 2021

(65) Prior Publication Data

US 2022/0028333 A1 Jan. 27, 2022

(30) Foreign Application Priority Data

Jul. 23, 2020 (KR) ........................ 10-2020-0091872

(51) Int. Cl.
*G09G 3/3233* (2016.01)
*G09G 3/3266* (2016.01)
(Continued)

(52) U.S. Cl.
CPC ......... *G09G 3/3233* (2013.01); *G09G 3/3266* (2013.01); *G09G 3/3275* (2013.01);
(Continued)

(58) Field of Classification Search
CPC ...... G09G 3/3266; G09G 3/3275; G09G 3/32; G09G 2300/0426; G09G 2300/0439;
(Continued)

(56) References Cited

U.S. PATENT DOCUMENTS 7,414,599 B2 8/2008 Chung et al.
9,024,934 B2 5/2015 Park et al.
(Continued)

FOREIGN PATENT DOCUMENTS

CN 110189705 8/2019
EP 2372685 10/2011
(Continued)

OTHER PUBLICATIONS

European Search Report issued by the European Patent Office dated Nov. 4, 2021 in corresponding European Patent Application No. 21186766.8.

*Primary Examiner* — Alexander Eisen
*Assistant Examiner* — Nathaniel P Brittingham
(74) *Attorney, Agent, or Firm* — F. Chau & Associates, LLC

(57) ABSTRACT

A pixel including: a light emitting element; a first transistor connected between a first power source and a second node; a first capacitor connected to a first node or a second node and a third node; a second transistor between the third node and a data line, the second transistor turned on by a first scan signal; a third transistor between the first and second nodes, the third transistor turned on by a second scan signal; a fifth transistor between the first power source and the first transistor, the fifth transistor turned on by a first emission control signal; a sixth transistor between the second node and the light emitting element, the sixth transistor turned on by a second emission control signal; and an eighth transistor between the second node and a second emission control line, the eighth transistor turned on by a fourth scan signal.

28 Claims, 44 Drawing Sheets

(51) Int. Cl.
*G09G 3/3275* (2016.01)
*G09G 3/32* (2016.01)

(52) U.S. Cl.
CPC ....... *G09G 3/32* (2013.01); *G09G 2300/0426* (2013.01); *G09G 2300/0819* (2013.01); *G09G 2310/08* (2013.01); *G09G 2320/0247* (2013.01); *G09G 2320/0257* (2013.01); *G09G 2330/021* (2013.01)

(58) Field of Classification Search
CPC ....... G09G 2300/0819; G09G 2310/08; G09G 2320/0247; G09G 2320/0257; G09G 2330/021; G09G 3/3233–3291
See application file for complete search history.

(56) References Cited

U.S. PATENT DOCUMENTS

| | | | | |
|---|---|---|---|---|
| 10,255,855 | B2 | 4/2019 | Park et al. | |
| 10,453,391 | B2 | 10/2019 | Chen et al. | |
| 2017/0092191 | A1* | 3/2017 | An | G09G 3/3233 |
| 2019/0051247 | A1* | 2/2019 | Chang | H01L 27/3262 |
| 2020/0027402 | A1 | 1/2020 | Xiao et al. | |
| 2020/0394961 | A1 | 12/2020 | Kim et al. | |
| 2021/0027696 | A1 | 1/2021 | Kim et al. | |
| 2021/0027701 | A1 | 1/2021 | Park et al. | |
| 2021/0027702 | A1 | 1/2021 | Park et al. | |
| 2021/0125543 | A1 | 4/2021 | Kim et al. | |
| 2021/0256908 | A1 | 8/2021 | Park et al. | |
| 2021/0327988 | A1* | 10/2021 | Park | H01L 27/3276 |
| 2021/0398490 | A1 | 12/2021 | Park et al. | |
| 2021/0398508 | A1 | 12/2021 | Lee et al. | |

FOREIGN PATENT DOCUMENTS

| | | |
|---|---|---|
| EP | 3147894 | 3/2017 |
| EP | 3896735 | 10/2021 |
| KR | 10-0560780 | 3/2006 |
| KR | 10-2014-0013586 | 2/2014 |
| KR | 10-2017-0049787 | 5/2017 |
| KR | 10-2020-0142646 | 12/2020 |
| KR | 10-2021-0011553 | 2/2021 |
| KR | 10-2021-0011554 | 2/2021 |
| KR | 10-2021-0013509 | 2/2021 |
| KR | 10-2021-0050050 | 5/2021 |
| KR | 10-2021-0106052 | 8/2021 |
| KR | 10-2021-0158457 | 12/2021 |
| KR | 10-2021-0158458 | 12/2021 |

* cited by examiner

<DSP>

<DSP>

<DSP>

<DSP>

<DSP>

<DSP>

<DSP>

<SSP>

<SSP>

<SSP>

<SSP>

<SSP>

<DSP>

<SSP>

<DSP>

<SSP>

<DSP>

<SSP>

<DSP>

<DSP>

<DSP>

<DSP>

<DSP>

<DSP>

<SSP>

<SSP>

<SSP>

<SSP>

<SSP>

<DSP>

<DSP>

<SSP>

<SSP>

<SSP>

<SSP>

PIXEL AND A DISPLAY DEVICE HAVING THE SAME

CROSS-REFERENCE TO RELATED APPLICATION

The present application claims priority under 35 U.S.C. § 119(a) to Korean patent application no. 10-2020-0091872 filed on Jul. 23, 2020 in the Korean Intellectual Property Office, the disclosure of which is incorporated by reference herein in its entirety.

1. Technical Field

The present invention relates to a pixel and a display device having the same.

2. Discussion of Related Art

In general, a display device is an output device for presentation of information in visual form. With the development of information technologies, the importance of a display device as a connection medium between a user and information increases.

The display device generally includes a plurality of pixels. Each of the pixels includes a plurality of transistors, a light emitting element electrically connected to the transistors, and a capacitor. The transistors are turned on in response to signals provided through a line, e.g., a scan or data line, to generate a driving current. The light emitting element emits light corresponding to the driving current.

A display device may be driven at a low frequency to increase the driving efficiency of the display device and to minimize power consumption of the display device. However, when a display device is driven at a low frequency, display quality may suffer.

SUMMARY

In accordance with an embodiment of the present invention, there is provided a pixel including: a light emitting element; a first transistor connected between a first power source and a second node, the first transistor controlling a driving current supplied to the light emitting element; a first capacitor including a first electrode connected to one of a first node and a second node and a second electrode connected to a third node; a second transistor connected between the third node and a data line, the second transistor being turned on by a first scan signal; a third transistor connected between the first node and the second node, the third transistor being turned on by a second scan signal; a fifth transistor connected between the first power source and the first transistor, the fifth transistor being turned on by a first emission control signal; a sixth transistor connected between the second node and the light emitting element, the sixth transistor being turned on by a second emission control signal; and an eighth transistor connected between the second node and a second emission control line, the eighth transistor being turned on by a fourth scan signal.

The pixel may further include: a fourth transistor connected between a reference power source and the third node, the fourth transistor being turned on by a third scan signal; and a second capacitor connected between the first power source and the first node, wherein the first electrode of the first capacitor is connected to the second node.

The pixel may further include a seventh transistor connected between the light emitting element and an initialization power source, the seventh transistor being turned on by the third scan signal.

A frame may include an initialization period in which the initialization power source is supplied to the first node and a fourth node between the light emitting element and the seventh transistor, a compensation period in which the first node and the second node are electrically connected to each other, a writing period in which a data signal is supplied to the third node, a bias period in which a bias voltage is supplied to the first transistor, and an emission period in which the light emitting element emits light.

The bias period may include an on-bias period in which the first transistor has an on-bias state, and during the on-bias period, the third and sixth transistors are turned off, and the eighth transistor is turned on.

The bias period may include an off-bias period in which the first transistor has an off-bias state, and during the off-bias period, the third transistor is turned off, and the eighth transistor is turned on.

The bias period may include an off-bias period in which the first transistor has an off-bias state, and during the off-bias period, the third transistor is turned off, and the sixth and seventh transistors are turned on.

In response to the second scan signal, the third transistor may be turned on in the initialization period, the compensation period, and the writing period, and is turned off in the bias period and the emission period, and in response to the third scan signal, the seventh transistor may be turned on in the initialization period and the compensation period, and turned off in the writing period, the bias period, and the emission period.

In response to the second scan signal, the third transistor may be turned on in the initialization period, the compensation period, and the writing period, and turned off in the bias period and the emission period, and in response to the third scan signal, the seventh transistor may be turned on in the initialization period, the compensation period, and the off-bias period, and turned off in the writing period, a period except the off bias period in the bias period, and the emission period.

The pixel may further include: a second capacitor connected between the first power source and the third node; and a fourth transistor connected between a reference power source and the third node, the fourth transistor being turned on by the second scan signal, wherein the first electrode of the first capacitor is connected to the first node.

The pixel may further include a seventh transistor connected between the light emitting element and an initialization power source, the seventh transistor being turned on by a third scan signal.

A frame may include an initialization period in which the initialization power source is supplied to the first node and a fourth node between the light emitting element and the seventh transistor, a compensation period in which the first node and the second node are electrically connected to each other, a writing period in which a data signal is supplied to the third node, a bias period in which a bias voltage is supplied to the first transistor, and an emission period in which the light emitting element emits light.

The bias period may include an on-bias period in which the first transistor has an on-bias state, and during the on-bias period, the fifth and sixth transistors are turned off, and the eighth transistor is turned on.

The bias period may include an off-bias period in which the first transistor has an off-bias state, and during the off-bias period, the fifth transistor is turned off, and the eighth transistor is turned on.

The bias period may include an on-bias period in which the first transistor has an on-bias state, and during the on-bias period, the sixth transistor is turned off, and the fifth transistor is turned on.

The bias period may include an off-bias period in which the first transistor has an off-bias state, and during the off-bias period, the fifth transistor is turned off, and the sixth and seventh transistors are turned off.

In accordance with an embodiment of the present invention, there is provided a display device including: a display panel including pixels connected to first scan lines, second scan lines, third scan lines, first emission control lines, second emission control lines, and data lines; a scan driver configured to supply a first scan signal to the first scan lines, supply a second scan signal to the second scan lines, and supply a third scan signal to the third scan lines; an emission driver configured to supply a first emission control signal to the first emission control lines, and supply a second emission control signal to the second emission control lines; a data driver configured to supply a data signal to the data lines; and a timing controller configured to control the scan driver, the emission driver, and the data driver, wherein at least one of the pixels includes: a light emitting element; a first transistor connected between a first power source and a second node, the first transistor controlling a driving current supplied to the light emitting element; a first capacitor connected between the second node and a third node; a second transistor connected between the third node and a corresponding data line among the data lines, the second transistor being switched on by the first scan signal; a third transistor connected between the first node and the second node, the third transistor being switched on by the second scan signal; a fourth transistor connected between a reference power source and the third node, the fourth transistor being switched on by the third scan signal; a fifth transistor connected between the first power source and the first transistor, the fifth transistor being switched on by the first emission control signal; a sixth transistor connected between the second node and the light emitting element, the sixth transistor being switched on by the second emission control signal; a seventh transistor connected between the light emitting element and an initialization power source, the seventh transistor being switched on by the third scan signal; and a second capacitor connected between the first power source and the first node.

The scan driver may include a first scan driver which supplies the first scan signal to the first scan lines at a second frequency, a second scan driver which supplies the second scan signal to the second scan lines at the second frequency corresponding to an image refresh rate of the pixels, and a third scan driver which supplies the third scan signal to the third scan lines at a first frequency, the emission driver may include a first emission driver which supplies the first emission control signal to the first emission control lines at the first frequency and a second emission driver which supplies the second emission control signal to the second emission control lines at the first frequency, and the data driver may supply a data signal to the data lines according to the second frequency.

The first scan driver and the second scan driver may supply the first scan signal and the second scan signal during a display scan period in a frame, and not supply the first scan signal and the second scan signal during a self-scan period in the frame, during the display scan period, the data signal may be written to the pixels, and during the display scan period and the self-scan period, the first transistor may be biased by the initialization power source, the third scan signal, and the second emission control signal.

The pixels may further be connected to fourth scan lines, the scan driver may further include a fourth scan driver which supplies a fourth scan signal to the fourth scan lines at the first frequency, and the at least one pixel may further include an eighth transistor connected between the second node and a corresponding second emission control line among the second emission control lines, the eighth transistor being switched on by the fourth scan signal.

The first scan driver and the second scan driver may supply the first scan signal and the second scan signal during a display scan period in a frame, and not supply the first scan signal and the second scan signal during a self-scan period in the frame, during the display scan period, the data signal may be written to the pixels, and during the display scan period and the self-scan period, the first transistor may be biased by the fourth scan signal and the second emission control signal.

An image refresh rate of the pixels may decrease as a number of self-scan periods increases.

The second frequency may correspond to a divisor of the first frequency.

In accordance with an embodiment of the present invention, there is provided a display device including: a display panel including pixels connected to first scan fines, second scan lines, third scan lines, first emission control lines, second emission control lines, and data lines; a scan driver configured to supply a first scan signal to the first scan lines, supply a second scan signal to the second scan lines, and supply a third scan signal to the third scan lines; an emission driver configured to supply a first emission control signal to the first emission control lines, and supply a second emission control signal to the second emission control lines; a data driver configured to supply a data signal to the data lines; and a timing controller configured to control the scan driver, the emission driver, and the data driver, wherein at least one of the pixels includes: a light emitting element; a first transistor connected between a first power source and a second node, the first transistor controlling a driving current supplied to the light emitting element; a first capacitor connected between the first node and a third node; a second capacitor connected between the first power source and the third node; a second transistor connected between the third node and a corresponding data line among the data lines, the second transistor receiving the first scan signal; a third transistor connected between the first node and the second node, the third transistor receiving the second scan signal; a fourth transistor connected between a reference power source and the third node, the fourth transistor receiving the second scan signal; a fifth transistor connected between the first power source and the first transistor, the fifth transistor receiving the first emission control signal; a sixth transistor connected between the second node and the light emitting element, the sixth transistor receiving the second emission control signal; and a seventh transistor connected between the light emitting element and an initialization power source, the seventh transistor receiving the third scan signal.

The scan driver may include a first scan driver which supplies the first scan signal to the first scan lines at a second frequency corresponding to an image refresh rate of the pixels, a second scan driver which supplies the second scan signal to the second scan lines at the second frequency, and a third scan driver which supplies the third scan signal to the third scan lines at a first frequency, the emission driver may include a first emission driver which supplies the first emission control signal to the first emission control lines at the first frequency and a second emission driver which supplies the second emission control signal to the second emission control lines at the first frequency, and the data driver may supply a data signal to the data lines according to the second frequency.

The first scan driver and the second scan driver may supply the first scan signal and the second scan signal during a display scan period in a frame, and not supply the first scan signal and the second scan signal during a self-scan period in the frame, during the display scan period, the data signal may be written to the pixels, and during the self-scan period, the first transistor may be biased by a first power provided from the first power source and the first emission control signal.

The pixels may further be connected to fourth scan lines, the scan driver may further include a fourth scan driver which supplies a fourth scan signal to the fourth scan lines at the first frequency, and the at least one pixel may further include an eighth transistor connected between the second node and a corresponding second emission control line among the second emission control lines, the eighth transistor receiving the fourth scan signal.

The first scan driver and the second scan driver may supply the first scan signal and the second scan signal during a display scan period in a frame, and not supply the first scan signal and the second scan signal during a self-scan period in the frame, during the display scan period, the data signal may be written to the pixels, and during the display scan period and the self-scan period, the first transistor may be biased by the fourth scan signal and the second emission control signal.

The pixels may further be connected to fourth scan lines, the scan driver may further include a fourth scan driver which supplies a fourth scan signal to the fourth scan lines at the first frequency, and the at least one pixel may further include an eighth transistor connected between the second node and a corresponding first emission control line among the first emission control lines, the eighth transistor receiving the fourth scan signal.

The pixels may further be connected to fourth scan lines, the scan driver may further include a fourth scan driver which supplies a fourth scan signal to the fourth scan lines at the first frequency, and the at least one pixel may further include an eighth transistor connected between a fifth node between the first transistor and the fifth transistor and a corresponding second emission control line among the second emission control lines, the eighth transistor receiving the fourth scan signal.

The pixels may further be connected to fourth scan lines, the scan driver may further include a fourth scan driver which supplies a fourth scan signal to the fourth scan lines at the first frequency, and the at least one pixel may further include an eighth transistor connected between a fifth node between the first transistor and the fifth transistor and a corresponding first emission control line among the first emission control lines, the eighth transistor receiving the fourth scan signal.

BRIEF DESCRIPTION OF THE DRAWINGS

FIGS. 11A, 118, 11C, 11D, 11E and 11F are waveform diagrams illustrating an example of an operation of the pixel shown in FIG. 10.

FIGS. 12A, 128, 12C, 12D and 12E are waveform diagrams illustrating an example of the operation of the pixel shown in FIG. 10.

DETAILED DESCRIPTION OF THE EMBODIMENTS

Figure 1:
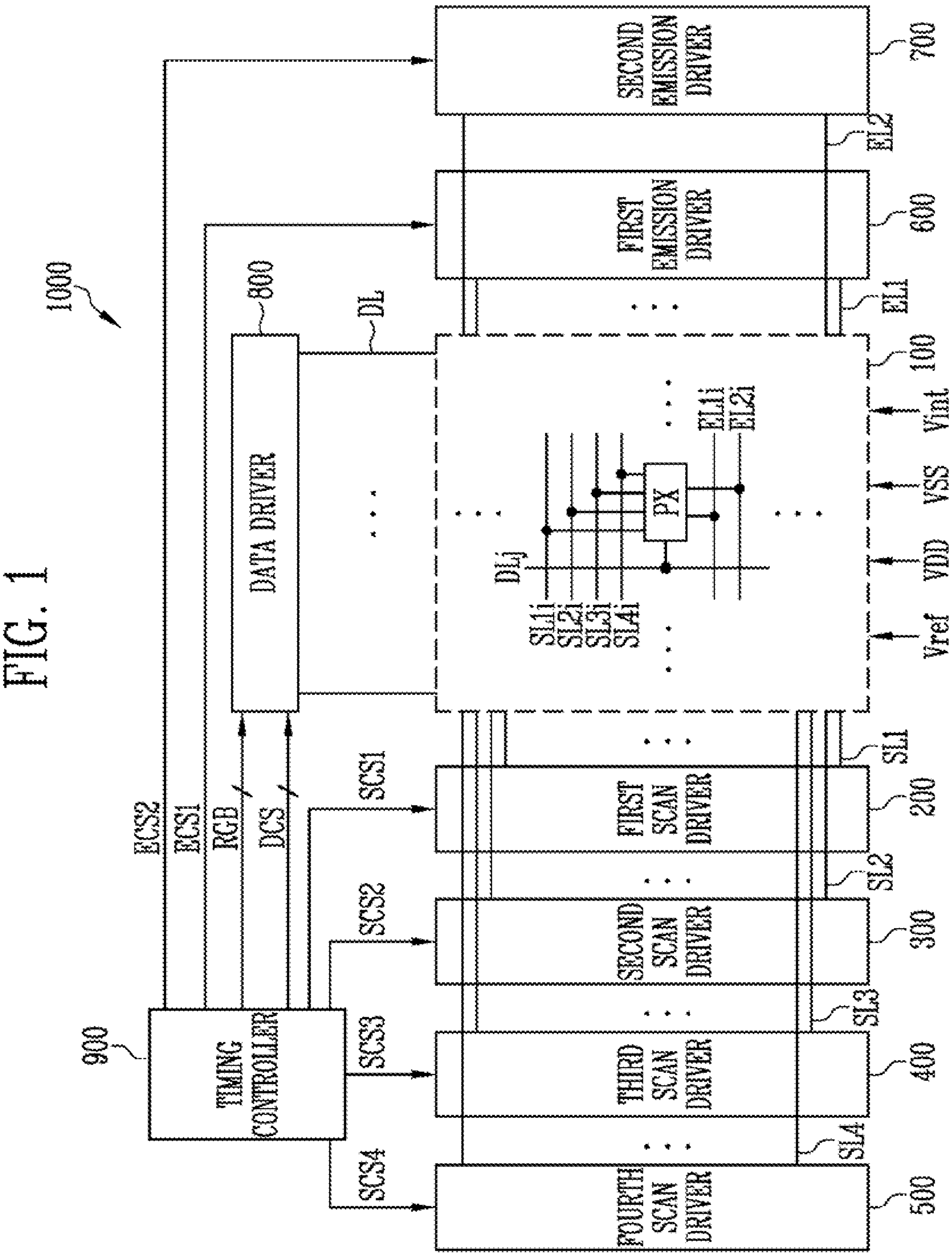
FIG. 1 is a block diagram illustrating a display device in accordance with embodiments of the present invention.

Embodiments of the present invention will now be described more fully hereinafter with reference to the accompanying drawings. It will be understood, however, that the present invention may be embodied in different forms and should not be construed as limited to the embodiments set forth herein.

In the drawings, dimensions may be exaggerated for clarity of illustration. It will be understood that when an element is referred to as being "between" two elements, it can be the only element between the two elements, or one or more intervening elements may also be present. Like reference numerals may refer to like elements throughout the specification.

As used herein, the singular forms are intended to include the plural forms as well, unless the context clearly indicates otherwise.

In the specification, when an element is referred to as being "connected" or "coupled" to another element, it can be directly connected or coupled to the another element or be indirectly connected or coupled to the another element with one or more intervening elements interposed therebetween.

FIG. 1 is a block diagram illustrating a display device in accordance with embodiments of the present invention.

Referring to FIG. 1, a display device 1000 may include a display panel 100, a first scan driver 200, a second scan driver 300, a third scan driver 400, and a fourth scan driver 500, a first emission driver 600 and a second emission driver 700, a data driver 800, and a timing controller 900.

The first scan driver 200, second scan driver 300, third scan driver 400, and fourth scan driver 500 may be four separate scan drivers or part of one singular scan driver. The first emission driver 600 and second emission driver 700 may be two separate emission drivers or part of one singular emission driver. However, the division of the scan driver and the emission driver is for convenience of description, and at least some of the scan drivers and the emission drivers may be integrated as one driving circuit, one module, or the like.

In an embodiment of the present invention, the display device 1000 may further include a power supply to supply, to the display panel 100, a voltage of a first power source VDD, a voltage of a second power source VSS, a voltage of a third power source Vref (or reference power source), and a voltage of a fourth power source Vint (or initialization power source). The power supply may supply a low power source and a high power source, which determine a gate-on level and a gate-off level of a scan signal, a control signal, and/or an emission control signal, to the first to fourth scan drivers 200, 300, 400 and 500, and/or the first and second emission drivers 600 and 700. The low power source may have a voltage level lower than that of the high power source. However, this is merely illustrative, and at least one of the low power source and the high power source may be supplied from the timing controller 900 or the data driver 800.

In some embodiments of the present invention, the first power source VDD and the second power source VSS may generate voltages for driving a light emitting element. The first power source VDD may be provided via a first power line and the second power source VSS may be provided via a second power line. In an embodiment of the present invention, a voltage level of the second power source VSS may be lower than that of the first power source VDD. For example, the voltage of the first power source VDD may be a positive voltage, and the voltage of the second power source VSS may be a negative voltage.

The reference power source Vref may be a power source for initializing a pixel PX. For example, a capacitor and/or a transistor, included in the pixel PX, may be initialized by the voltage of the reference power source Vref. The voltage of the reference power source Vref may be a positive voltage.

The initialization power source Vint may be a power source for initializing the pixel PX. For example, a driving transistor and/or a light emitting element, included in the pixel PX, may be initialized by the voltage of the initialization power source Vint. The voltage of the initialization power source Vint may be a negative voltage.

The display device 1000 may display an image at various image refresh rates (e.g., driving frequencies, or screen refresh rates) according to different driving conditions. The image refresh rate is a frequency at which a data signal is written to the driving transistor of the pixel P. For example, the image refresh rate, which is also referred to as a screen scan rate or a screen refresh frequency, represents a frequency at which a display screen is reproduced for one second.

In an embodiment of the present invention, an output frequency of the data driver 800 with respect to one horizontal line (or pixel row) and/or an output frequency of the first scan driver 200 which outputs a write scan signal may be determined to correspond to the image refresh rate. For example, a refresh rate for moving image driving may be a frequency of about 60 Hz or more (e.g., 120 Hz).

In an embodiment of the present invention, the display device 1000 may adjust an output frequency of the first to fourth scan drivers 200, 300, 400, and 500 with respect to one horizontal line (or pixel row) and an output frequency of the data driver 800, which corresponds thereto. For example, the display device 1000 may display an image, corresponding to various image refresh rates of 1 Hz to 120 Hz. However, this is merely illustrative, and the display device 1000 may display an image at an image refresh rate of 120 Hz or more (e.g., 240 Hz or 480 Hz).

The display panel 100 may include pixels PX respectively connected to data lines DL, first, second, third and fourth scan lines SL1, SL2, SL3, and SL4, and first and second emission control lines EL1 and EL2. The pixels PX may be supplied with the voltages of the first power source VDD, the second power source VSS, the initialization power source Vint, and the reference power source Vref from the outside. In an embodiment of the present invention, a pixel disposed on an ith row and a jth column (i and j are natural numbers) may be connected to scan lines SL1*i*, SL2*i*, SL3*i*, and SL4*i* corresponding to an ith pixel row, emission control lines EL1*i* and EL2*i* corresponding to the ith pixel row, and a data line DLj corresponding to a jth pixel row.

In the present embodiment, the signal lines, e.g., the first to fourth scan lines SL1, SL2, SL3, SL4, the first and second emission control lines EL1, EL2, and the data line DL connected to the pixel PX may be variously set corresponding to a circuit structure of the pixel PX.

The timing controller 900 may generate a first driving control signal SCS1, a second driving control signal SCS2, a third driving control signal SCS3, a fourth driving control signal SCS4, a fifth driving control signal ECS1, a sixth driving control signal ECS2, and a seventh driving control signal DCS, corresponding to synchronization signals supplied from the outside. The first driving control signal SCS1 may be supplied to the first scan driver 200, the second driving control signal SCS2 may be supplied to the second scan driver 300, the third driving control signal SCS3 may be supplied to the third scan driver 400, the fourth driving control signal SCS4 may be supplied to the fourth scan driver 500, the fifth driving control signal ECS1 may be supplied to the first emission driver 600, the sixth driving control signal ECS2 may be supplied to the second emission driver 700, and the seventh driving control signal DCS may be supplied to the data driver 800. In addition, the timing controller 900 may rearrange input image data supplied from the outside into image data RGB and supply the image data RGB to the data driver 800.

A first scan start pulse and clock signals may be included in the first driving control signal SCS1. The first scan start pulse may control a first timing of a scan signal output from the first scan driver 200. The clock signals may be used to shift the first scan start pulse.

A second scan start pulse and clock signals may be included in the second driving control signal SCS2. The second scan start pulse may control a first timing of a scan signal output fro the second scan driver 300. The dock signals may be used to shift the second scan start pulse.

A third scan start pulse and clock signals may be included in the third driving control signal SCS1 The third scan start pulse may control a first timing of a scan signal output from the third scan driver 400. The clock signals may be used to shift the third scan start pulse.

A fourth scan start pulse and clock signals may be included in the fourth driving control signal SCS4. The fourth scan start pulse may control a first timing of a scan signal output from the fourth scan driver 500. The clock signals may be used to shift the fourth scan start pulse.

A first emission control start pulse and clock signals may be included in the fifth driving control signal ECS1. The first emission control start pulse may control a first timing of an emission control signal output from the first emission driver 600. The clock signals may be used to shift the first emission control start pulse.

A second emission control start pulse and clock signals may be included in the sixth driving control signal ECS2. The second emission control start pulse may control a first timing of an emission control signal output from the second emission driver 700. The clock signals may be used to shift the second emission control start pulse.

A source start pulse and clock signals may be included in the seventh driving control signal ECS. The source start pulse may control a sampling start time of data. The clock signals may be used to control a sampling operation.

The first scan driver 200 may receive the first driving control signal SCS1, from the timing controller 900, and supply a scan signal (e.g., a first scan signal) to first scan lines SL1, based on the first driving control signal SCS1. In other words, the first scan driver 200 may supply a first scan signal in response to the first driving control signal SCS1. For example, the first scan driver 200 may sequentially supply the first scan signal to the first scan lines SL1. When the first scan signal is sequentially supplied, pixels PX may be selected in a horizontal line unit (or pixel row unit), and a data signal may be supplied to the pixels PX. In other words, the first scan signal may be a signal used for data writing.

The first scan signal may be set to have a gate-on level (e.g., a low voltage). A transistor which is included in the pixel PX and receives the first scan signal may be set to a turn-on state when the first scan signal is supplied.

In an embodiment of the present invention, the first scan driver 200 may supply the scan signal (e.g., the first scan signal) to one scan line (e.g., an ith first scan line SL1*i*) among the first scan lines SL1 at the same frequency (e.g., a second frequency) as an image refresh rate of the display device 1000, corresponding to the ith first scan line SL1*i*. The second frequency may be set to a divisor of a first frequency at which the first and second emission drivers 600 and 700 is driven.

The first scan driver 200 may supply the scan signal to the first scan lines SL1 in a display scan period of one frame. For example, the first scan driver 200 may supply at least one scan signal to each of the first scan lines SL1 during the display scan period.

The second scan driver 300 may receive the second driving control signal SCS2 from the timing controller 900, and supply a scan signal (e.g., a second scan signal) to second scan lines SL2, based on the second driving control signal SCS2. In other words, the second scan driver 300 may supply the second scan signal in response to the second driving control signal SCS2. For example, the second scan driver 300 may sequentially supply the second scan signal to the second scan lines SL2. The second scan signal may be supplied to initialize the pixels PX and/or to compensate for a threshold voltage Vth. When the second scan signal is supplied, the pixels PX may perform a threshold voltage compensation operation and/or an initialization operation.

The second scan signal may be set to have a gate-on level (e.g., a low voltage). A transistor which is included in the pixel PX and receives the second scan signal may be set to the turn-on state when the second scan signal is supplied.

In an embodiment of the present invention, the second scan driver 200 may supply the scan signal (e.g., the second scan signal) to one scan line (e.g., an ith second scan line SL2*i*) among the second scan lines SL2 at the same frequency (e.g., the second frequency) as an output of the first scan driver 200, corresponding to the ith second scan line SL2*i*.

The second scan driver 300 may supply the scan signal to the second scan lines SL2 during a display scan period of one frame. For example, the second scan driver 300 may supply at least one scan signal to each of the second scan lines SL2 during the display scan period.

The third scan driver 400 may receive the third driving control signal SCS3 from the timing controller 900, and supply a scan signal (e.g., a third scan signal) to third scan lines SL3, based on the third driving control signal SCS3. In other words, the third scan driver 400 may supply the third scan signal in response to the third driving control signal SCS3. For example, the third scan driver 400 may sequentially supply the third scan signal to the third scan lines SL3. The third scan signal may be supplied to initialize a light emitting element included in each of the pixels PX and/or to initialize a capacitor included in the pixel PX. When the third scan signal is supplied the pixel PX may perform an initialization operation of the light emitting element and/or an initialization operation of the capacitor.

The third scan signal may be set to have a gate-on level (e.g., a low voltage). A transistor which is included in the pixel PX and receives the third scan signal may be set to the turn-on state when the third scan signal is supplied.

In an embodiment of the present invention, the third scan drives 400 may supply the scan signal (e.g., the third scan signal) to one scan line (e.g., an ith third scan line SLi3) among the third scan lines SL3 at a frequency (e.g., the first frequency) which is always constant regardless of the frequency of the image refresh rate of the display device 1000, corresponding to the ith third scan line SLi3.

In addition, the first frequency at which the third scan driver 400 supplies the scan signal may be set greater than the second frequency. In an embodiment of the present invention, the frequency of the image refresh rate (and the second frequency) may be set to a divisor of the first frequency.

For example, at all driving frequencies at which the display device 1000 can be driven, the third scan driver 400 may perform scanning once during a display scan period, and perform scanning at least once according to the image refresh rate during a self-scan period.

In other words, the scan signal may be sequentially output once to each of the third scan lines SL3 during the display scan period, and be sequentially output at least once to each of the third scan lines SL3 during the self-scan period.

In addition, when the image refresh rate is decreased, the third scan driver 300, may increase the number of times the scan signal is repeatedly supplied to each of the third scan lines SL3 in one frame period.

The fourth scan driver 500 may receive the fourth driving control signal SCS4 from the timing controller 900, and supply a scan signal (e.g., a fourth scan signal) to fourth scan lines SL4, based on the fourth driving control signal SCS4. In other words, the fourth scan driver 500 may supply the fourth scan signal in response to the fourth driving control signal SCS4. For example, the fourth scan driver 500 may sequentially supply the fourth scan signal to the fourth scan lines SL4. The fourth scan signal may be supplied to supply a predetermined bias voltage (e.g., an on-bias voltage and/or an off-bias voltage) to a source electrode and/or a drain electrode of a driving transistor of each of the pixels PX. When the fourth scan signal is supplied, the pixels PX may perform a supply operation of the bias voltage.

The fourth scan signal may be set to have a gate-on level (e.g., a low voltage). A transistor which is included in the pixel PX and receives the fourth scan signal may be set to the turn-on state when the fourth scan signal is supplied.

In an embodiment of the present invention, like the third scan driver 400, the fourth scan driver 500 may supply the scan signal (e.g., the fourth scan signal) to one scan line (e.g., an ith fourth scan line SL4*i*) among the fourth scan lines SL4 at the first frequency, corresponding to the ith fourth scan line SL4*i*. Therefore, in one frame period, the scan signal supplied to each of the fourth scan lines SL4 may be repeatedly supplied for every predetermined period.

Accordingly, when the image refresh rate is decreased, a number of times the fourth scan signal in one frame period is repeatedly supplied may be increased.

The first emission driver 600 may receive the fifth driving control signal ECS1 from the timing controller 900, and supply an emission control signal (e.g., a first emission control signal) to first emission control lines EL1, based on the fifth driving control signal ECS1. In other words, the first emission driver 600 may supply a first emission control signal in response to the fifth driving control signal ECS1. For example, the first emission driver 600 may sequentially supply the first emission control signal to the first emission control lines EL1.

The second emission driver 700 may receive the sixth driving control signal ECS2 from the timing controller 900, and supply an emission control signal (e.g., a second emission control signal) to second emission control lines EL2, based on the sixth driving control signal ECS2. In other words, the second emission control driver 700 may supply a second emission control signal in response to the sixth driving control signal ECS2. For example, the second emission driver 700 may sequentially supply the second emission control signal to the second emission control lines EL2.

When the first emission control signal and/or the second emission control signal are/is supplied, pixels PX may not emit light in the horizontal line unit (or pixel row unit). To accomplish this, the first emission control signal and the second emission control signal may be set to have a gate-off level (e.g., a high voltage) at which a transistor included in each of the pixels PX can be turned off. A transistor which is included in the pixel PX and receives the first emission control signal and/or the second emission control signal may be turned off when the first emission control signal and/or the second emission control signal is supplied, and be set to the turn-on state in other cases.

The first emission control signal and the second emission control signal may be used to control an emission time of the pixels PX. To accomplish this, the first emission control signal and the second emission control signal may be set to have a width wider than that of the scan signal.

In an embodiment of the present invention, the first emission control signal and/or the second emission control signal may have a plurality of gate-off level (e.g., a high voltage) periods during one frame period. For example, the first emission control signal and/or the second emission control signal may include a plurality of gate-on periods and a plurality of gate-off periods to perform bias state control, initialization, threshold voltage compensation, etc., of the driving transistor.

In an embodiment of the present invention, the second emission control signal supplied to the pixel PX may be a signal shifted by a predetermined horizontal period (e.g., six horizontal periods) from the first emission control signal. For example, the second emission control signal supplied to an nth (n is a natural number) pixel row may have the same waveform as the first emission control signal supplied to an (n+6)th pixel row. However, this is merely illustrative, and the second emission control signal may be a signal shifted by six or more horizontal periods from the first emission control signal.

In an embodiment of the present invention, the first emission control signal and the second emission control signal, which are supplied to the pixel PX, may be the same signal. For example, the first emission control signal and the second emission control signal, which are supplied to the same pixel row, may have the same waveform.

In an embodiment of the present invention, like the third scan driver 400, the first and second emission drivers 600 and 700 may supply the emission control signals (e.g., the first and second control signals) to one emission control line (e.g., an ith first emission control line EL1*i*) among the first emission control line EL1 and one emission control line (e.g., an ith second emission control line EL2*i*) among the second emission control lines EL2 at the first frequency, corresponding to the first and second ith emission control lines EL1*i* and EL2*i*. Therefore, in one frame period, the emission control signals respectively supplied to the first and second emission control lines EL1 and EL2 may be repeatedly supplied for every predetermined period.

Accordingly, when the image refresh rate is decreased, a number of times the first and second emission control signals one frame period is repeatedly supplied may be increased.

The data driver 800 may receive the seventh driving control signal DCS and the image data RGB. The data driver 800 may supply a data signal to the data lines DL, corresponding to the seventh driving control DCS. The data signal supplied to the data lines DL may be supplied to pixels PX selected by a scan signal (e.g., the first scan signal). To accomplish this, the data driver 800 may supply the data signal to the data lines DL to be synchronized with the scan signal.

In an embodiment of the present invention, the data driver 800 may supply the data signal to the data lines DL during one frame period, corresponding to the image refresh rate. For example, the data driver 800 may supply the data signal to be synchronized with the scan signal supplied to the first scan line SL1.

Figure 2:
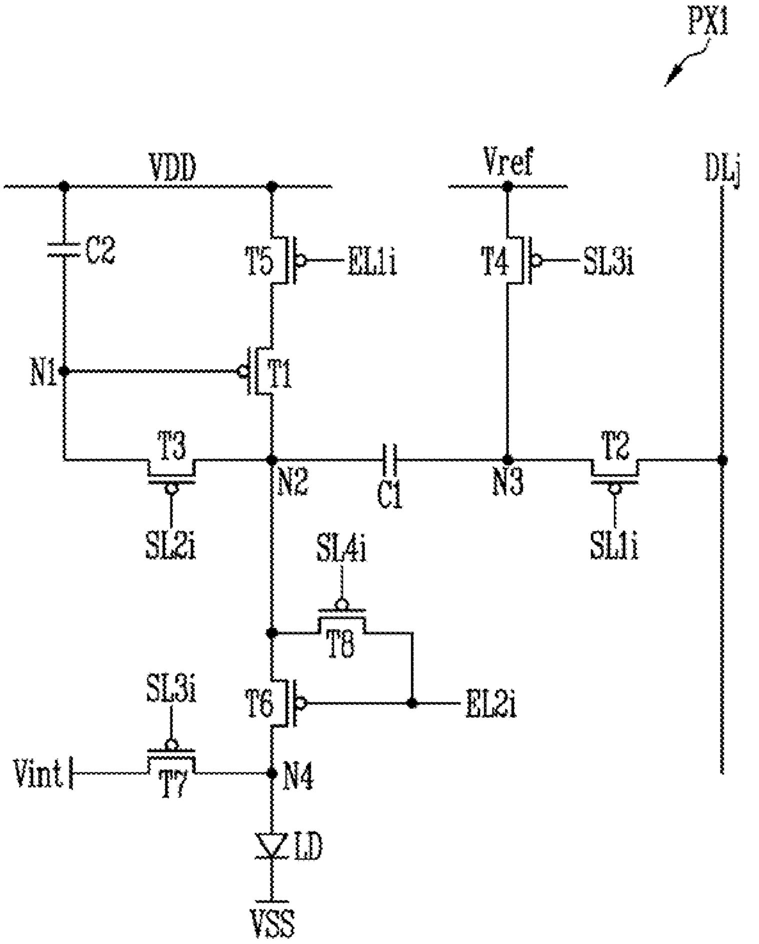
FIG. 2 is a circuit diagram illustrating a pixel in accordance with embodiments of the present invention.

FIG. 2 is a circuit diagram illustrating a pixel in accordance with embodiments of the present invention.

For convenience of description, a pixel PX1 which is located on an ith horizontal line (or ith pixel row) and is connected to a jth data line DLj will be illustrated in FIG. 2.

The pixel PX1 shown in FIG. 2 may be substantially identical to the pixel PX shown in FIG. 1.

Referring to FIG. 2, the pixel PX1 may include a light emitting element LD, first, second, third, fourth, fifth, sixth, seventh and eighth transistors T1, T2, T3, T4, T5, T6, T7 and T8, a first capacitor C1, and a second capacitor C2.

In an embodiment of the present invention, the first to eighth transistors T1 to T8 may all be transistors of the same type. For example, the first to eighth transistors T1 to T8 may be implemented with a P-channel metal oxide semiconductor (PMOS) transistor. The first to eighth transistors T1 to T8 may include an active layer formed of a poly-silicon semiconductor. For example, the active layer of the first to eighth transistors T1 to T8 may be formed through a low temperature poly-silicon (LTPS) process. However, the present invention is not limited thereto, and at least one of the first to eighth transistors T1 to T8 may be implemented with an N-channel metal oxide semiconductor (NMOS) including an oxide active layer.

A first electrode of the light emitting element LD may be connected to a second electrode (e.g., a drain electrode) of the first transistor T1 via the sixth transistor T6, and a second electrode of the light emitting element LD may be connected to a second power source VSS. For example, the first electrode of the light emitting element LD may be electrically connected to the second electrode of the first transistor T1 via a fourth node N4 to which one electrode of the sixth transistor T6 and one electrode of the seventh transistor T7 are commonly connected.

The light emitting element LD may generate light with a predetermined luminance corresponding to an amount of current (e.g., driving current) supplied from the first transistor T1. In an embodiment of the present invention, the light emitting element LD may be an organic light emitting diode including an organic emitting layer. The first electrode of the light emitting element LD may be an anode electrode, and the second electrode of the light emitting element LD may be a cathode electrode. In the alternative, the first electrode of the light emitting element LD may be the cathode electrode, and the second electrode of the light emitting element LD may be the anode electrode.

In an embodiment of the present invention, the light emitting element LD may be an inorganic light emitting element formed of an inorganic material. Alternatively, the light emitting element LD may include a plurality of inorganic light emitting elements connected in parallel or series between the second power source VSS and the fourth node N4.

In an embodiment of the present invention, the light emitting element LD may be made of a combination of an organic material and an inorganic material.

The first transistor T1 may be connected to a first power source VDD via the fifth transistor T5, and be connected to the first electrode of the light emitting element LD via the sixth transistor T6. The first transistor T1 may generate a driving current and provide the driving current to the light emitting element LD. A gate electrode of the first transistor T1 may be connected to a first node N1. The first transistor T1 may serve as a driving transistor of the pixel PX1. The first transistor T1 may control an amount of current flowing from the first power source VDD to the second power source VSS via the light emitting element. LD, corresponding to a voltage applied to the first node N1.

The first capacitor C1 may be connected between a second node N2 corresponding to the second electrode of the first transistor T1 and a third node N3. The first capacitor C1 may store a voltage corresponding to a voltage difference between the second node N2 and the third node N3.

The second capacitor C2 may be connected between the first power source VDD and the first node N1. The second capacitor C2 may store a voltage corresponding to a voltage difference between the first power source VDD and the first node N1.

When a data signal is written to the pixel PX1, the first node N1 and the second node N2 may have a voltage according to a ratio of capacitances of the first capacitor C1 and the second capacitor C2 due to charge sharing between the first capacitor C1 and the second capacitor C2.

The second transistor T2 may be connected between the data line DLj and the third node N3. The second transistor T2 may include a gate electrode receiving a scan signal. For example, the gate electrode of the second transistor T2 may be connected to an ith first scan line to receive a first scan signal. The second transistor T2 may be turned on when the first scan signal is supplied to the ith first scan line SL1*i*, to electrically connect the data line DLj and the third node N3. Accordingly, a data signal (or data voltage) may be transferred to the third node N3.

The third transistor T3 may be connected between the first node N1, which is connected to the gate electrode of the first transistor T1, and the second node N2 (or the second electrode or drain electrode of the first transistor T1). The third transistor T3 may include a gate electrode receiving a scan signal. For example, the gate electrode of the third transistor T3 may be connected to an ith second scan line SL2*i*, to receive a second scan signal. The third transistor T3 may be turned on when the second scan signal is supplied to the ith second scan line SL2*i*, to electrically connect the first node N1 and the second node N2. When the third transistor T3 is turned on, a voltage of an initialization power source Vint may be supplied to the first node N1 (or the gate electrode of the first transistor T1) and the first transistor T1 may have a diode connection form.

When the first transistor T1 has the diode connection form, a threshold voltage of the first transistor T1 may be compensated.

Accordingly, the first transistor T1 may generate a driving current as shown in the following Equation 1, based on the data signal and the first and second capacitors C1 and C2.

$$Id=k[a(V\text{ref}-V\text{data})]^2, a=CC2/(CC1+CC2) \quad \text{Equation 1}$$

In Equation 1, Id may be a driving current, k may be a unique characteristic of the first transistor T1, Vref may be a voltage of a third power source Vref (or reference power source), Vdata may be a voltage corresponding to the data signal, CC1 may be a capacitance of the first capacitor C1, and CC2 may be a capacitance of the second capacitor C2. The light emitting element LD may emit light with a luminance corresponding to the driving current Id.

The fourth transistor T4 may be connected between the reference power source Vref and the third node N3. The fourth transistor T4 may include a gate electrode receiving a scan signal. For example, the gate electrode of the fourth transistor T4 may be connected to an ith third scan line SL3*i*, to receive a third scan signal. The fourth transistor T4 may be turned on when the third scan signal is supplied to the ith third scan line SL3*i*, to electrically connect the reference power source Vref and the third node N3. Accordingly, a voltage of the reference power source Vref may be supplied to the third node N3. Therefore, a voltage of the third node N3 may be initialized to the voltage of the reference power source Vref.

In an embodiment of the present invention, a voltage level of the reference power source Vref may be set equal to that of the first power source VDD. To initialize the third node N3, a separate power source (e.g., the reference power source Vref) instead of the first power source VDD is connected to the fourth transistor T4, so that a variation of the driving current Id (or a luminance variation) according to a voltage drop (e.g., IR drop) of the first power source VDD, which may occur according to a relative position of the pixel PX1, can be minimized. For example, in Equation 1, the driving current Id includes section Vref as the voltage of the reference power source Vref instead of the voltage of the first power source VDD, so that the variation of the driving current Id according to the voltage drop (e.g., IR drop) of the first power source VDD can be minimized.

In addition, the fourth transistor T4 may be turned on during a period in which threshold voltage compensation of the first transistor T1 is performed. Thus, the voltage of the third node N3 can be stably maintained as the voltage of the reference power source Vref (e.g., a direct current (DC) voltage) during the period in which the threshold voltage compensation is performed.

The fifth transistor T5 may be connected between the first power source VDD and a first electrode of the first transistor T1. For example, the fifth transistor T5 may be connected between the first power source VDD and a source electrode of the first transistor T1. The fifth transistor T5 may include a gate electrode receiving an emission control signal. For example, the gate electrode of the fifth transistor T5 may be connected to an ith first emission control line EL1*i*, to receive a first emission control signal. The fifth transistor T5 may be turned off when the first emission control signal is supplied to the ith first emission control line EL1*i*, and be turned on in other cases. The fifth transistor T5 in a turn-on state may connect the first electrode of the first transistor T1 to the first power source VDD.

The sixth transistor T6 may be connected between the second node N2 corresponding to the second electrode of the first transistor T1 and the light emitting element LD (or the fourth node N4). The sixth transistor T6 may include a gate electrode receiving an emission control signal. For example, the gate electrode of the sixth transistor T6 may be connected to an ith second emission control line EL2*i*, to receive a second emission control signal. The sixth transistor T6 may be turned off when the second emission control signal is supplied to the second emission control line EL2*i*, and be turned on in other cases. The sixth transistor T6 in the turn-on state may electrically connect the second node N2 and the fourth node N4. In other words, when the sixth transistor T6 is turned-on, the first transistor may be connected to the light emitting element LD.

In an embodiment of the present invention, the ith second emission control line EL2*i* may be a line branching off from a first emission control line corresponding to a previous horizontal line (e.g., an (i−6)th horizontal line). A display device (e.g., the display device 1000 shown in FIG. 1) may not separately include an emission driver (e.g., the second emission driver 700 shown in FIG. 1) for supplying the second emission control signal to the pixel PX1. Therefore, a dead space of the display device (e.g., the display device 1000 shown in FIG. 1) can be decreased.

However, this is merely illustrative, the emission control line branching off from the first emission control line determined as the second emission control line EL2*i* is not limited thereto. For example, an emission control line branching of from the first emission control line may be determined by a time required to perform the threshold voltage compensation, a resolution, a length of one horizontal period 1H etc.

When both the fifth and sixth transistors T5 and T6 are turned on, the light emitting element LD may emit light with a luminance corresponding to the voltage of the first node N1.

In an embodiment of the present invention, when the fifth transistor T5 is turned on and the sixth transistor T6 is turned off, the threshold voltage compensation of the first transistor T1 may be performed.

In an embodiment of the present invention, when the fifth transistor T5 is turned off and the sixth transistor T6 is turned on, an initialization operation of the first transistor T1 may be performed.

The seventh transistor T7 may be connected to the light emitting element LD (or the fourth node N4) and the initialization power source Vint. The seventh transistor T7 may include a gate electrode receiving a scan signal. For example, the gate electrode of the seventh transistor T7 may be connected to the ith third scan line SL3*i*, to receive the third scan signal. The seventh transistor T7 may be turned on when the third scan signal is supplied to the third scan line SL3*i*, to electrically connect the initialization power source Vint and the fourth node N4. Accordingly, a voltage of the fourth node N4 (or the first electrode of the light emitting element LD) may be initialized to the voltage of the initialization power source Vint. When the voltage of the initialization power source Vint is supplied to the first electrode of the light emitting element LD, a parasitic capacitor of the light emitting element LD may be discharged. Since a residual voltage charged in the parasitic capacitor is discharged (e.g., eliminated or removed) unintended fine emission can be prevented. Thus, a black expression capability of the pixel PX1 can be improved.

In addition, since the gate electrodes of the fourth and seventh transistors T4 and T7 are connected to the same scan line (e.g., the third scan line SL3*i*), the fourth and seventh transistors T4 and T7 can be simultaneously turned off or turned on.

The eighth transistor T8 may be connected between the second electrode (or the second node N2) of the first transistor T1 and the ith second emission control line EL2*i*. For example, the eighth transistor T8 may be connected to the second electrode of the first transistor T1. Furthermore, the eighth transistor T8 is connected between one electrode (e.g., a source or drain electrode) and a gate electrode of the sixth transistor T6. The eighth transistor T8 may include a gate electrode receiving a scan signal. For example, the gate electrode of the eighth transistor T8 may be connected to an ith fourth scan fine SL4*i*, to receive a fourth scan signal. The eighth transistor T8 may be turned on when the fourth scan signal is supplied to the ith fourth scan line SL4*i*, to electrically connect the second node N2 and the ith second emission control line EL2*i*.

In an embodiment of the present invention, when the second emission control signal having a gate-off level (e.g., a high voltage) is supplied to the ith second emission control line EL2*i*, the eighth transistor T8 in the turn-on state may supply a high voltage to the second electrode of the first transistor T1. Accordingly, the first transistor T1 may have an on-bias state.

In an embodiment of the present invention, when the second emission control signal having a gate-on level (e.g., a low voltage) is supplied to the ith second emission control line EL2*i*, the eighth transistor T8 in the turn-on state may supply a low voltage to the second electrode (or the second node N2) of the first transistor T1. Accordingly, the second node N2 may be initialized by the second emission control signal having the low voltage. In addition, the first transistor T1 may have an off-bias state due to the low voltage supplied to the second electrode of the first transistor T1.

Through the eighth transistor T8, a bias of a constant voltage is applied to the first transistor T1, so that a hysteresis characteristic (or a difference in threshold voltage shift) due to a bias difference between adjacent pixels can be reduced. Thus, screen attraction (e.g., a ghost phenomenon) caused by a hysteresis variation can be minimized.

In addition, a period in which the second transistor T2 is turned on and a period in which the fourth and fifth transistors T4 and T5 are turned on do not overlap with each other. For example, when the third to fifth transistors T3, T4, and T5 are turned on, the threshold voltage compensation of the first transistor T1 may be performed. When the second and third transistors T2 and T3 are turned on, data writing may be performed. Therefore, a threshold voltage compensation period and a data writing period may be separated from each other.

In low frequency driving in which the length of one frame period is lengthened, a hysteresis difference caused by a grayscale difference between adjacent pixels may occur. Therefore, a difference in an amount of threshold voltage shift between driving transistors of the adjacent pixels may occur, and screen attraction (e.g., a ghost phenomenon) caused by the difference in threshold voltage shift amount may be seen by a viewer.

In the display device in accordance with embodiments of the present invention, a bias can be periodically applied with a constant voltage to the drain electrode (and/or a source electrode) of the driving transistor (e.g., of the first transistor T1) by using the eighth transistor T8. Thus a hysteresis variation caused by a grayscale difference between adjacent pixels can be removed, and accordingly, screen attraction can be reduced (or removed).

According to an embodiment of the present invention, the pixel PX1 may including a light emitting element LD; the first transistor T1 connected between the first power line VDD and the second node N2, the first transistor T1 including a gate electrode connected to the first node N1; the second transistor N2 connected between the third node N3 and the data line DLj; the second transistor N2 including a gate electrode connected to the first scan line SL1*i*; the third transistor T3 connected between the first node N1 and the second node N2, the third transistor T3 including a gate electrode connected to the second scan line SL2*i*; the fifth transistor T5 connected between the first power line VDD and the first transistor T1, the fifth transistor T5 including a gate electrode connected to the first emission control line EL1*i*; the sixth transistor T6 connected between the second node N2 and the light emitting element LD, the sixth transistor T6 including a gate electrode connected to the second emission control line EL2*i*; and the eighth transistor T8 connected between the second node N2 and the second emission control line EL2*i*, the eighth transistor T8 including a gate electrode connected to a fourth scan line SL4*i*.

FIGS. 3A to 3G are waveform diagrams illustrating an example of an operation of the pixel shown in FIG. 2.

Figure 3A:
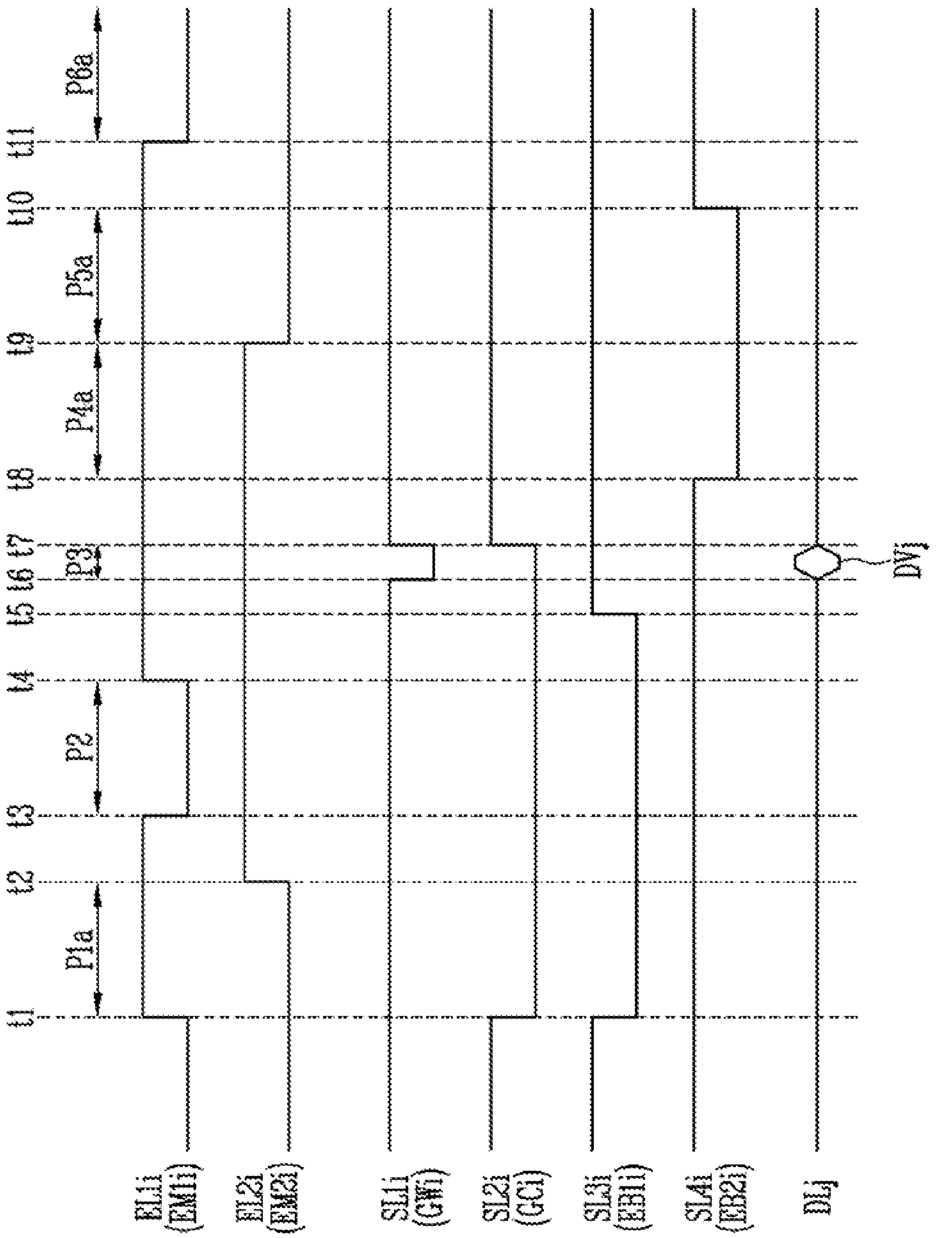
FIGS. 3A, 3B, 3C, 3D, 3E, 3F and 3G are waveform diagrams illustrating an example of an operation of the pixel shown in FIG. 2.

Referring to FIGS. 2 and 3A, the pixel PX1 may be supplied with signals for image display during a display scan period DSP. The display scan period DSP may include a period in which a data signal DVj actually corresponding to an output image is written.

First and second emission control signals EM1*i* and EM2*i* may be respectively supplied to the first and second emission control lines EL1*i* and EL2*i* (also referred to herein as ith first and second emission control lines), and first to fourth scan signals GWi, GCi, EB1*i*, and EB2*i* may be respectively supplied to the first to fourth scan lines SL1*i*, SL2*i*, SL3*i*, and SL4*i* (also referred to herein as ith first to fourth scan lines).

At a first time t1, the third scan signal EB1*i* may be changed from a gate-off level to a gate-on level. For example, the third scan signal EB1*i* may transition from a high level to a low level. Accordingly, the seventh transistor T7 may be turned on. Accordingly, the voltage of the initialization power source Vint is supplied to the fourth node N4 (or the first electrode of the light emitting element LD), so that the fourth node N4 can be initialized to the voltage of the initialization power source Vint.

In addition, the second scan signal GCi may be changed from the gate-off level to the gate-on level. For example, the second scan signal GCi may transition from the high level to the low level at the same time the third scan signal EB1*i* transitions from the high level to the low level. Accordingly, the third transistor T3 may be turned on. In addition, since the second emission control signal EM2*i* maintains the gate-on level, the sixth transistor T6 may be turned on or maintain the turn-on state. Accordingly, the voltage of the initialization power source Vint, which is supplied to the fourth node N4, is supplied to the first node N1 (or the gate electrode of the first transistor T1), so that the first node can be initialized to the voltage of the initialization power source Vint.

In addition, the fourth transistor T4 may be turned on by the third scan signal EB1*i* having the gate-on level. Accordingly, the voltage of the reference power source Vref is supplied to the third node N3, so that the third node N3 can be initialized to the voltage of the reference power source Vref.

Figure 3B:
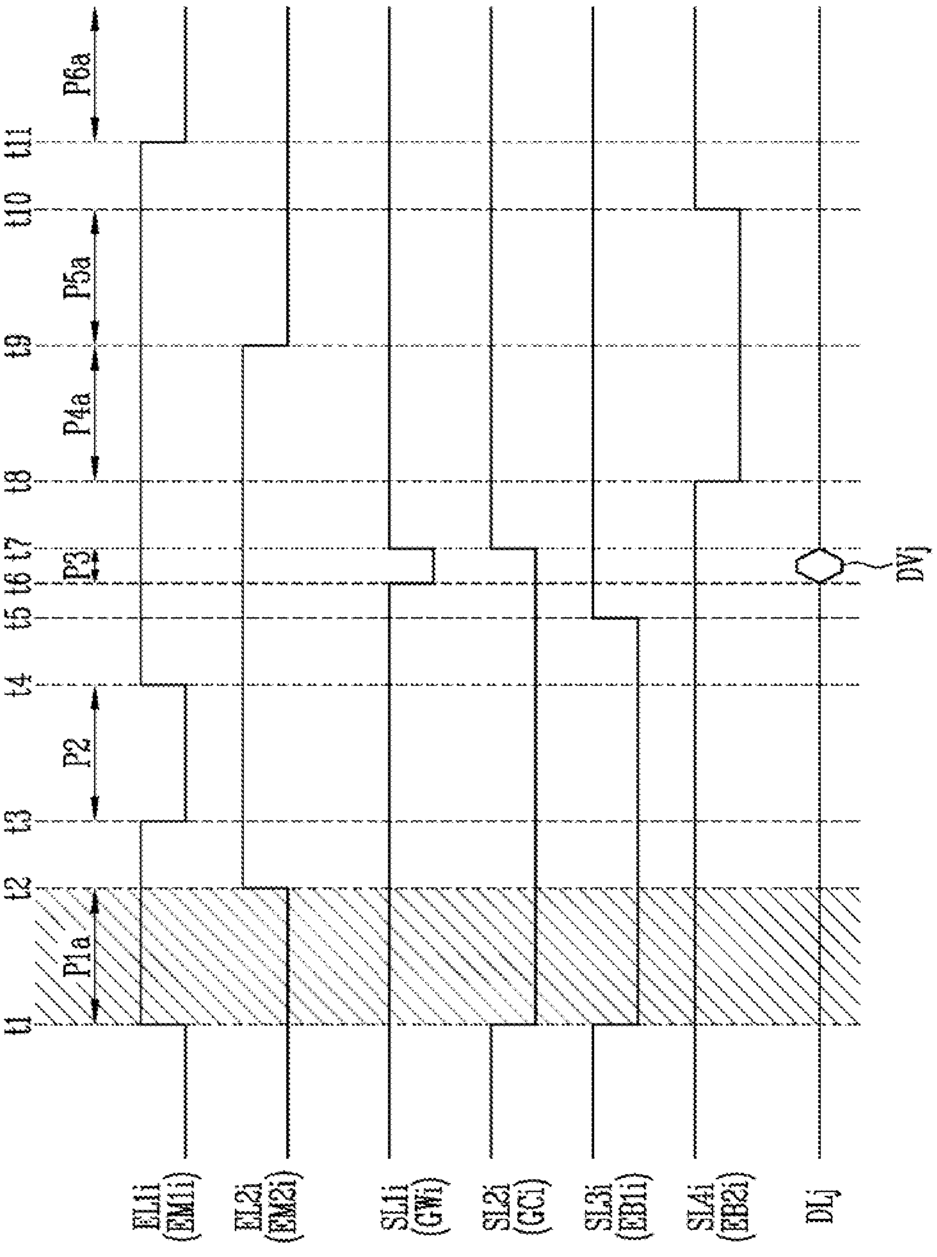

Accordingly, during a first period P1*a* from the first time t1 to a second time t2, which is highlighted with diagonal lines in FIG. 3B, the voltage of the initialization power source Vint may be supplied to the first node N1, the voltage of the reference power source Vref may be supplied to the third node N3, and the voltage of the initialization power source Vint may be supplied to the fourth node N4. In other words, the first period P1*a* may be an initialization period (or first initialization period) in which the first electrode (or anode electrode) of the light emitting element LD, the gate electrode of the driving transistor (e.g., the first transistor T1), and the third node N3 are initialized.

At the second time t2, the second emission control signal EM2*i* may be changed from the gate-on level to the gate-off level. In other words, the second emission control signal EM2*i* may transition from the low level to the high level. Accordingly, the sixth transistor T6 may be turned off.

At a third time t3, the first emission control signal EM1*i* may be changed from the gate-off level to the gate-on level. For example, the first emission control signal EM1*i* may have the gate-on level while the second emission control signal EM2*a* has the gate-on level. Since the first emission control signal EM1*i* has the gate-on level, the fifth transistor T5 may be turned on. In addition, since the second scan signal GCi maintains the gate-on level, the third transistor T3 may maintain the turn-on state. Accordingly, the first transistor T1 may have the diode connection form, and a voltage corresponding to the threshold voltage Vth of the first transistor T1 may be stored in the second capacitor C2.

Figure 3C:
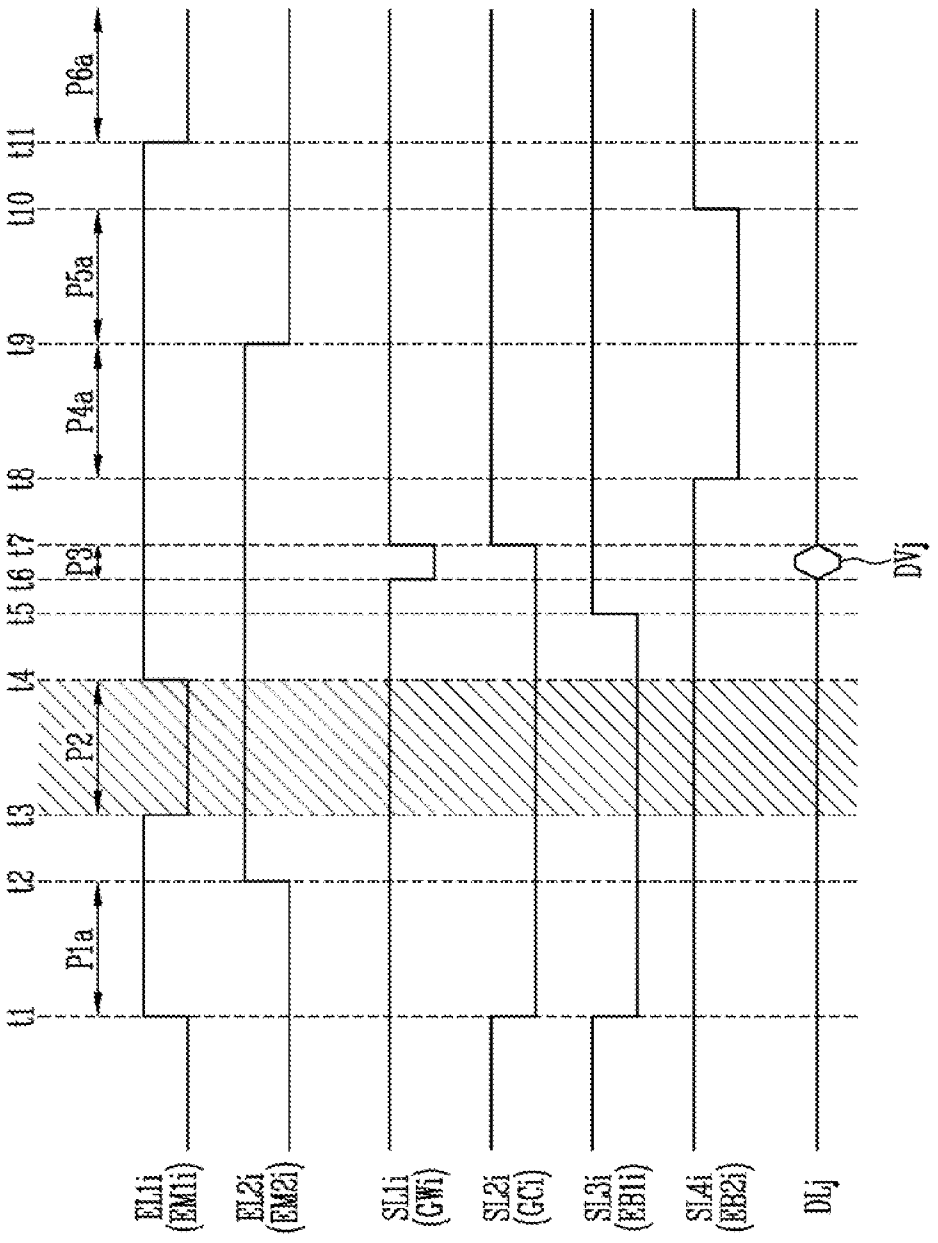

Accordingly, during a second period P2 from the third time t3 to a fourth time t4, which is highlighted with diagonal lines in FIG. 3C, the first transistor T1 has the diode connection form, so that the threshold voltage of the first transistor T1 can be compensated. In other words, the second period P2 may be a threshold voltage compensation period.

In addition, in the second period P2, threshold voltage compensation may be performed by the voltage of the first power source VDD. Therefore, a threshold voltage compensation operation may be performed based on a fixed voltage instead of a data signal (e.g., a data voltage) which may be changed depending on a pixel row and/or a frame.

In addition, during the second period P2, the third scan signal EB1*i* maintains the gate-on level, and hence the fourth transistor T4 and the seventh transistor T7 may maintain the turn-on state. Accordingly, initialization of the third node N3 and the fourth node N4 may be maintained during the second period P2.

At the fourth time t4, the first emission control signal EM1*i* may be changed from the gate-on level to the gate-off level. Accordingly, the fifth transistor T5 may be turned off.

At a fifth time t5, the third scan signal EB1*i* may be changed from the gate-on level to the gate-off level. Accordingly, the fourth and seventh transistors T4 and T7 may be turned off.

At a sixth time t5, the first scan signal EB1*i* is changed from the gate-off level to the gate-on level, so that the second transistor T2 can be turned on. Accordingly, the data signal DVj may be supplied to the third node N3. Since the second scan signal GCi maintains the gate-on level, the third transistor T3 may maintain the turn-on state. In other words, the gate-on times of the first and second scan signals GWi and GCi overlap.

In addition, when the data signal DVj is supplied to the third node N3, the voltage of the third node N3 may be decreased from the voltage of the reference power source Vref to a voltage corresponding to the data signal DVj. Since the voltage of the reference power source Vref is a fixed voltage (e.g., a DC voltage), the decreased voltage of the third node N3 may be determined according to the voltage corresponding to the data signal DVj.

When the voltage of the third node N3 is decreased, the voltage of the second node N2 may also be decreased corresponding to the decreased voltage of the third node N3, due to coupling of the first capacitor C1.

Figure 3D:
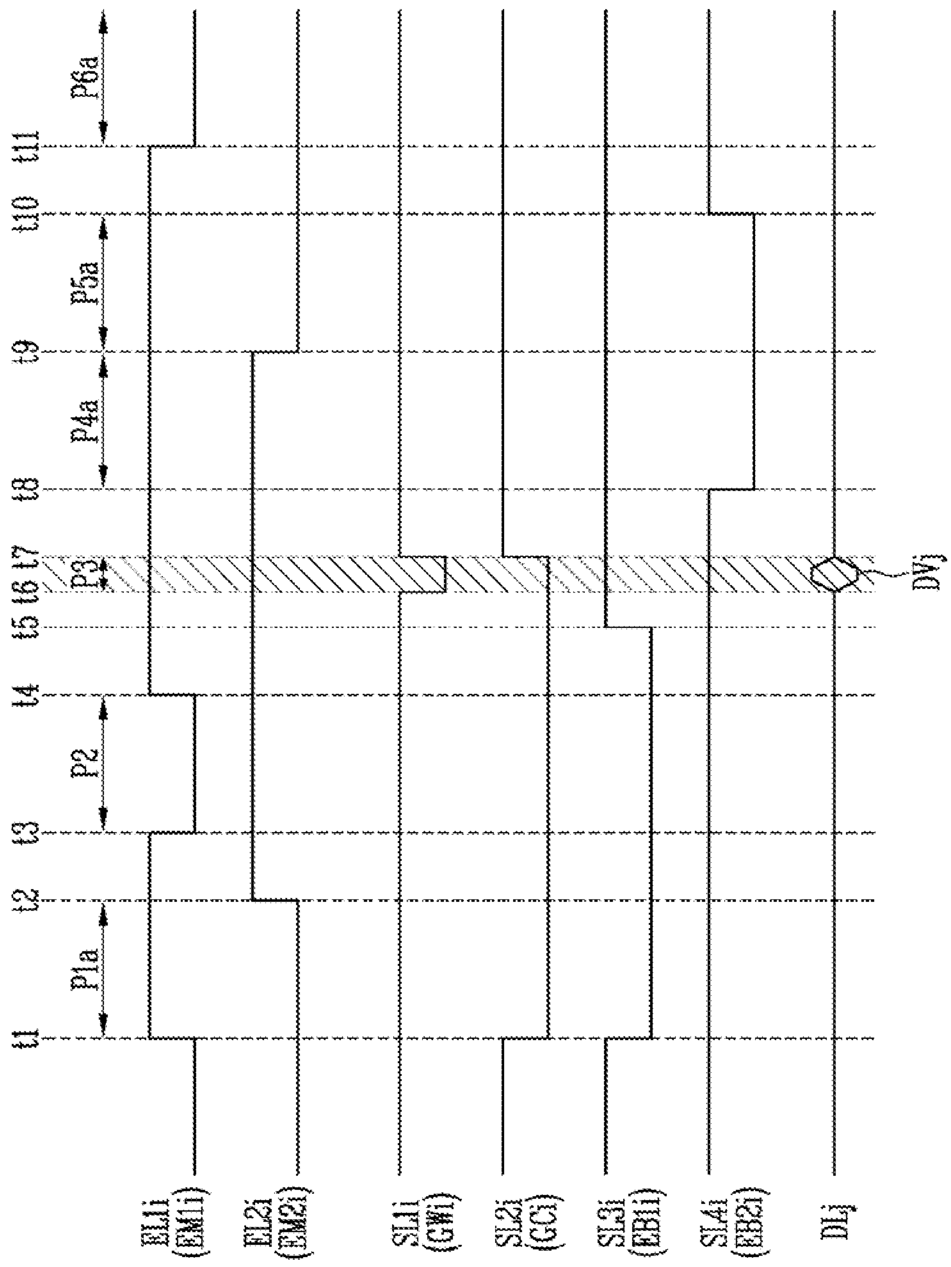

Accordingly, during a third period P3 from the sixth time t6 to a seventh time t7, which is highlighted with diagonal lines in FIG. 3D, the data signal DVj may be written to the pixel PX1, and a voltage corresponding to the threshold voltage Vth and the data signal DVj may be stored in the second capacitor C2 due to charge sharing. In other words, the third period P3 may be a data writing period.

In an embodiment of the present invention, a length of the third period P3, e.g., a length (or pulse width) of the first scan signal GWi may correspond to one horizontal period 1H. However, the length of the first scan signal GWi is not limited thereto. For example, the length of the first scan signal GWi may correspond to two horizontal periods 2H or more.

At the seventh time t7, the first and second scan signals GWi and GCi may be changed from the gate-on level to the gate-off level. Accordingly, the second and third transistors T2 and T3 may be turned off.

At an eighth time t8, the fourth scan signal EB2*i* may be changed from the gate-off level to the gate-on level. Accordingly, the eighth transistor T8 may be turned on. In addition, at the eighth time t8, the second emission control signal EM2 having a high voltage (or the gate-off level) may be supplied to the second emission control line EL2*i*. Therefore, the high voltage of the second emission control signal EM2*i* may be supplied to the second electrode (or the drain electrode) of the first transistor T1.

Figure 3E:
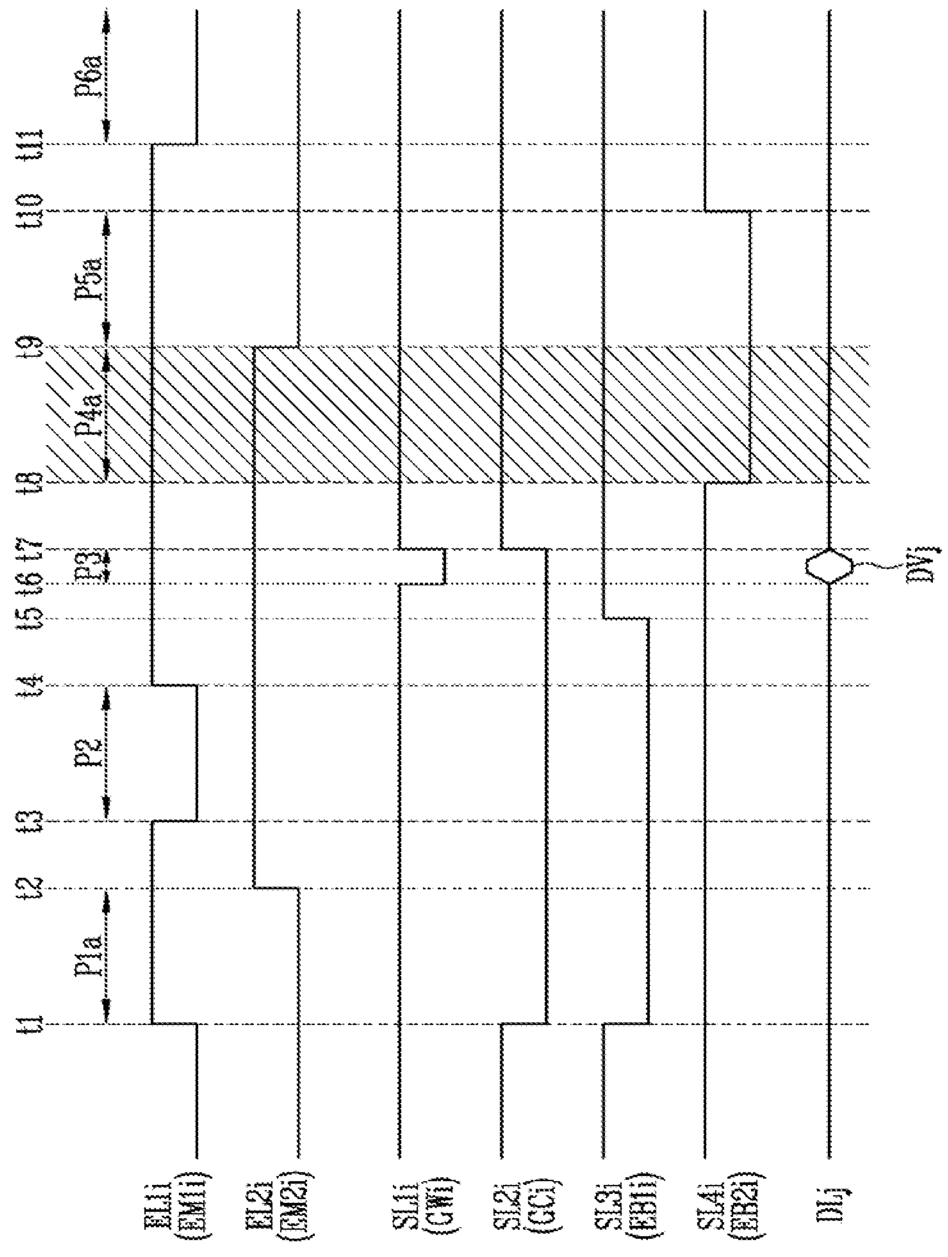

Accordingly, during a fourth period P4*a* from the eighth time t8 to a ninth time t9, which is highlighted with diagonal lines in FIG. 3E, an on-bias may be applied to the first transistor T1. In other words, the fourth period P4*a* may be an on-bias period (or first on-bias period).

At the ninth time t9, the second emission control signal EM2*i* may be changed from the gate-off level to the gate-on level. In other words, the second emission control signal EM2*i* having a low voltage may be supplied through the second emission control line EL2*i*. Therefore, the low voltage of the second emission control signal EM2*i* may be supplied to the second electrode (or the drain electrode) of the first transistor T1.

Figure 3F:
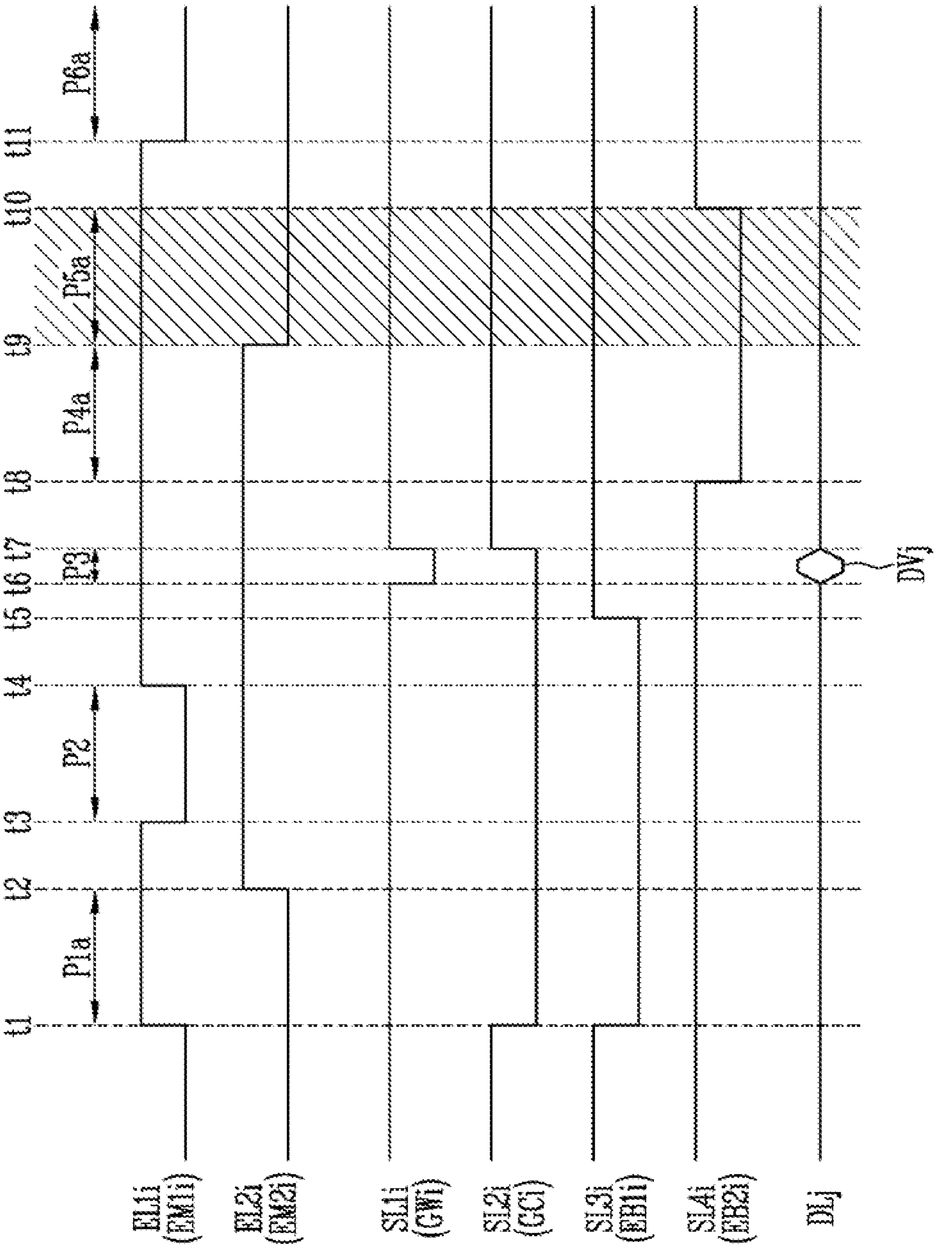

Accordingly, during a fifth period P5*a* from the ninth time t9 to a tenth time t10, which is highlighted with diagonal lines in FIG. 3F, an off-bias may be applied to the first transistor T1. In other words, the fifth period P5*a* may be an off-bias period (or first off-bias period).

The on-bias and the off-bias are applied to the first transistor T1 in the fourth and fifth periods P4*a* and P5*a*, so that a hysteresis characteristic (e.g., a threshold voltage shift) of the first transistor T1 can be minimized.

Thus, in the pixel PX1 and the display device (1000 shown in FIG. 1) according to the operation shown in FIG. 3A, the hysteresis characteristic is removed or minimized while removing a threshold voltage variation of the first transistor T1. Therefore, an image failure (e.g., a flicker, color attraction, a luminance decrease, etc.) can be minimized.

In addition, during the fifth period P5*a*, the low voltage is supplied to the second electrode of the first transistor T1, e.g., the second node N2, and hence the second node N2 may be initialized to the low voltage of the second emission control signal EM2*i*. Accordingly, the unintended emission of light from the light emitting element LD before an emission period due to a current caused a voltage difference between the second node N2 and the fourth node N4 can be prevented.

Figure 3G:
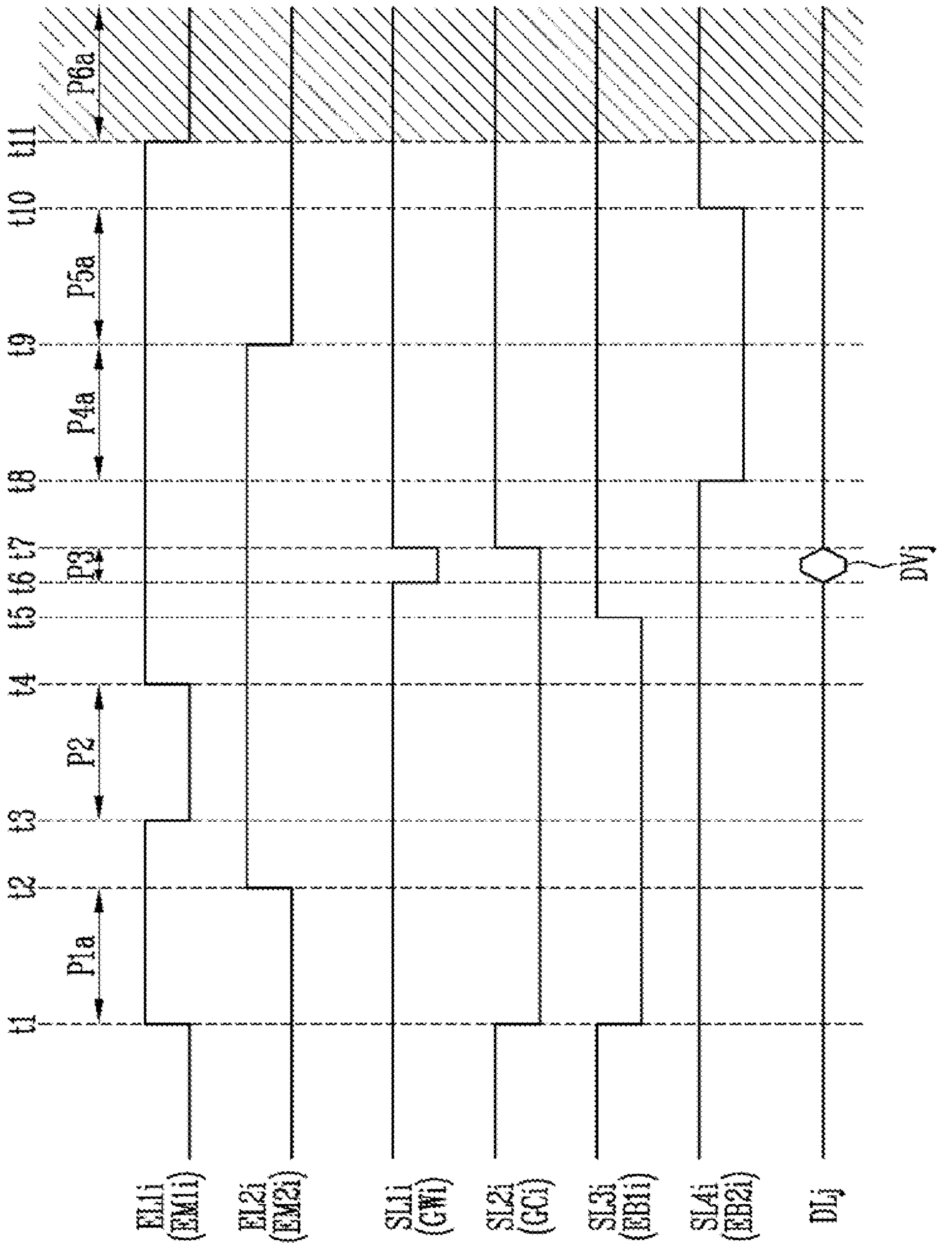

In a sixth period P6*a* after an eleventh time t11, which is highlighted with diagonal lines in FIG. 3G, both the first emission control signal EM1*i* and the second emission control signal EM2*i* have the gate on level, and therefore, the pixel PX1 may emit light. In other words, both the first emission control signal EM1*i* and the second emission control signal EM2*i* have a low voltage. In other words, the sixth period P6*a* may be an emission period (or first emission period).

FIGS. 4A to 4E are waveform diagrams illustrating an example of the operation of the pixel shown in FIG. 2.

Figure 4A:
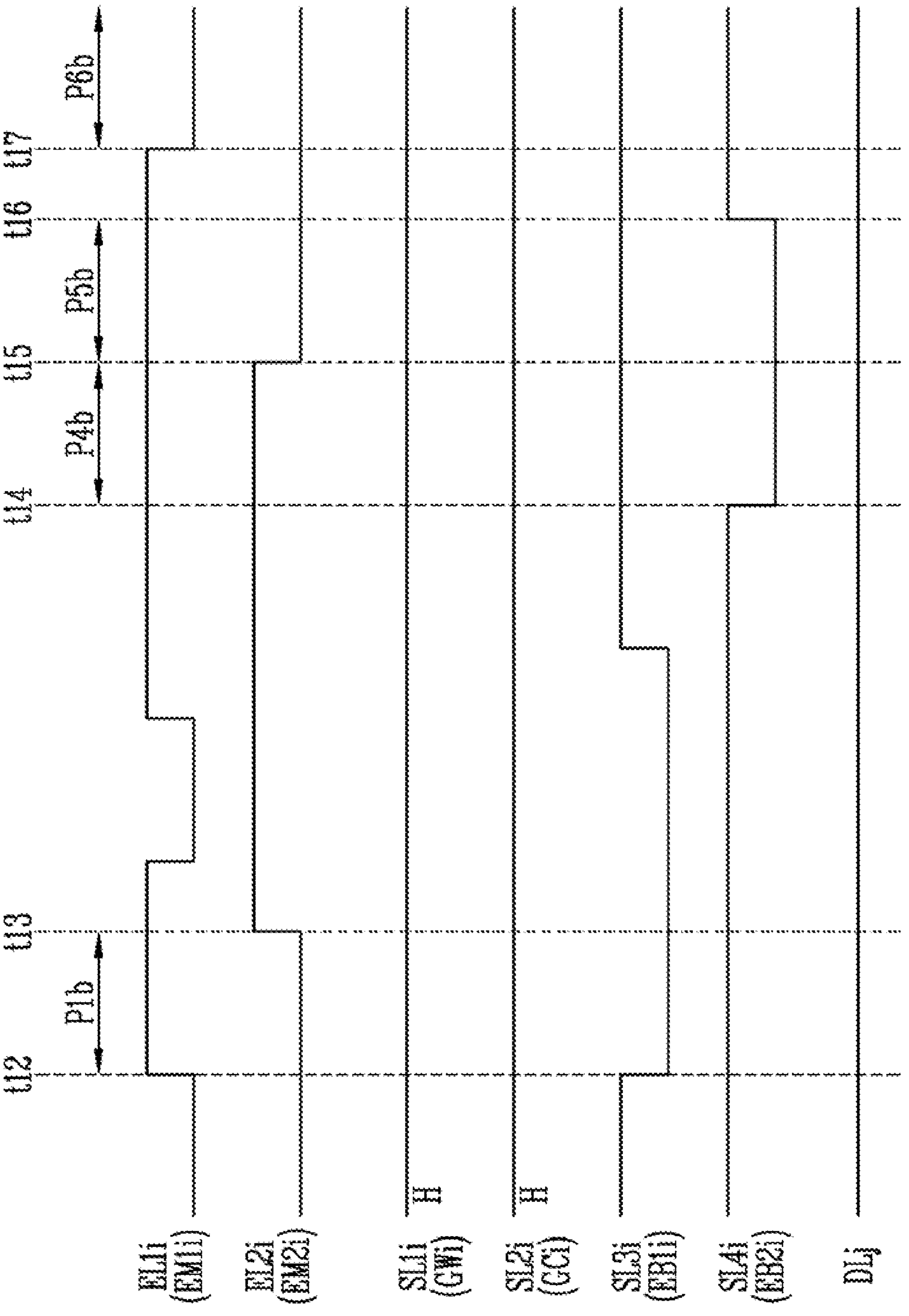
FIGS. 4A, 4B, 4C, 4D and 4E are waveform diagrams illustrating an example of the operation of the pixel shown in FIG. 2.

Referring to FIGS. 2, 3A, and 4A, to maintain the luminance of an image output in the display scan period DSP, an on-bias voltage and/or an off-bias voltage may be applied to the second electrode (e.g., the drain electrode or the second node N2) of the first transistor T1 in a self-scan period SSP.

One frame may include at least one self-scan period SSP according to an image frame rate. The self-scan period SSP may include an on-bias period (or second on-bias period) of an eighth period P4*b*, an off-bias period (or second off-bias period) of a ninth period P5*b*, and an emission period (or second emission period) of a tenth period P6*b*. In addition, an operation of the self-scan period SSP shown in FIG. 4A is substantially identical to that of the display scan period DSP shown in FIG. 3A, except signal supply for threshold voltage compensation in the second period P2 (or the threshold voltage compensation period) shown in FIG. 3A and signal supply for data signal writing in the third period P3 (or the data writing period).

In an embodiment of the present invention, a scan signal is not supplied to the second and third transistors T2 and T3 in the self-scan period SSP. For example, in the self-scan period SSP, the first scan signal GWi and the second scan signal GCi, which are respectively supplied to the first scan line SL1*i* and the second scan line SL2*i*, may have a gate-off level (or high level H). Accordingly, the self-scan period SSP does not include the threshold voltage compensation period (e.g., the second period P2) and the data writing period (e.g., the third period P3).

Since the third transistor T3 maintains a turn-off state in the self-scan period SSP, the voltage of the gate electrode (e.g., the first node N1) of the first transistor T1 is not influenced by driving during the self-scan period SSP.

Figure 4B:
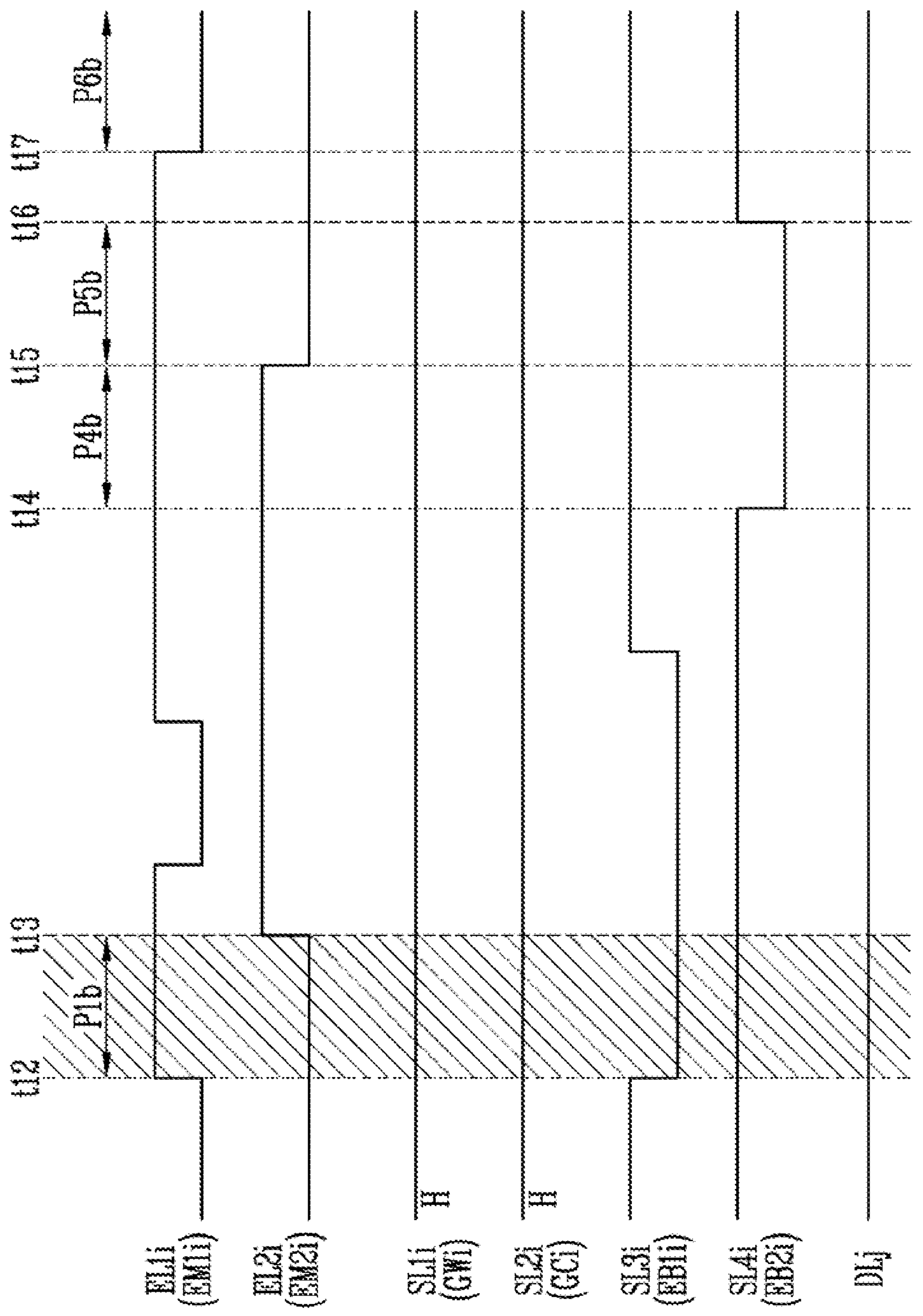

During a seventh period P1*b* (or second initialization period) from a twelfth time t12 to a thirteenth time t3, which is highlighted by diagonal lines in FIG. 4B, the seventh transistor T7 may be turned on such that the first electrode (or the anode electrode) of the light emitting element LD is initialized to the voltage of the initialization power source Vint, and the fourth transistor T4 may be turned on such that the third node N3 is initialized to the voltage of the reference power source Vref.

Figure 4C:
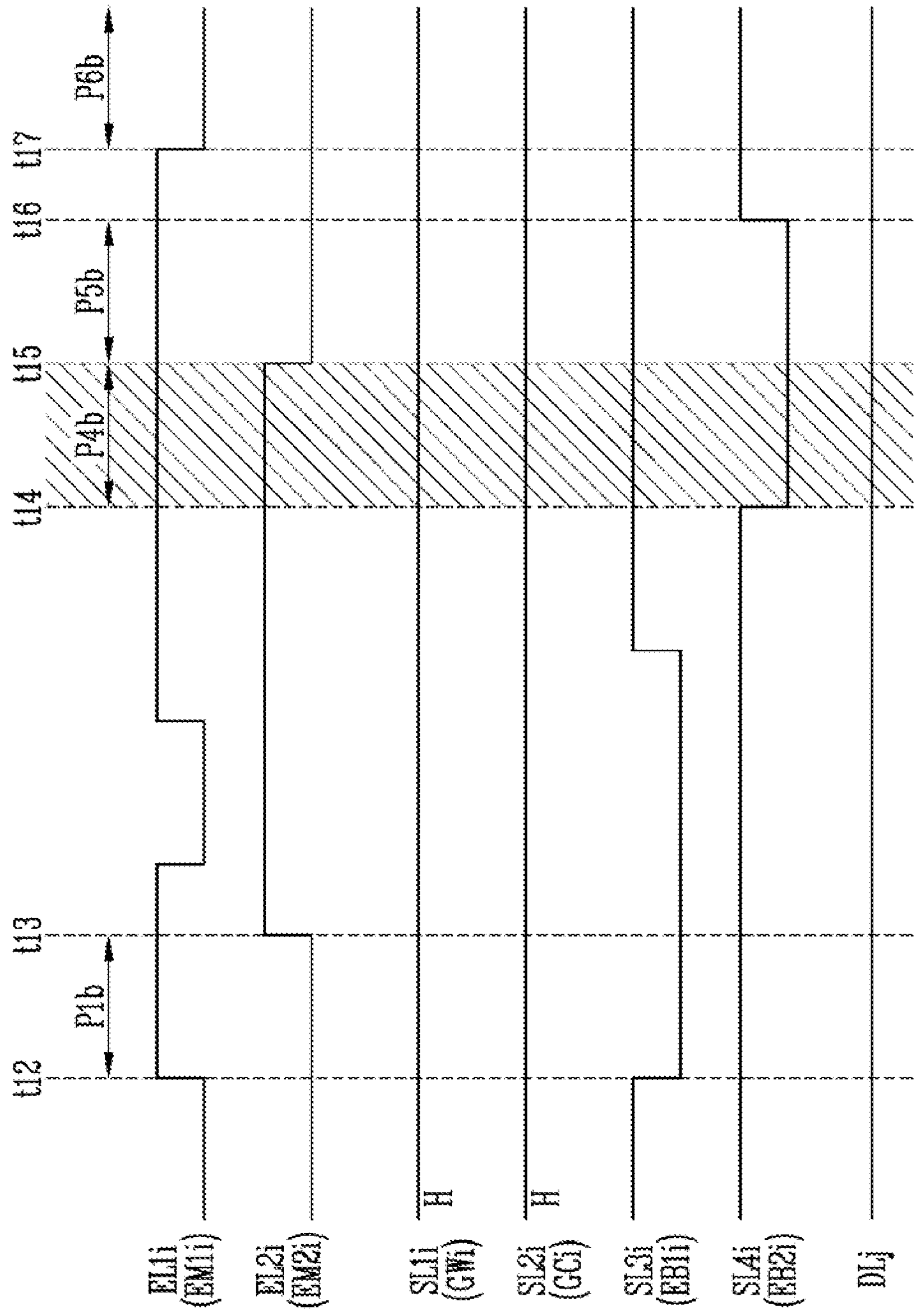
Figure 4D:
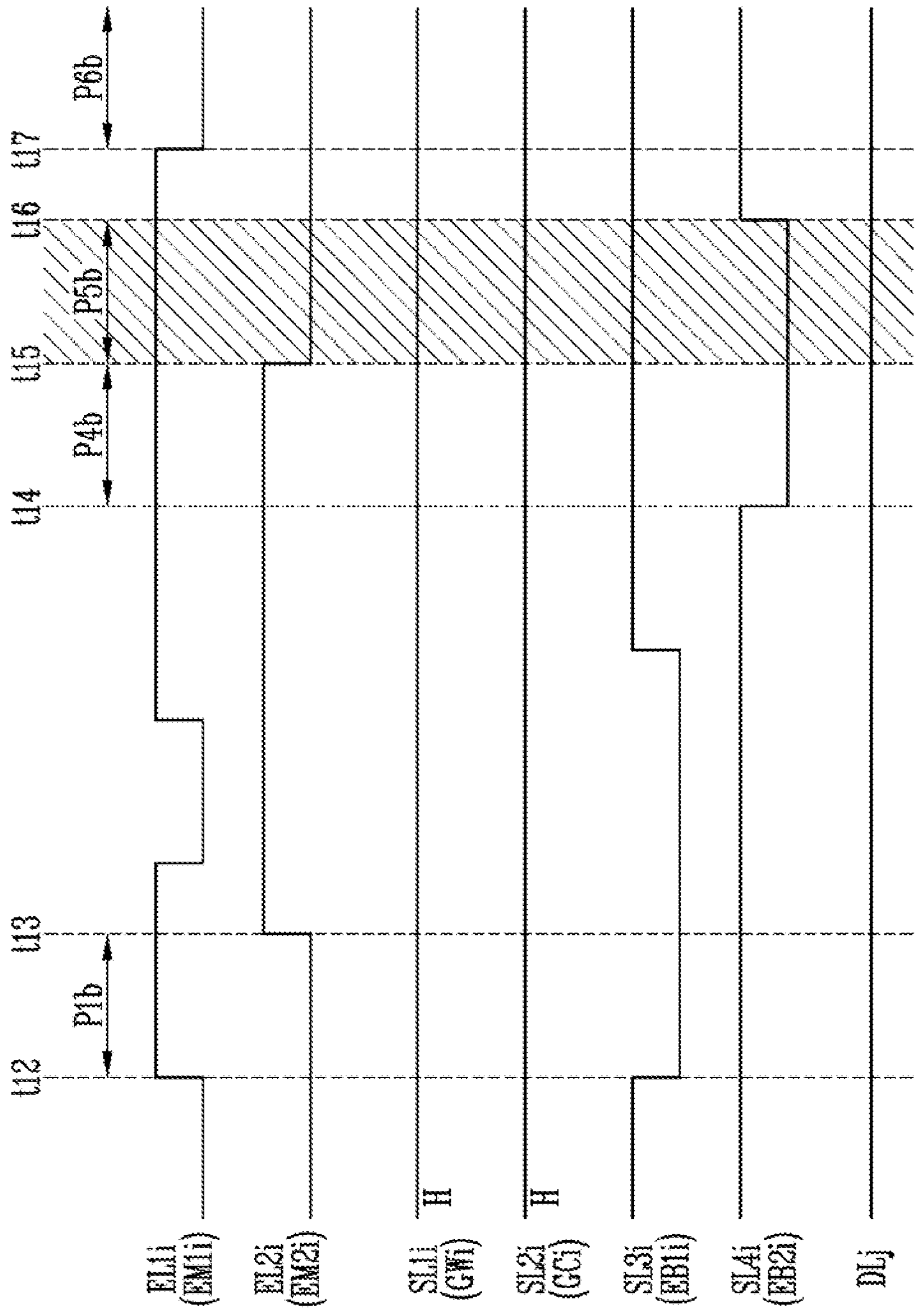

During an eighth period P4*b* (or second on-bias period) from a fourteenth time t14 to a fifteenth time t15, which is highlighted by diagonal lines in FIG. 4C, the eighth transistor T8 may be turned on such that an on-bias is applied to the first transistor T1. During a ninth period P5*b* (or second off-bias period) from the fifteenth time t15 to a sixteenth time t16, which is highlighted by diagonal lines in FIG. 4D, the eighth transistor T8 may be turned on such that an off-bias may be applied to the first transistor T1. Accordingly, the hysteresis characteristic (e.g., the threshold voltage shift) of the first transistor T1 can be improved, and an image failure (e.g., a flicker, color attraction, a luminance decrease, etc.) in low frequency driving can be minimized.

Figure 4E:
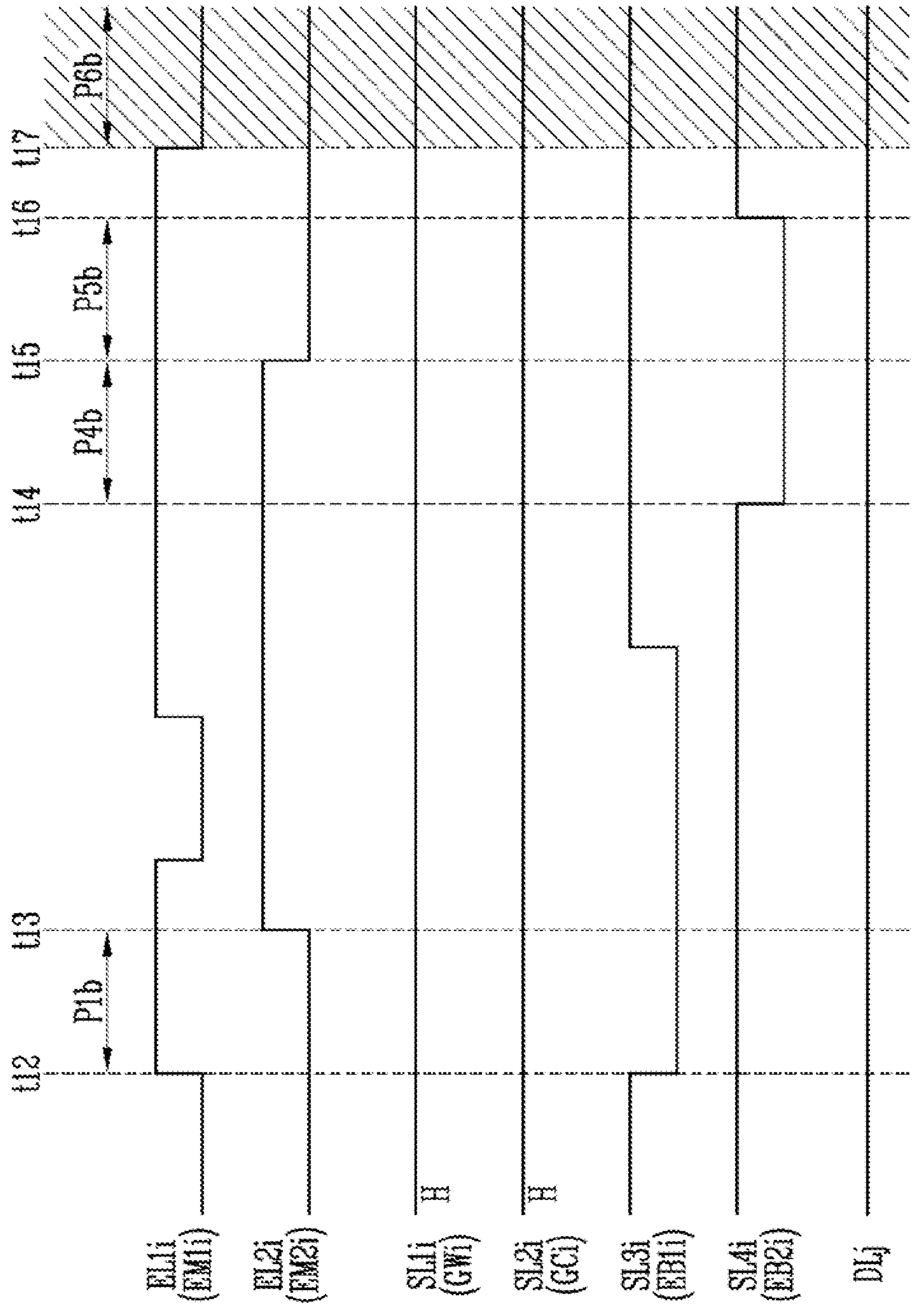

In a tenth period P6*b* (or second emission period) after a seventeenth tune t17, which is highlighted by diagonal lines in FIG. 4E, since both the first emission control signal EM1*i* and the second emission control signal EM2*i* have the gate-on level, the fifth and sixth transistors T5 and T6 are turned on, so that the pixel PX1 can emit light.

The third and fourth scan signals EB1*i* and EB2*i* and the first and second emission control signals EM1*i* and EM2*i* may be supplied at a first frequency, regardless of the image refresh rate. Thus, even when the image refresh rate is changed, an initialization operation in an initialization period (e.g., the first period P1*a* and/or the seventh period P1*b*), on-bias application in an on-bias period (e.g., the fourth period P4*a* and/or the eighth period P4*b*), and off-bias application in an off-bias period (e.g., the fifth period P5*a* and/or the ninth period P5*b*) can be always performed periodically. Accordingly, a flicker can be minimized corresponding to various image refresh rates (e.g., low frequency driving).

Further, in the self-scan period SSP, the data driver (800 shown in FIG. 1) may not supply any data signal to the pixel PX1. Thus, power consumption can be further reduced.

Figure 5A:
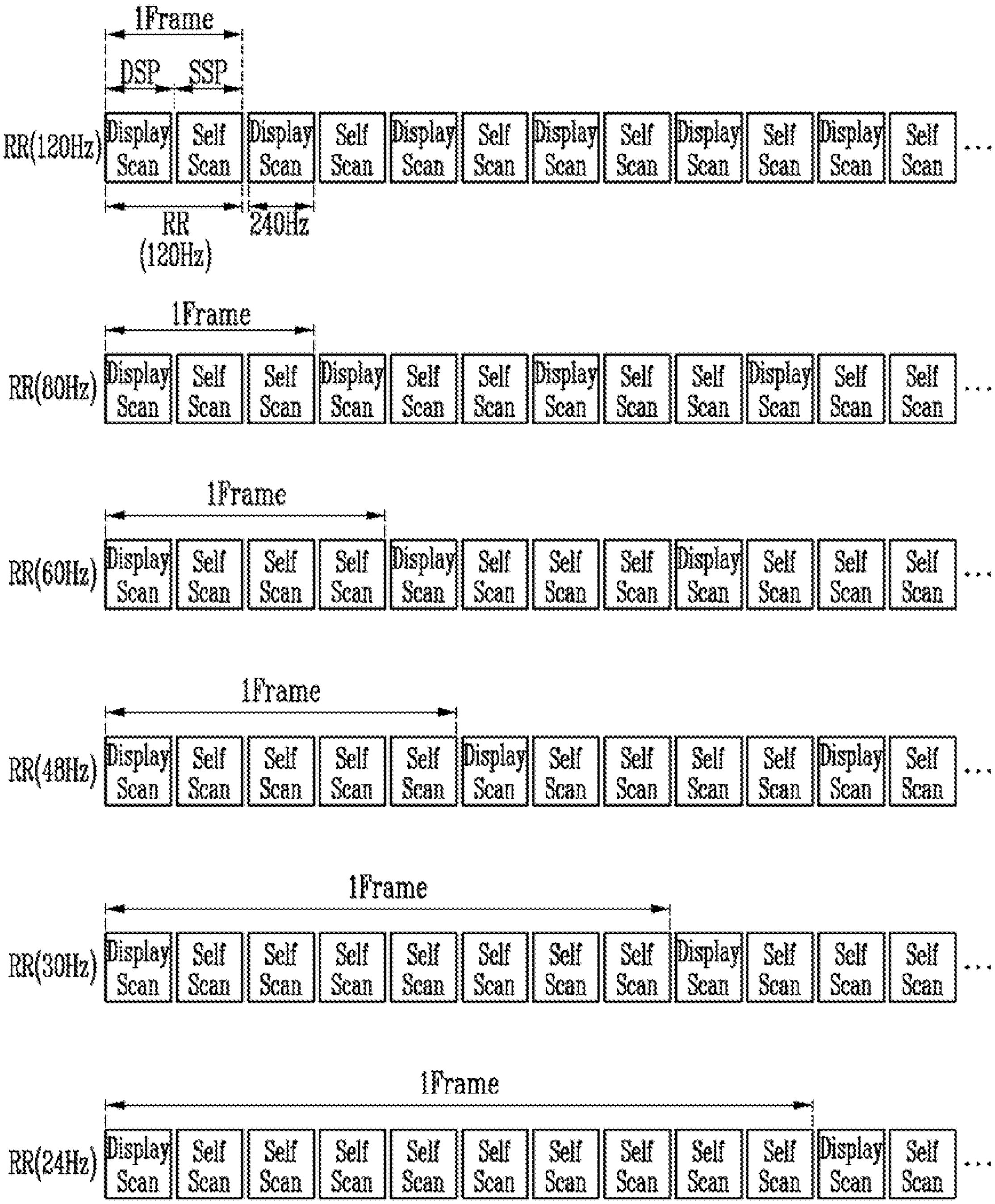
FIG. 5A is a diagram illustrating an example of a driving method of the display device according to an image refresh rate.
Figure 5B:
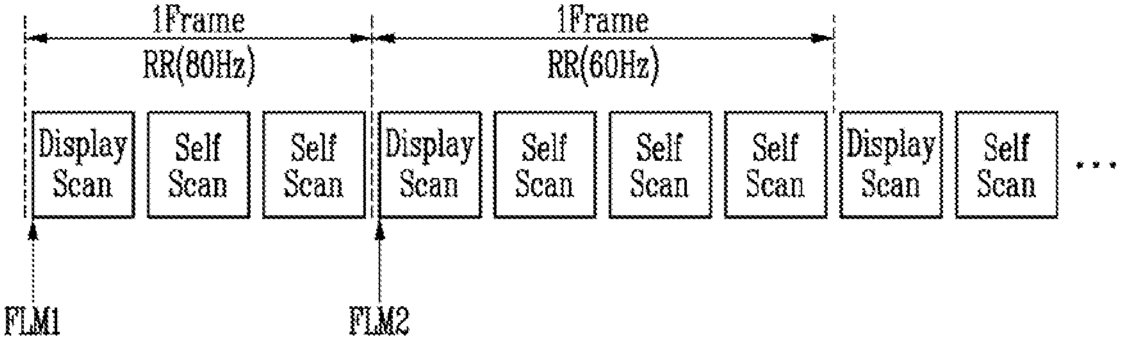
FIG. 5B is a diagram illustrating the driving method of the display device according to the image refresh rate.

FIG. 5A is a diagram illustrating an example of a driving method of the display device according to an image refresh rate. FIG. 5B is a diagram illustrating the driving method of the display device according to the image refresh rate.

Referring to FIGS. 1 to 5A, the pixel PX may perform the operation shown in FIGS. 3A to 3G in the display scan period DSP, and perform the operation shown in FIGS. 4A to 4E in the self-scan period SSP.

In an embodiment of the present invention, an output frequency of the first scan signal GWi and the second scan signal GCi may be changed according to an image refresh rate RR. For example, the first scan signal GWi and the second scan signal GCi may be output at a frequency (e.g., a second frequency) equal to the image refresh rate RR.

In an embodiment of the present invention, regardless of the image refresh rate RR, the third scan signal EB1*i*, the fourth scan signal EB2*i*, the first emission control signal EM1*i*, and the second emission control signal EM2*i* may be output at a constant frequency (e.g., a first frequency). For example, an output frequency of the third scan signal EB1*i*, the fourth scan signal EB2*i*, the first emission control signal EM1*i*, and the second emission control signal EM2*i* may be set to two times the maximum refresh rate of the display device 1000.

In an embodiment of the present invention, lengths of the display scan period DSP and the self-scan period SSP may be substantially the same. However, a number of self-scan periods SSP included in one frame period may be determined according to the image refresh rate RR.

As shown in FIG. 5A, when the display device 1000 is driven at an image refresh rate RR of 120 Hz, one frame period may include one display scan period DSP and one self-scan period SSP. Accordingly, when the display device 1000 is driven at the image refresh rate of 120 Hz, each of the pixels PX may alternately repeat emission and non-emission twice during the one frame period.

In addition, when the display device 1000 is driven at an image refresh rate RR of 80 Hz, one frame period may include one display scan period DSP and two consecutive self-scan periods SSP. For example, the one frame period may include one display scan period DSP and two self-scan periods SSP in sequence. Accordingly, when the display device 1000 is driven at the image refresh rate RR of 80 Hz, each of the pixels PX may alternately repeat emission and non-emission three times during the one frame period.

In a similar manner, the display device 1000 adjusts a number of self-scan periods SSP included in one frame period, to be driven at driving frequencies such as 60 Hz, 48 Hz, 24 Hz, and 1 Hz. In other words, the display device 1000 can support various image refresh rates RR by using frequencies corresponding to divisors of the first frequency.

In addition, the number of self-scan periods SSP is increased as the driving frequency decreases, so that an on-bias having a constant magnitude and/or an off-bias having a constant magnitude can be periodically applied to each of the first transistors T1 respectively included in the pixels PX. For example, when the display device 1000 is driven at an image refresh rate of 64 Hz, one frame period may include one display scan period DSP and three self-scan periods SSP. In addition, when the display device 1000 is driven at an image refresh rate of 24 Hz, one frame period may include one display scan period DSP and nine self-scan periods SSP. Thus, a luminance decrease, a flicker, or screen attraction in low frequency driving can be minimized.

As shown in FIG. 5B, the display device 1000 may display an image by using different start pulses FLM1 and FLM2 according to the image refresh rate RR. For example, when the display device 1000 is driven at the image refresh rate RR of 80 Hz, the display device 1000 may display an image by using a first start pulse FLM1. When the display device 1000 is driven at an image refresh rate RR of 60 Hz, the display device 1000 may display an image by using a second start pulse FLM2. Since the first scan driver 200 and the second scan driver 300 are driven at different frequencies according to the image refresh rate RR, the first start pulse FLM1 and the second start pulse FLM2 may include a first scan start pulse and a second scan start pulse, which are different from each other.

Figure 6A:
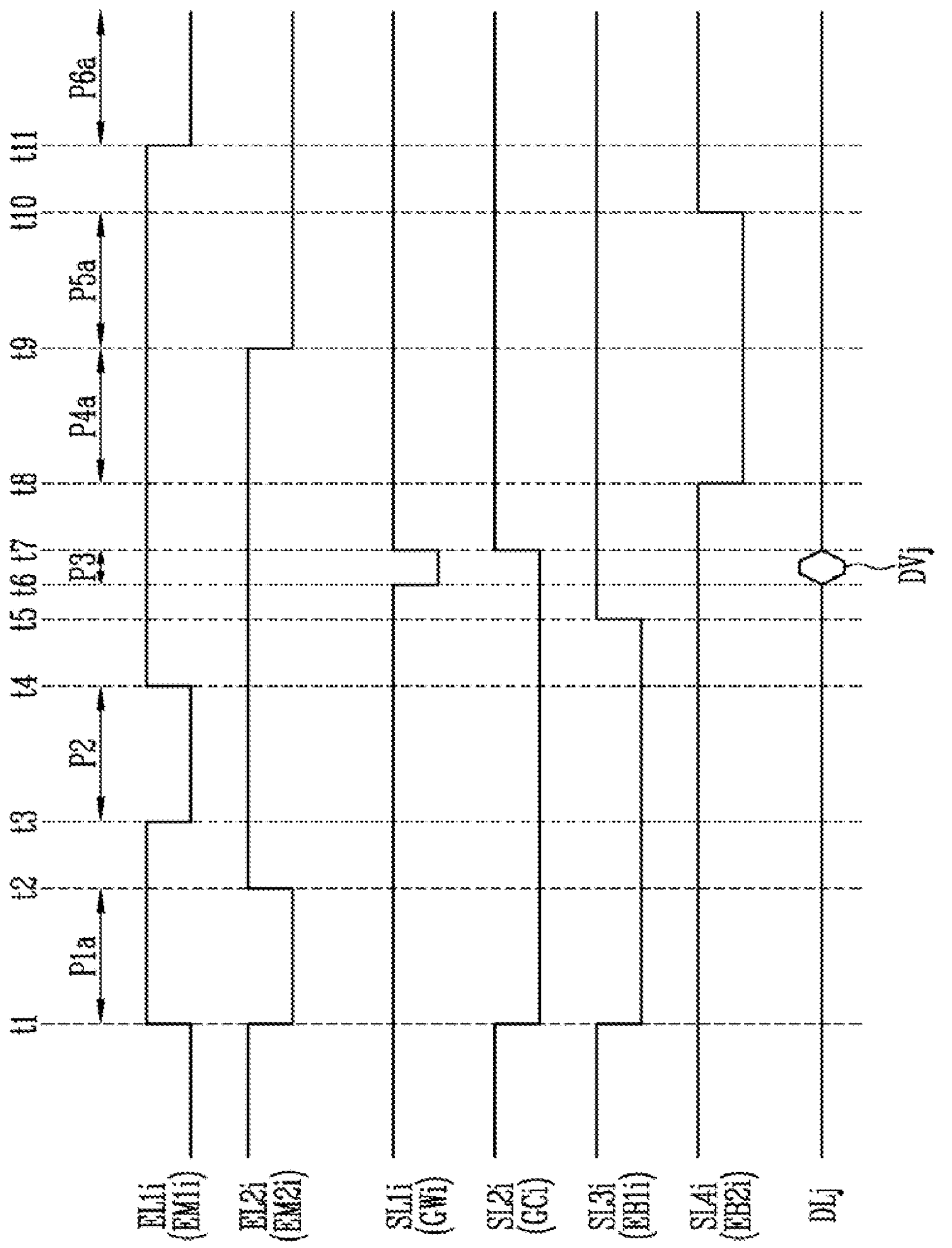
FIG. 6A is a waveform diagram illustrating an example of the operation of the pixel shown in FIG. 2.
Figure 6B:
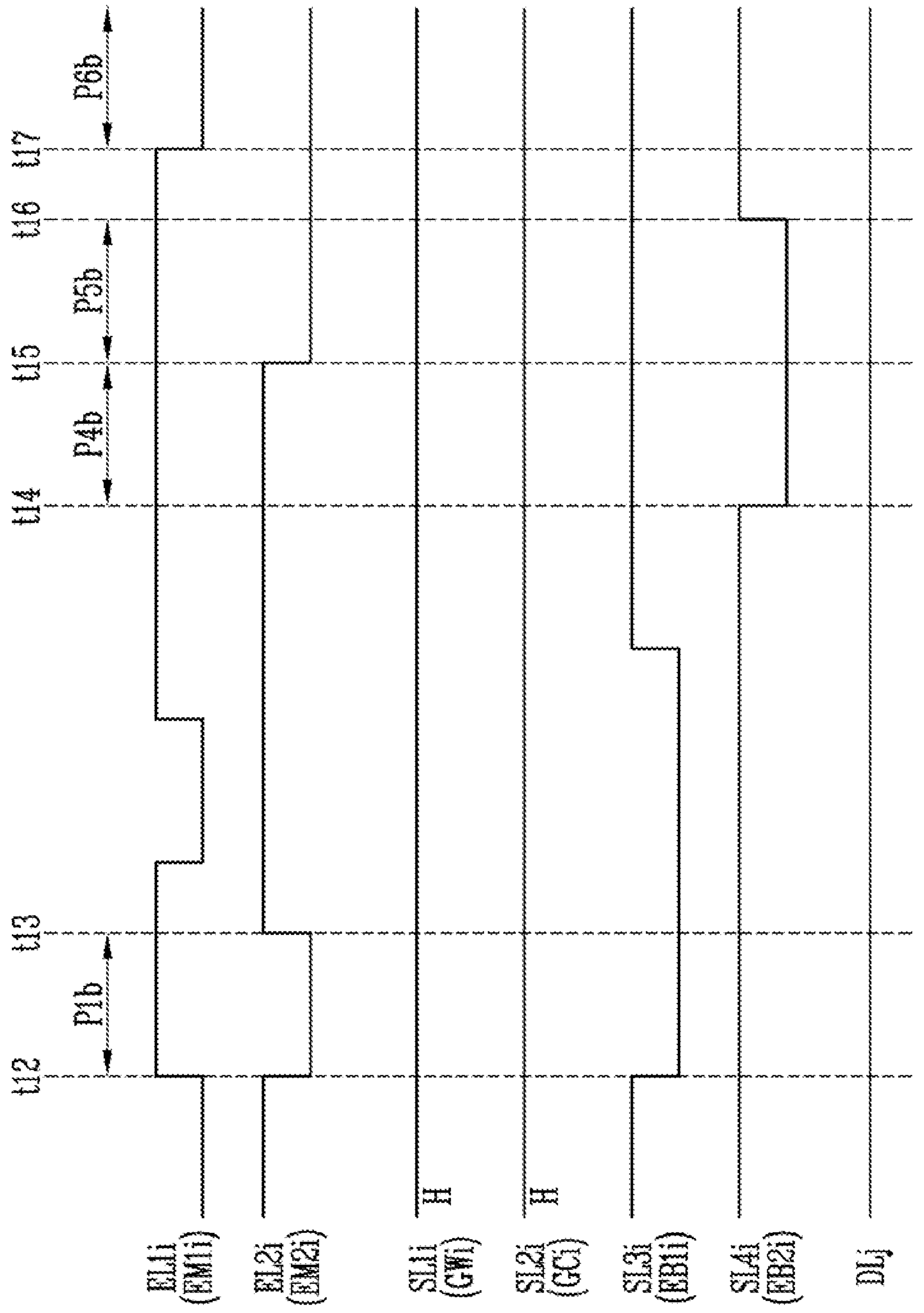
FIG. 6B is a waveform diagram illustrating an example of the operation of the pixel shown in FIG. 2.

FIG. 6A is a waveform diagram illustrating an example of the operation of the pixel shown in FIG. 2. FIG. 6B is a waveform diagram illustrating an example of the operation of the pixel shown in FIG. 2.

Referring to FIGS. 3A, 4A, 6A, and 6B, signals EM1*i*, GWi, GCi, EB1*i*, EB2*i*, and DVj shown in FIGS. 6A and 6B are substantially identical to the first emission control signal EM1*i*, the first scan signal GWi, the second scan signal GCi, the third scan signal EB1*i*, the fourth scan signal EB2*i*, and the data signal DVj shown in FIGS. 3A and 4B, except for a second emission control signal EM2*i* shown in FIGS. 6A and 6B, and therefore, overlapping descriptions may not be repeated. For example, the second emission control signal EM2*i* may transition from the high level to the low level at the twelfth time t12.

Referring to FIGS. 1, 2, 6A, and 6B, the second emission control line EL2*i* may be a line branching off from a first emission control line corresponding to a previous horizontal line (e.g., an (i−6)th horizontal line). Accordingly, the second emission control signal EM2*i* may be a signal shifted (e.g., shifted by six horizontal periods) from the first emission control signal EM1*i*. As described above, the display device 1000 may not separately include an emission driver (e.g., the second emission driver 700) for supplying the second emission control signal EM2*i* to the pixel PX. Therefore, a dead space of the display device 1000 can be decreased.

Figure 7A:
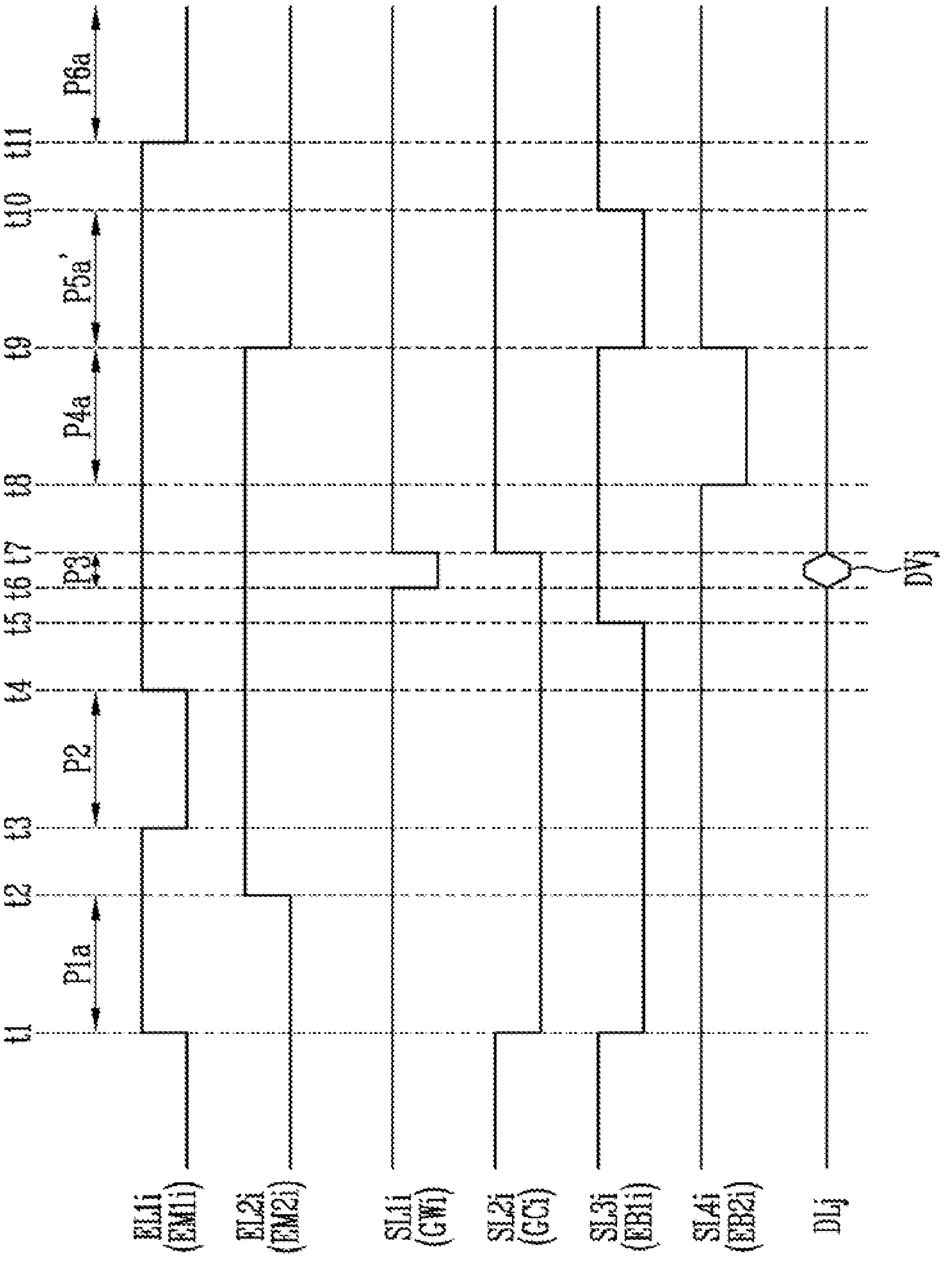
FIG. 7A is a waveform diagram illustrating an example of the operation of the pixel shown in FIG. 2.
Figure 7B:
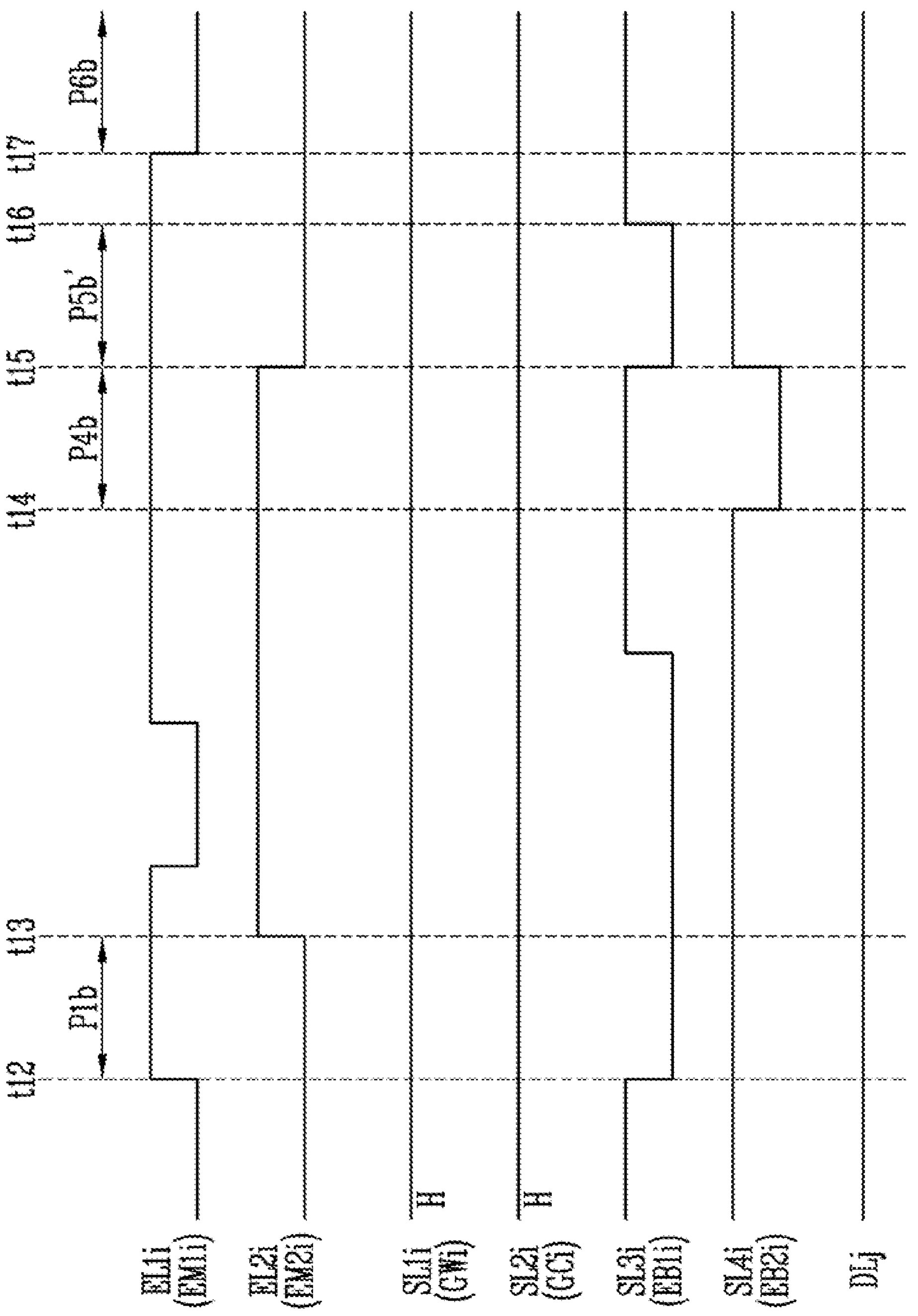
FIG. 7B is a waveform diagram illustrating an example of the operation of the pixel shown in FIG. 2.

FIG. 7A is a waveform diagram illustrating an example of the operation of the pixel shown in FIG. 2. FIG. 7B is a waveform diagram illustrating an example of the operation of the pixel shown in FIG. 2.

Referring to FIGS. 3A, 4A, 7A, and 7B, a pixel operation shown in FIG. 7A is substantially identical or similar to that shown in FIG. 3A, except for a fifth period P5*a*' shown in FIG. 7A, and a pixel operation shown in FIG. 7B is substantially identical or similar to that shown in FIG. 4A, except for a ninth period P5*b*' shown in FIG. 7B. Therefore, overlapping descriptions may not be repeated.

First, referring to FIGS. 2 and 7A, at a ninth time t9, the third scan signal EB1*i* may be changed from the gate-off level to the gate-on level (e.g., transition low), and the fourth scan signal EB2*i* may be changed from the gate-on level to the gate-off level (e.g., transition high). Accordingly, the seventh transistor T7 may be turned on. In addition, the second emission control signal EM2*i* may be changed from the gate-off level to the gate-on level. Accordingly, the sixth transistor T6 may be turned on, so that the voltage of the initialization power source Vint having the low voltage is supplied to the second electrode (or the drain electrode) of the first transistor T1. Therefore, during the fifth period P5*a*' from the ninth time t9 to a tenth time t10, an off-bias may be applied to the first transistor T1 by using the voltage of the initialization power source Vint.

Similarly, referring to FIGS. 2 and 7B, like the pixel operation shown in FIG. 7A, the voltage of the initialization power source Vint having the low voltage may be applied to the second electrode of the first transistor T1 in the ninth period P5*b*', so that an off-bias may be applied to the first transistor T1. For example, in the ninth period P5*b*' the third scan signal EB1*i* and the fourth scan signal EB2*i* may have opposite voltage levels.

Figure 8:
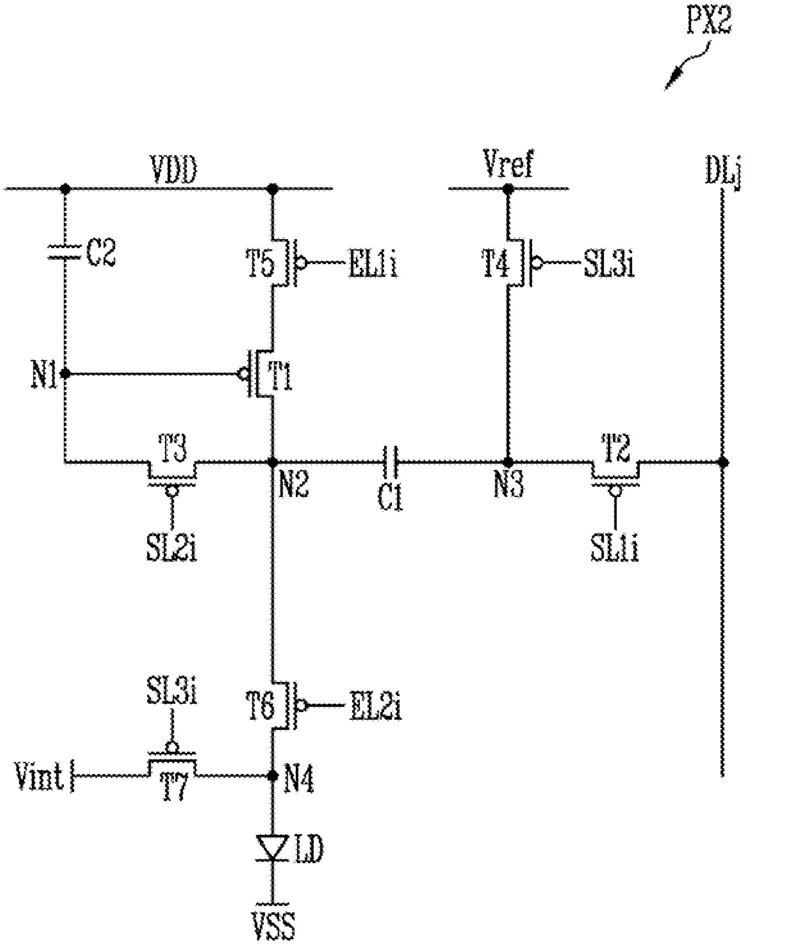
FIG. 8 is a circuit diagram illustrating a pixel in accordance with embodiments of the present invention.

FIG. 8 is a circuit diagram illustrating a pixel in accordance embodiments of the present invention.

Referring to FIGS. 1, 2, and 8, a pixel PX2 shown in FIG. 8 is substantially identical or similar to the pixel PX1 shown in FIG. 2, except that the pixel PX2 does not include the eighth transistor T8 and is not connected to the fourth scan line SL4*i*, and therefore, overlapping descriptions may not be repeated. When the pixel PX included in the display device 1000 is implemented as the pixel PX2 shown in FIG. 8, the display device 1000 may not include the fourth scan driver 500. Accordingly, a dead space of the display device 1000 can be decreased.

Figure 9A:
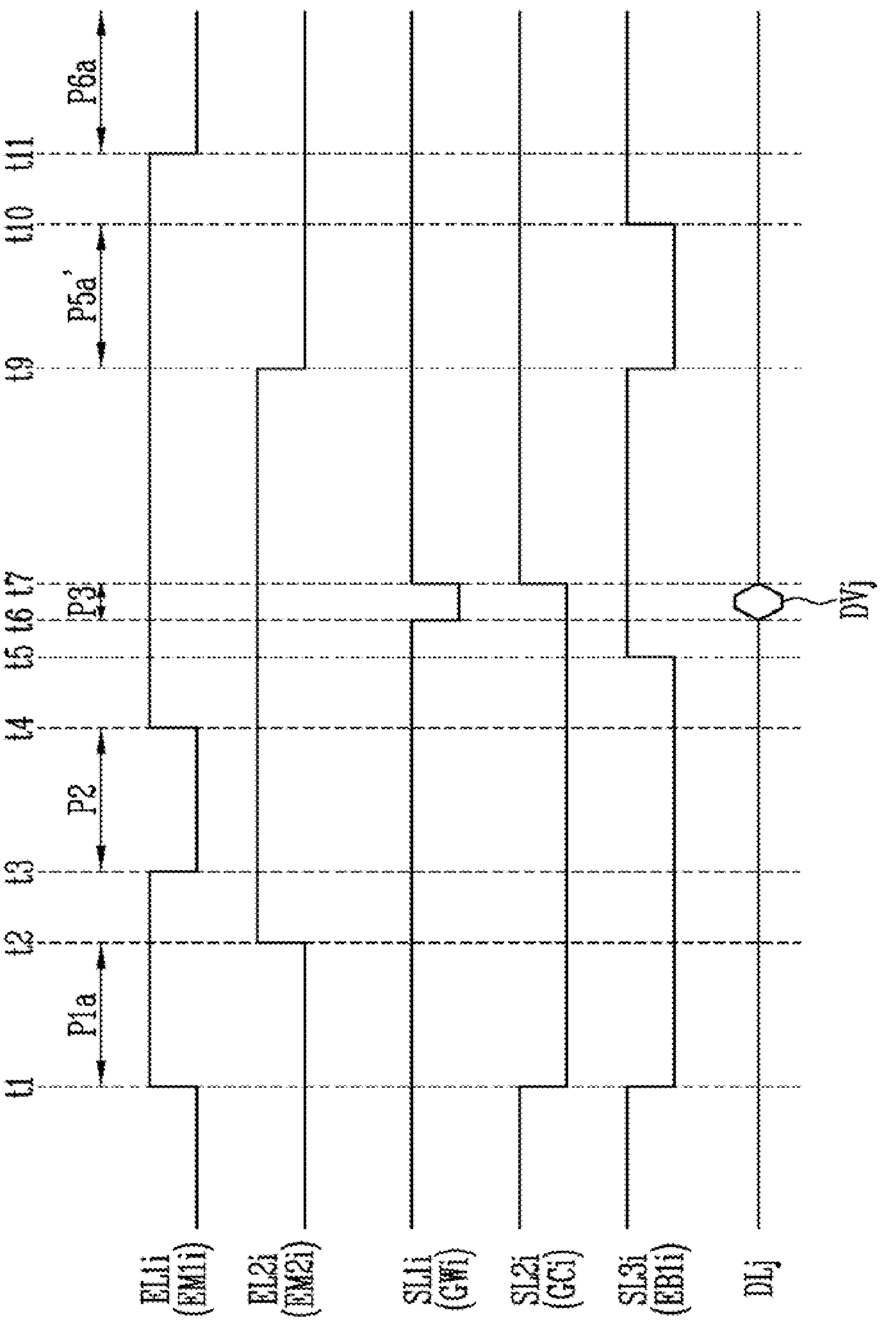
FIG. 9A is a waveform diagram illustrating an example of an operation of the pixel shown in FIG. 8.
Figure 9B:
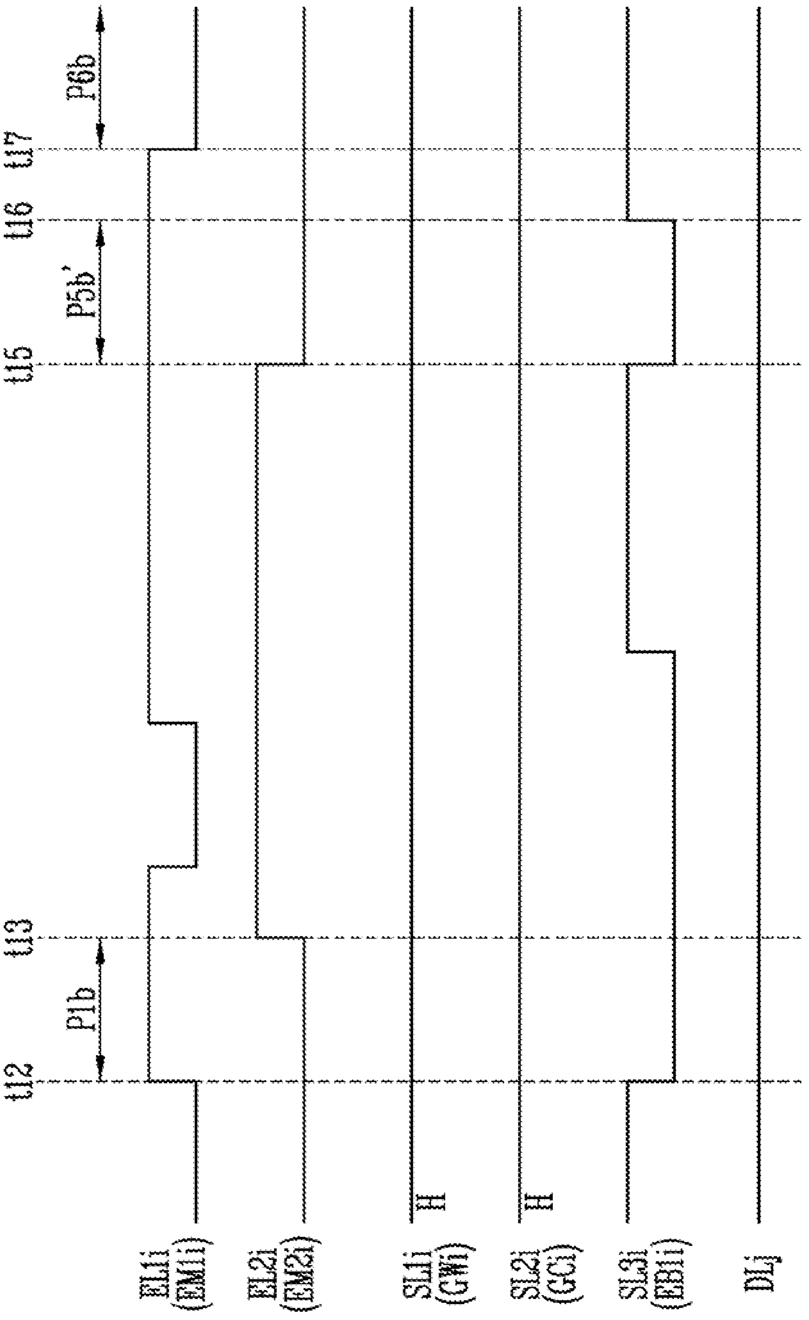
FIG. 9B is a waveform diagram illustrating an example of the operation of the pixel shown in FIG. 8.

FIG. 9A is a waveform diagram illustrating an example of an operation of the pixel shown in FIG. 8. FIG. 9B is a waveform diagram illustrating an example of the operation of the pixel shown in FIG. 8.

Referring to FIGS. 7A, 7B, 9A, and 9B, except that the pixel PX2 shown in FIG. 8 does not include the eighth transistor T8, so that the fourth scan signal EB2*i* is not supplied to the pixel PX2 in the operation of the pixel shown in FIG. 8 in FIGS. 9A and 9B, an operation of the pixel in FIG. 9A is substantially identical or similar to the operation of the pixel in FIG. 7A (except for the fourth period P4*a*), and an operation of the pixel in FIG. 9B is substantially identical or similar to the operation of the pixel in FIG. 7B (except for the eighth period P4*b*). Therefore, overlapping descriptions may not be repeated.

Referring to FIGS. 8, 9A, and 9B, the pixel PX2 shown in FIG. 8 applies an off-bias to the first transistor T1 by using the voltage of the initialization power source Vint, and initializes the second node N2 to the voltage of the initialization power source Vint, without including any separate transistor (e.g., the eighth transistor T8 shown in FIG. 2). Thus, the hysteresis characteristic (e.g., the threshold voltage shift) of the first transistor T1 can be improved, and unintended emission of the light emitting element LD before an emission period can be prevented. Accordingly, the pixel PX2 (or the display device (1000 shown in FIG. 1)) can be simplified.

Figure 10:
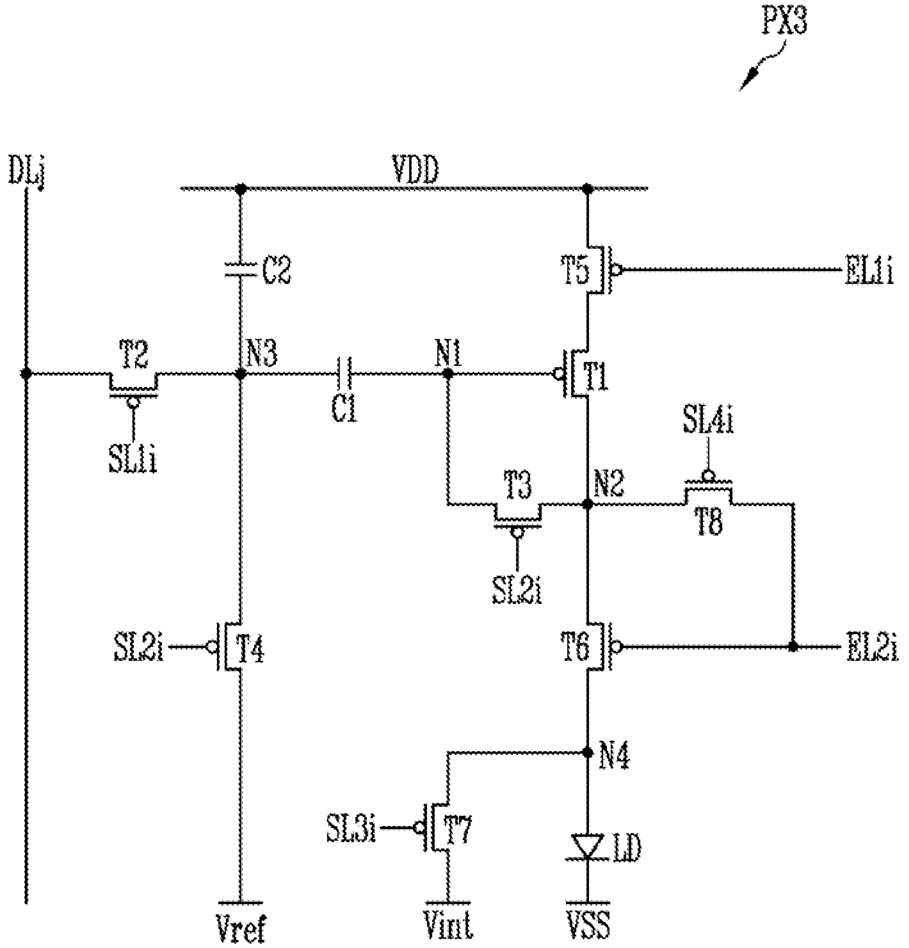
FIG. 10 is a circuit diagram illustrating a pixel in accordance with embodiments of the present invention.

FIG. 10 is a circuit diagram illustrating a pixel in accordance with embodiments of the present invention. A pixel PX3 shown in FIG. 10 may be substantially identical to the pixel PX shown in FIG. 1. In addition, the pixel PX3 shown in FIG. 10 may be substantially identical or similar to the pixel PX1 shown in FIG. 2 except for a connection relationship between transistors and/or capacitors and a partial operation of the pixel PX3.

Referring to FIG. 10, the pixel PX3 may include a light emitting element LD, first to eighth transistors T1 to T8, a first capacitor C1, and a second capacitor C2.

A first electrode of the light emitting element LD may be connected to a second electrode (e.g., a drain electrode or a second node N2) of the first transistor T1 via the sixth transistor T6, and a second electrode of the light emitting element LD may be connected to a second power source VSS. For example, the first electrode of the light emitting element LD may be electrically connected to the second electrode of the first transistor T1 via a fourth node N4 to which one electrode of the sixth transistor T6 and one electrode of the seventh transistor T7 are commonly connected.

The first transistor T1 may be connected to a first power source VDD via the fifth transistor T5, and be connected to the first electrode of the light emitting element LD via the sixth transistor T6. For example, the first transistor T1 may be connected to the sixth transistor T6 at a second node N2 between the third and eighth transistors T3 and T8. The first transistor T1 may generate a driving current and provide the driving current to the light emitting element LD. A gate electrode of the first transistor T1 may be connected to a first node N1. The first transistor T1 may serve as a driving transistor of the pixel PX3. The first transistor T1 may control an amount of current flowing from the first power source VDD to the second power source VSS via the light emitting element LD, corresponding to a voltage applied to the first node N1.

The first capacitor C1 may be connected between the first node N1 corresponding to the gate electrode of the first transistor T1 and a third node N3. In other words, the first capacitor C1 may be directly connected to the gate electrode of the first transistor T1. The first capacitor C1 may store a voltage corresponding to a voltage difference between the first node N1 and the third node N3. In other words the first capacitor C1 may store a voltage corresponding to a voltage difference between the gate electrode of the first transistor and the third node N3.

The second capacitor C2 may be connected between the first power source VDD and the third node N3. For example, one electrode of the second capacitor C2 may be connected to one electrode of the first capacitor C1. The second capacitor C2 may store a voltage corresponding to a voltage difference between the first power source VDD and the third node N3. When one electrode of the second capacitor C2 is connected to the first power source VDD as a static voltage source and the other electrode of the second capacitor C2 is connected to the third node N3 (or the first capacitor C1), the second capacitor C2 may maintain a data signal (or data voltage) written to the third node N3 through the second transistor T2 in a display scan period during a self-scan period in which any data signal is not written. In other words, the second capacitor C2 may stabilize a voltage of the third node N3.

The second transistor T2 may be connected between the data line DLj and the third node N3. The second transistor T2 may include a gate electrode receiving a scan signal. For example, the gate electrode of the second transistor T2 may be connected to a first scan line SL1*i*, to receive a first scan signal. The second transistor T2 may be turned on when the first scan signal is supplied to the first scan line SL1*i*, to electrically connect the data line DLj and the third node N3. Accordingly, a data signal (or data voltage) may be transferred to the third node N3.

The third transistor T3 may be connected between the first node N1 corresponding to the gate electrode of the first transistor T1 and the second node N2 (or the second electrode or drain electrode of the first transistor T1). In other words, the third transistor T3 may be connected to the gate electrode and the drain electrode of the first transistor T1. The third transistor T3 may include a gate electrode receiving a scan signal. For example, the gate electrode of the third transistor T3 may be connected to a second scan line SL2*i*, to receive a second scan signal. The third transistor T3 may be turned on when the second scan signal is supplied to the second scan line SL2*i*, to electrically connect the first node N1 and the second node N2. When the third transistor T3 is turned on, a voltage of an initialization power source Vint may be supplied to the first node N1 (or the gate electrode of the first transistor T1), or the first transistor T1 may have a diode connection form. When the first transistor T1 has the diode connection form, a threshold voltage of the first transistor T1 may be compensated.

The fourth transistor T4 may be connected between a reference power source Vref and the third node N3. For example, the fourth transistor T4 may be connected to one terminal of the second capacitor C2. The fourth transistor T4 may include a gate electrode receiving a scan signal. For example, the gate electrode of the fourth transistor T4 may be connected to the second scan line SL2*i*, to receive the second scan signal. The fourth transistor T4 may be turned on when the second scan signal is supplied to the second scan line SL2*i*, to electrically connect the reference power source Vref and the third node N3. Accordingly, a voltage of the reference power source Vref may be supplied to the third node N3. Therefore, a voltage of the third node N3 may be initialized to the voltage of the reference power source Vref.

Since the gate electrodes of the third and fourth transistors T3 and T4 are connected to the same scan line (e.g., the second scan line SL2*i*), the third and fourth transistors T3 and T4 may be simultaneously turned off or turned on.

The fifth transistor T5 may be connected between the first power source VDD and a first electrode of the first transistor T1. The fifth transistor T5 may include a gate electrode receiving an emission control signal. For example, the gate electrode of the fifth transistor T5 may be connected to a first emission control line EL1*i*, to receive a first emission control signal. The fifth transistor T5 may be turned off when the first emission control signal is supplied to the first emission control line EL1*i*, and be turned on in other cases. In other words, the fifth transistor T5 may be kept on when the first emission control signals not supplied to the first emission control line EL1*i*. The fifth transistor T5 in a turn-on state may connect the first electrode of the first transistor T1 to the first power source VDD.

The sixth transistor T6 may be connected between the second node N2 corresponding to the second electrode of the first transistor T1 and the light emitting element LD (or the fourth node N4). The sixth transistor T6 may include a gate electrode receiving an emission control signal. For example, the gate electrode of the sixth transistor T6 may be connected to a second emission control line EL2*i*, to receive a second emission control signal. The sixth transistor T6 may be turned off when the second emission control signal is supplied to the second emission control line EL2*i*, and be turned on in other cases. For example, the sixth transistor T6 may be kept on when the second emission control signal is not supplied to the second emission control line EL2*i*. The sixth transistor T6 in the turn-on state may electrically connect the second node N2 and the fourth node N4.

In an embodiment of the present invention, the first emission control line EL1*i* and the second emission control line EL2*i* may be the same line. In other words, the emission control signal (or first emission control signal) applied to the fifth transistor T5 and the emission control signal (or second emission control signal) applied to the sixth transistor T6 may have the same waveform. A display device (e.g., the display device 1000 shown in FIG. 1) may include only one emission driver, so that a dead space of the display device (e.g., the display device 1000 shown in FIG. 1) can be decreased.

When both the fifth and sixth transistors T5 and T6 are turned on, the light emitting element LD may emit light with a luminance corresponding to the voltage of the first node N1.

In an embodiment of the present invention, when the fifth transistor T5 is turned on and the sixth transistor T6 is turned off, threshold voltage compensation of the first transistor T1 may be performed.

In an embodiment of the present invention, when the fifth transistor T5 is turned off and the sixth transistor T6 is turned on, an initialization operation of the first transistor T1 may be performed.

The seventh transistor T7 may be connected to the light emitting element LD (or the fourth node N4) and the initialization power source Vint. The seventh transistor T7 may include a gate electrode receiving a scan signal. For example, the gate electrode of the seventh transistor T7 may be connected to a third scan line SL3*i*, to receive a third scan signal. The seventh transistor T7 may be turned on when the third scan signal is supplied to the third scan line SL3*i*, to electrically connect the initialization power source Vint and the fourth node N4. Accordingly, a voltage of the fourth node N4 (or the first electrode of the light emitting element LD) may be initialized to the voltage of the initialization power source Vint. For example, the voltage of the initialization power source Vint may be provided to the fourth node N4 via the seventh transistor T7. When the voltage of the initialization power source Vint is supplied to the first electrode of the light emitting element LD a parasitic capacitor of the light emitting element LD may be discharged. Since a residual voltage charged in the parasitic capacitor is discharged (or eliminated), unintended fine emission can be prevented. Thus, a black expression capability of the pixel PX1 can be improved.

The eighth transistor T8 may be connected between the second electrode (or the second node N2) of the first transistor T1 and the second emission control line EL2*i*. The eighth transistor T8 may include a gate electrode receiving a scan signal. For example, the gate electrode of the eighth transistor T8 may be connected to a fourth scan line SL4*i*, to receive a fourth scan signal. The eighth transistor T8 may be turned on when the fourth scan signal is supplied to the fourth scan line SL4*i*, to electrically connect the second node N2 and the second emission control line EL2*i*.

As described with reference to FIG. 2, the eighth transistor T8 may supply a high voltage or a low voltage to the second electrode of the first transistor T1, based on the second emission control signal having a gate-off level (e.g., a high voltage) or a gate-on level (e.g., a low voltage). Accordingly, the first transistor T1 may have an on-bias state or an off-bias state.

In addition, a period n which the second transistor T2 is turned on and a period in which the third to fifth transistors T3, T4, and T5 are turned on do not overlap with each other. For example, when the third to fifth transistors T3, T4, and T5 are turned on, the threshold voltage compensation of the first transistor T1 may be performed. When the second transistor T2 is turned on, data writing may be performed. Therefore, a threshold voltage compensation period and a data writing period may be separated from each other.

In low frequency driving in which the length of one frame period is lengthened, a hysteresis difference caused by a grayscale difference between adjacent pixels may occur. Therefore, a difference in an amount of threshold voltage shift between driving transistors of the adjacent pixels may occur, and screen attraction (e.g., ghost phenomenon) caused by the difference in the amount of threshold voltage shift may be seen by a viewer.

In the display device in accordance with embodiments of the present invention, a bias can be periodically applied with a constant voltage to the drain electrode (and/or a source electrode) of the driving transistor (e.g., the first transistor T1) by using the eighth transistor T8. Thus, a hysteresis variation caused by a grayscale difference between adjacent pixels can be removed, and accordingly, screen attraction can be reduced (or removed).

FIGS. 11A to 11F are waveform diagrams illustrating an example of an operation of the pixel shown in FIG. 10.

Figure 11A:
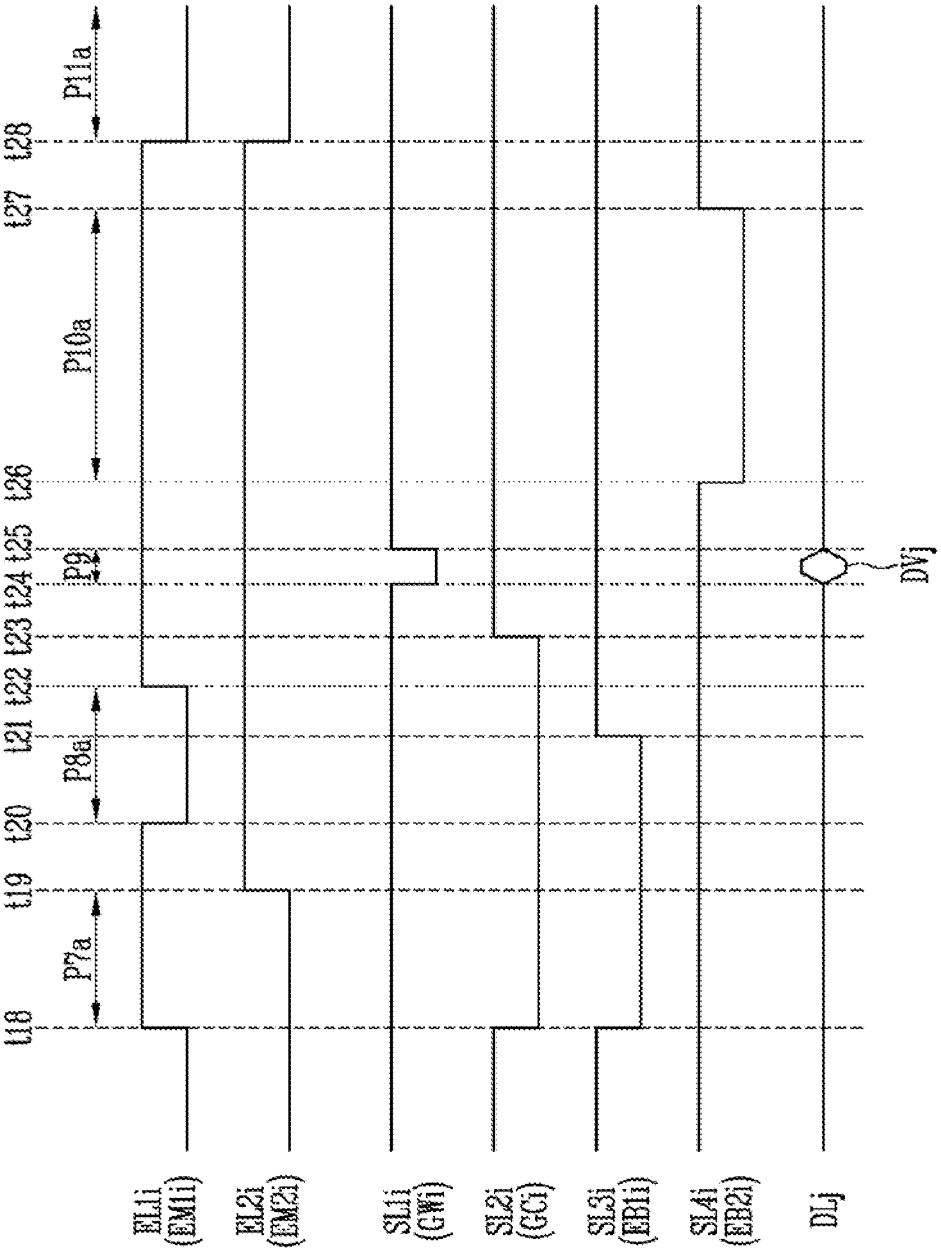

Referring to FIGS. 10 and 11A, the pixel PX1 may be supplied with signals for image display during a display scan period DSP. The display scan period DSP may include a period in which a data signal DVj actually corresponding to an output image is written.

First and second emission control signals EM1*i* and EM2*i* may be respectively supplied to the first and second emission control lines EL1*i* and EL2*i*, and first to fourth scan signals GWi, GCi, EB1*i*, and EB2*i* may be respectively supplied to the first to fourth scan lines SL1*i* SL2*i*, SL3*i*, and SL4*i*.

At an eighteenth time t18, the third scan signal EB1*i* may be changed from a gate-off level to a gate-on level. Accordingly, the seventh transistor T7 may be turned on. Accordingly, the voltage of the initialization power source Vint is supplied to the fourth node N4 (or the first electrode of the light emitting element LD), so that the fourth node N4 can be initialized to the voltage of the initialization power source Vint.

In addition, the second scan signal GCi may be changed from the gate-off level to the gate-on level. Accordingly, the third transistor T3 may be turned on. In addition, since the second emission control signal EM2*i* maintains the gate-on level, the sixth transistor T6 may be turned on or maintain the turn-on state. Accordingly, the voltage of the initialization power source Vint, which is supplied to the fourth node N4, is supplied to the first node N1 (or the gate electrode of the first transistor T1) so that the first node N1 can be initialized to the voltage of the initialization power source Vint.

In addition, the fourth transistor T4 may be turned on by the second scan signal GCi having the gate-on level. Accordingly, the voltage of the reference power source Vref is supplied to the third node N3, so that the third node N3 can be initialized to the voltage of the reference power source Vref.

Figure 11B:
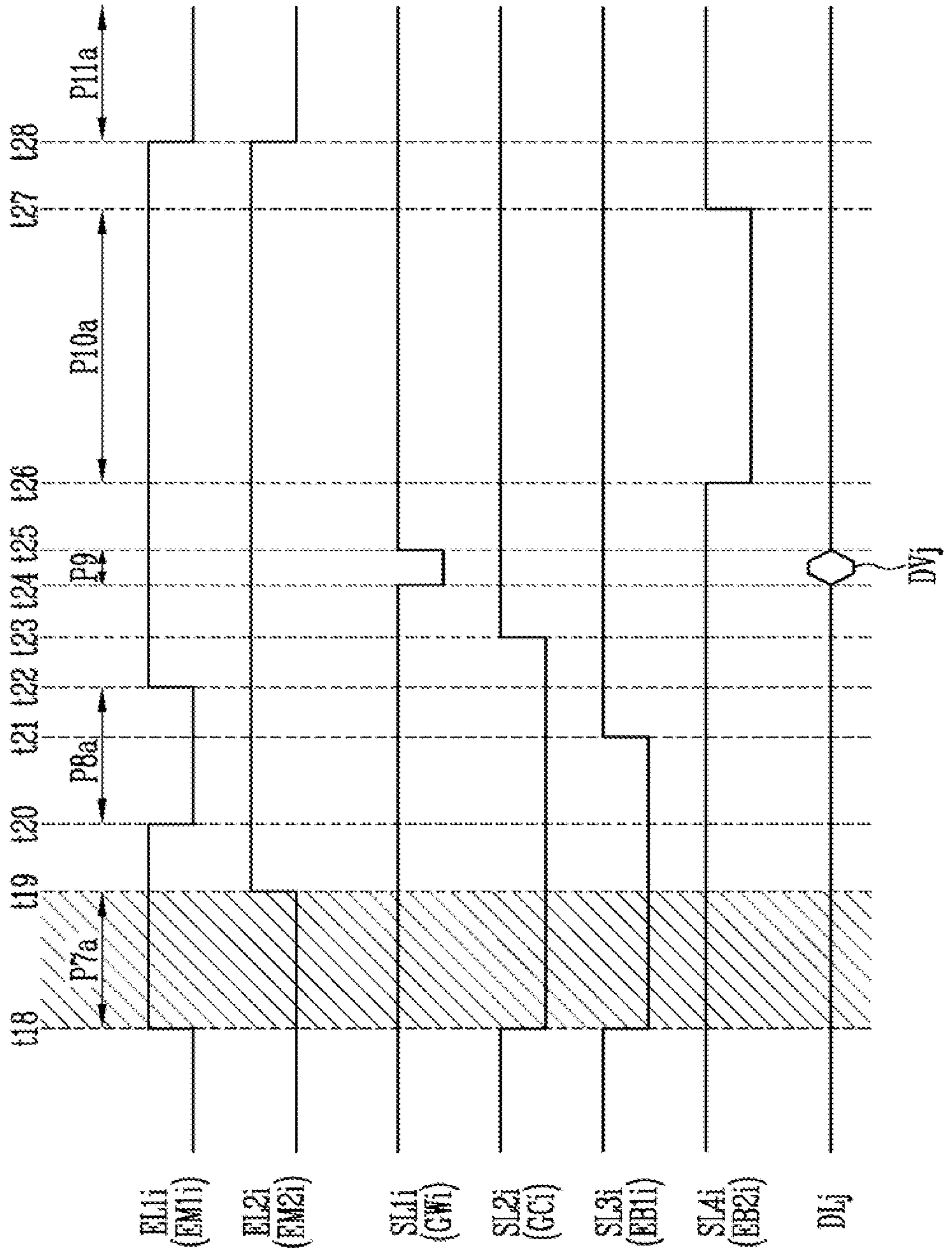

Accordingly, during an eleventh period P7*a* from the eighteenth time t18 to a nineteenth time t19, which highlighted by dashed lines in FIG. 11B, the voltage of the initialization power source Vint may be supplied to the first node N1, the voltage of the reference power source Vref may be supplied to the third node N3, and the voltage of the initialization power source Vint may be supplied to the fourth node N4. In other words, the eleventh period P7*a* may be an initialization period (or first initialization period) in which the first electrode (or anode electrode) of the light emitting element LD, the gate electrode of the driving transistor (first transistor T1), and the third node N3 are initialized.

Since the third scan signal EB1*i* maintains the gate-on level during a period from the eighteenth time t18 to a twenty-first time t21, an initialization operation of the first electrode of the light emitting element LD may be performed during this period, i.e., from t18 to t21. In addition, since the second scan signal GCi maintains the gate-on level during a period from the eighteenth time t18 to a twenty-third time t23, the voltage of the reference power source Vref may be supplied to the third node N3 during this period, i.e., from t18 to t23.

At the nineteenth time t19, the second emission control signal EM2*i* may be changed from the gate-on level to the gate-off level. Accordingly, the sixth transistor T6 may be turned off.

At a twentieth time t20, the first emission control signal EM1*i* may be changed from the gate-off level to the gate-on level. Accordingly, the fifth transistor T5 is turned on, so that the first electrode (e.g., the source electrode) of the first transistor T1 may be connected to the first power source VDD.

In addition, since the second scan signal GCi maintains the gate-on level, the third transistor T3 may maintain the turn-on state. Accordingly, the first transistor T1 may have the diode connection form. A voltage corresponding to a difference (or voltage difference) between the voltage of the first power source VDD and the threshold voltage of the first transistor T1 may be sampled at the first node N1.

Figure 11C:
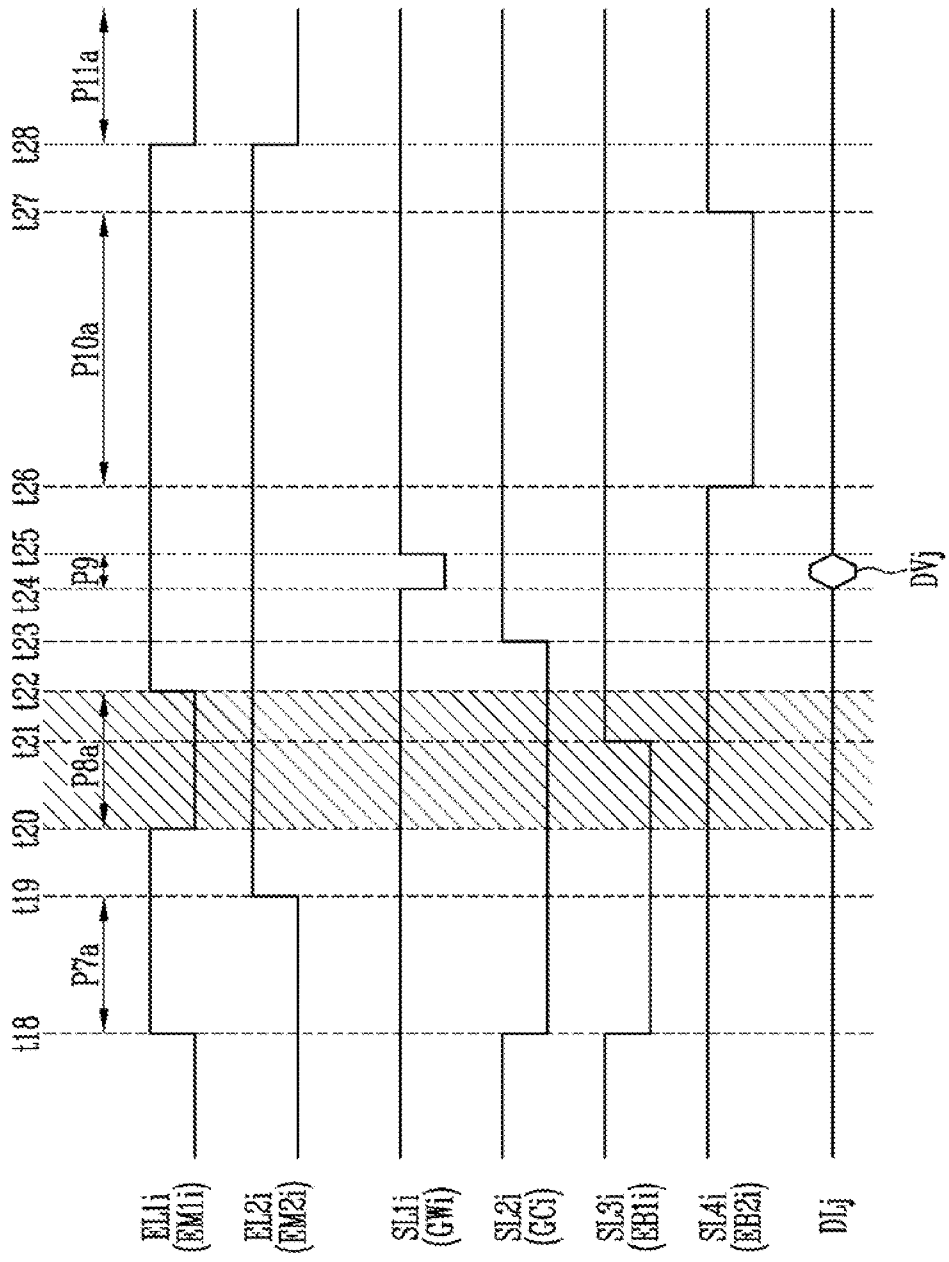

Accordingly, during a twelfth period P8*a* from the twentieth time t20 to a twenty-second time t22, which is highlighted by diagonal lines in FIG. 11C, the first transistor T1 has the diode connection form, so that the threshold voltage of the first transistor T1 can be compensated. In other words, the second period P2 may be a threshold voltage compensation period.

In addition, in the twelfth period P8*a*, threshold voltage compensation may be performed by the voltage of the first power source VDD. Therefore, a threshold voltage compensation operation may be performed based on a fixed voltage instead of a data signal (e.g., a data voltage) which may be changed depending on a pixel row and/or a frame.

At the twenty-first time t21, the third scan signal EB1*i* may be changed from the gate-on level to the gate-off level. Accordingly, the seventh transistor T7 may be turned off.

At the twenty-second time t22, the first emission control signal EM1*i* may be changed from the gate-on level to the gate-off level. Accordingly, the fifth transistor T5 may be turned off.

At the twenty-third time t23, the second scan signal GC1 may be changed from the gate-on level to the gate-off level. Accordingly, the third and fourth transistors T3 and T4 may be turned off.

At a twenty-fourth time t24, the first scan signal GWi is changed from the gate-off level to the gate-on level, so that the second transistor T2 can be turned on. Accordingly, the data signal DVj may be supplied to the third node N3. For example, the data signal DVj is supplied to third node N3 and consequently the first capacitor C1 while the first scan signal GWi has the gate-on level.

Since the first node N1 is connected to the third node N3 by the first capacitor C1, a variance in voltage of the third node N3 (e.g., "DATA-Vref") may be reflected to the first node N1. Therefore, the voltage of the first node N1 may be changed to "VDD−Vth+(DATA−Vref)." DATA may be a voltage corresponding to the data signal DVj, Vref may be the voltage of the reference power source Vref, VDD may be the voltage of the first power source VDD, and Vth may be the threshold voltage of the first transistor T1.

Figure 11D:
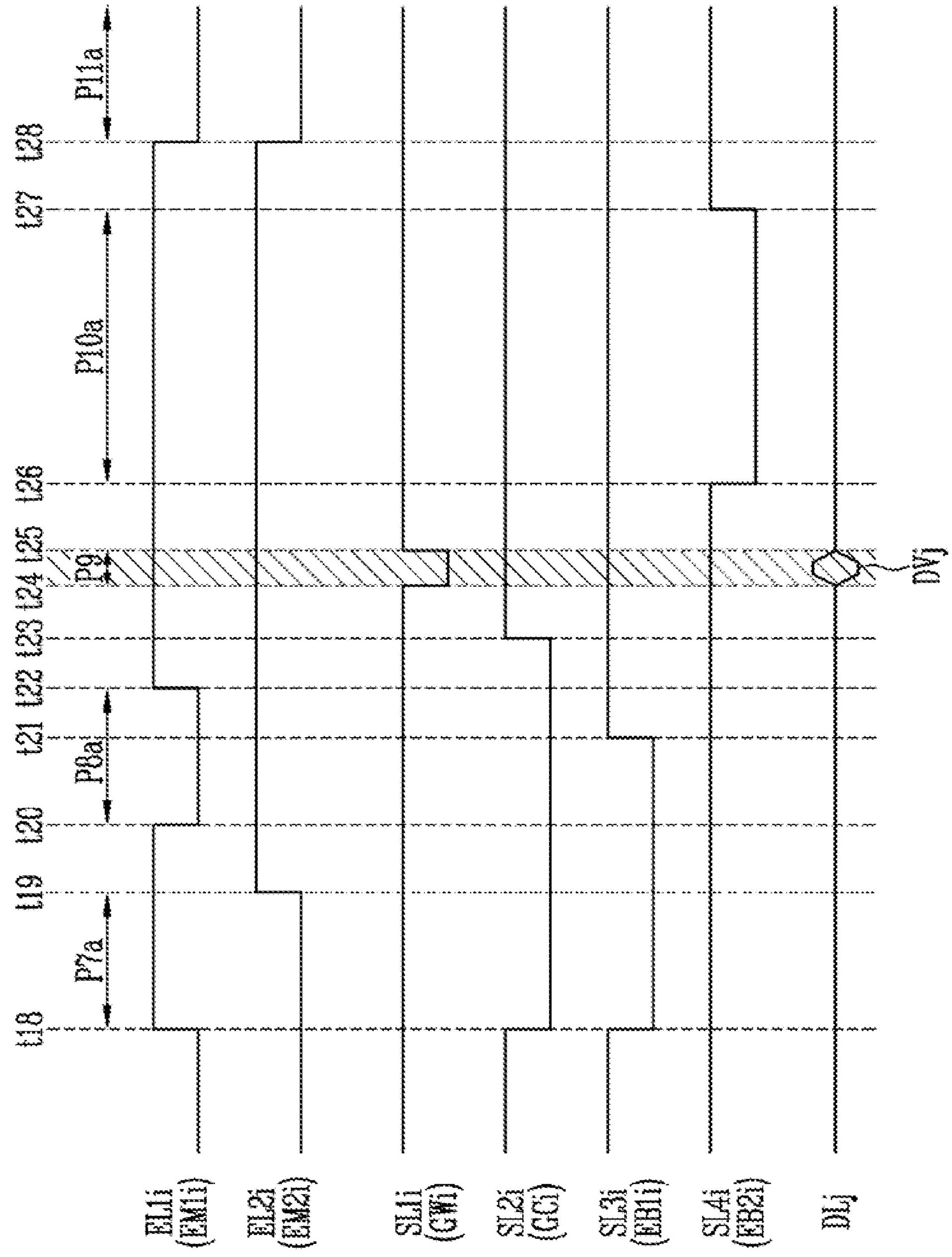

Accordingly, the data signal DVj may be written to the pixel PX3 during a thirteenth period P9 from the twenty-fourth time t24 to a twenty-fifth time t25, which highlighted by diagonal lines in FIG. 11D. In other words, the thirteenth period P9 may be a data writing period.

In an embodiment of the present invention, a length of the thirteenth period P9, e.g., a length (or pulse width) of the first scan signal GWi may correspond to one horizontal period 1H. However, the length of the first scan signal GWi is not limited thereto. For example, the length of the first scan signal GWi may correspond to two horizontal periods 2H or more.

At the twenty-fifth time t25, the first scan signal GWi may be changed from the gate-on level to the gate-off level. Accordingly, the second transistor T2 may be turned off.

At a twenty-sixth time t26, the fourth scan signal EB2*i* may be changed from the gate-off level to the gate-on level. Accordingly, the eighth transistor T8 may be turned on. In addition, at the twenty-sixth time t26, the second emission control signal EM2*i* having a high voltage (or the gate-off level) may be supplied to the second emission control line EL2*i*. Therefore, the high voltage of the second emission control signal EM2*i* may be supplied to the second electrode (or the drain electrode) of the first transistor T1.

Figure 11E:
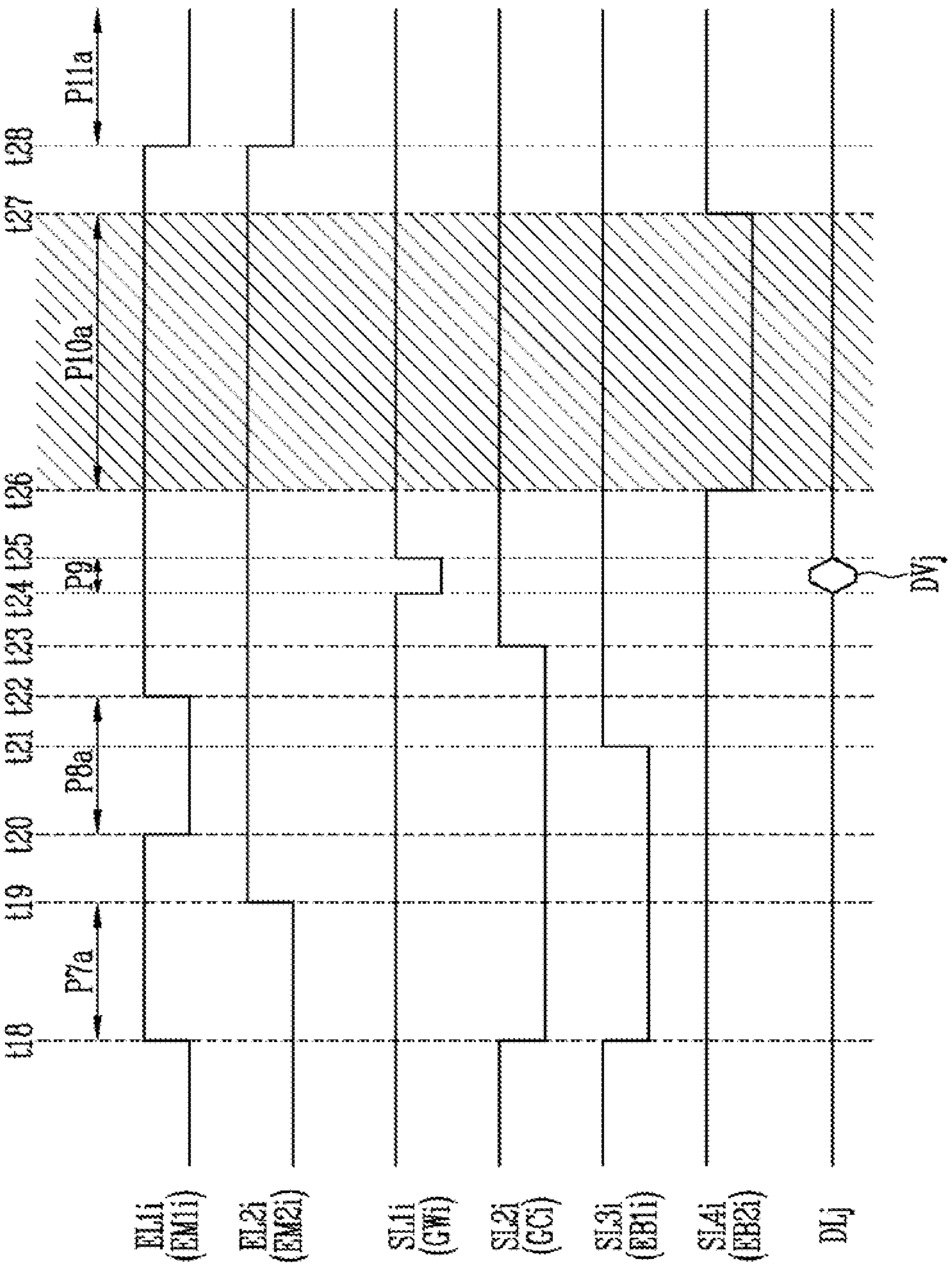
Figure 11F:
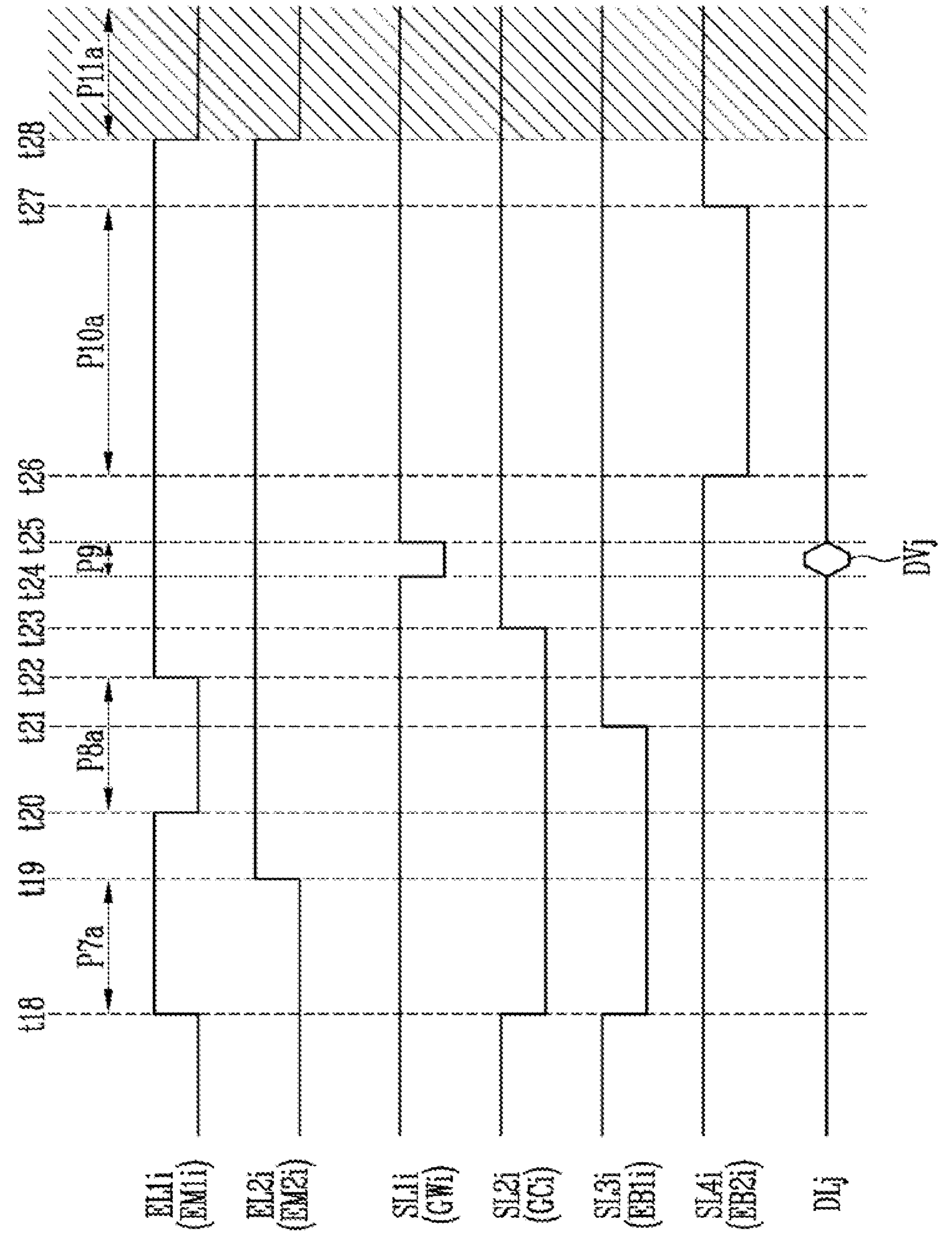

Accordingly, during a fourteenth period P10*a* from the twenty-sixth time t26 to a twenty-seventh time t27, which is by diagonal lines in FIG. 11E, an on-bias may be applied to the first transistor T1. In other words, the fourteenth period P10*a* may be an on-bias period (or a first on-bias period).

At the twenty-seventh time t27, the fourth scan signal EB2*i* may be changed from the gate-on level to the gate-off level. Accordingly, the eighth transistor T8 may be turned off.

The on-bias is applied to the first transistor T1 in the fourteenth period P10*a*, so that a hysteresis characteristic (e.g., a threshold voltage shift) of the first transistor T1 can be minimized.

Thus, in the pixel PX1 and the display device (1000 shown in FIG. 1) according to the operation shown in FIG. 11A, the hysteresis characteristic is removed or minimized while removing a threshold voltage variation of the first transistor T1, so that an image failure (e.g., a flicker, color attraction, a luminance decrease, etc.) can be minimized.

At a twenty-eighth time t28, the first and second emission control signals EM1*i* and EM2*i* may be changed from the gate-off level to the gate-on level. Accordingly, the fifth and sixth transistors T5 and T6 may be turned on, and the pixel PX3 may emit light in a fifteenth period P11*a* after the twenty-eighth time t28 as highlighted by diagonal lines in FIG. 11F. In other words, the fifteenth period P11*a* may be an emission period (or first emission period).

FIGS. 12A to 12E are waveform diagrams illustrating an example of the operation of the pixel shown in FIG. 10.

Figure 12A:
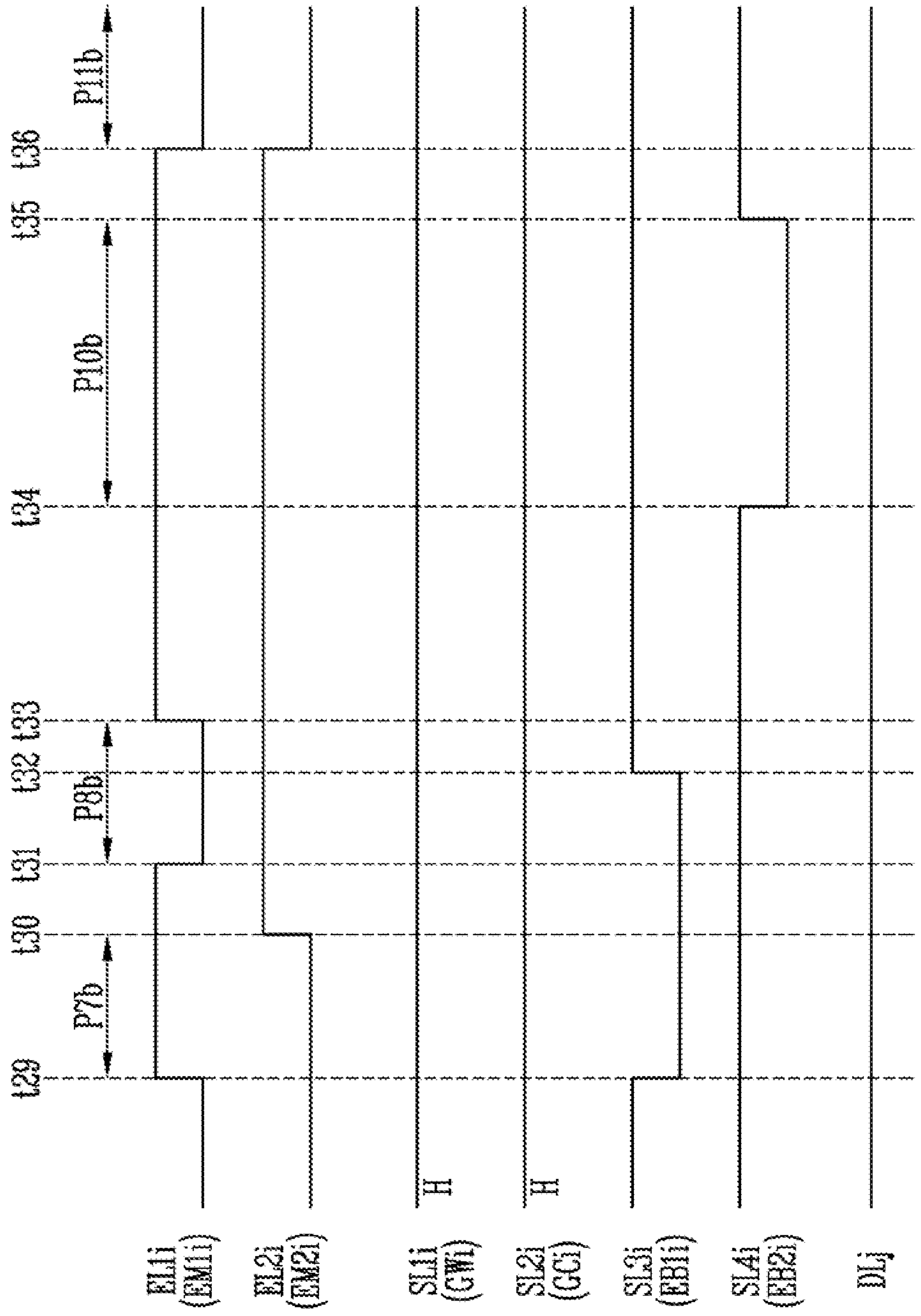

Referring to FIGS. 10, 11A, and 12A, to maintain the luminance of an image output in the display scan period DSP, an on-bias voltage and/or an off-bias voltage may be applied to the second electrode (e.g., the drain electrode or the second node N2) of the first transistor T1 in a self-scan period SSP.

One frame may include at least one self-scan period SSP according to an image frame rate. The self-scan period SSP may include an off-bias period (or a first off-bias period) of a sixteenth period P7*b*, an on-bias period (or a second on-bias period) of a seventeenth period P8*b*, an on-bias period (or a third on-bias period) of an eighteenth period P10*b* and an emission period (or a second emission period) of a nineteenth period P11*b*. In addition, an operation of the self-scan period SSP shown in FIG. 12A is substantially identical to that of the display scan period DSP shown in FIG. 11A, except signal supply for threshold voltage compensation in the twelfth period P8*a* (or the threshold voltage compensation period) shown in FIG. 11A and signal supply for data signal writing in the thirteenth period P9 (or the data writing period). For example, the first and second scan signals GWi and GCi are kept high.

In an embodiment of the present invention, no scan signal is supplied to the second to fourth transistors T2, T3, and T3 in the self-scan period SSP. For example, in the self-scan period SSP, the first scan signal GWi and the second scan signal GCi, which are respectively supplied to the first scan line SL1*i* and the second scan line SL2*i*, may have a gate-off level (or a high level H). Accordingly, the self-scan period SSP does not include the threshold voltage compensation period (e.g., the twelfth period P8*a*) and the data writing period (e.g., the thirteenth period P9).

Figure 12B:
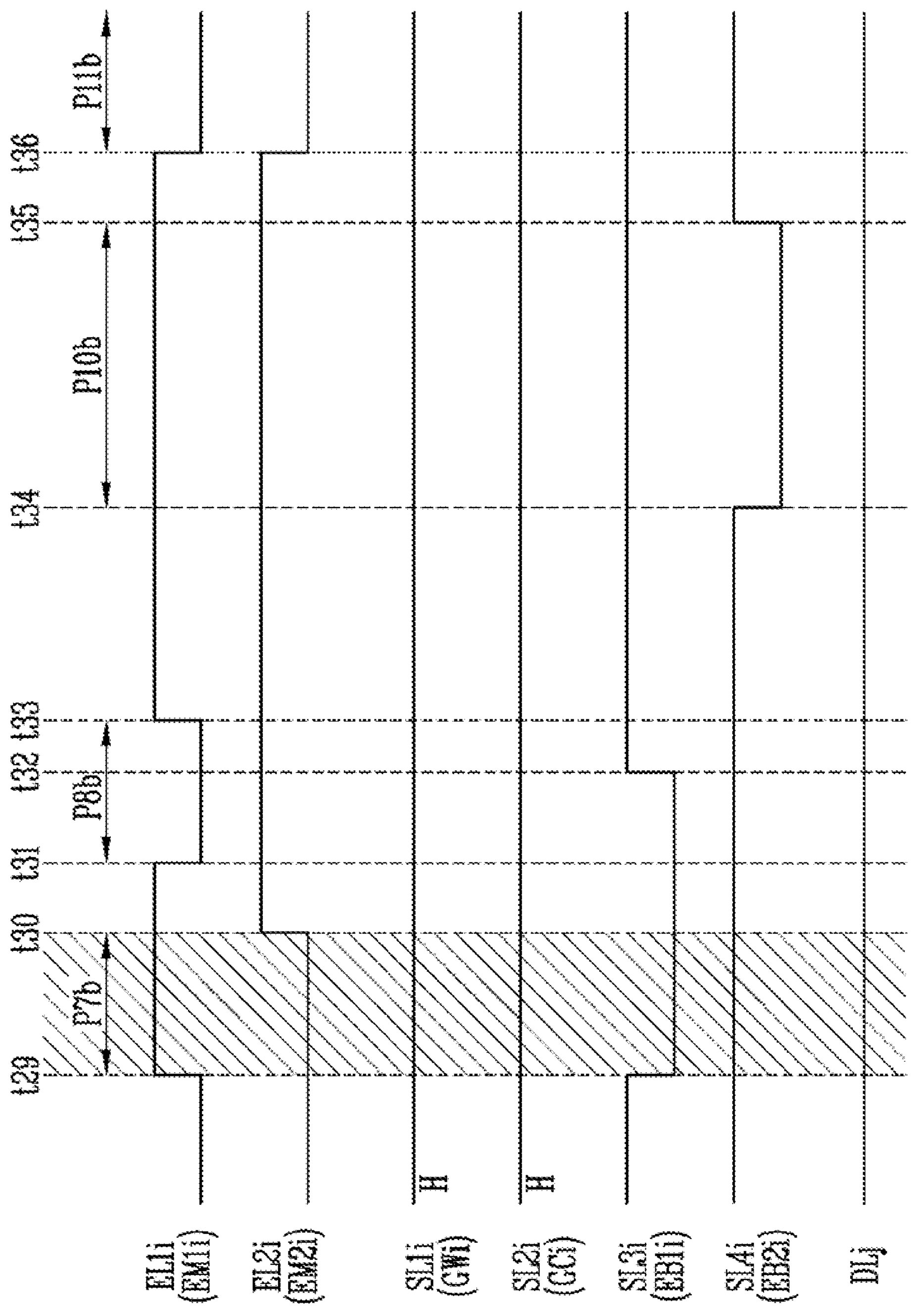

Since the third scan signal EB1*i* having a gate-on level and the second emission control signal EM2*i* having the gate-on level are supplied during the sixteenth period P7*b* (or first off-bias period) from a twenty-ninth time t29 to a thirtieth time t30, which is highlighted by diagonal lines in FIG. 12B, the sixth and seventh transistors T6 and T7 may be turned on or maintain the turn-on state. Accordingly, the voltage of the initialization power source Vint having a low voltage is supplied to the second electrode (or drain electrode) of the first transistor T1, so that the first transistor T1 may have an off-bias state.

Figure 12C:
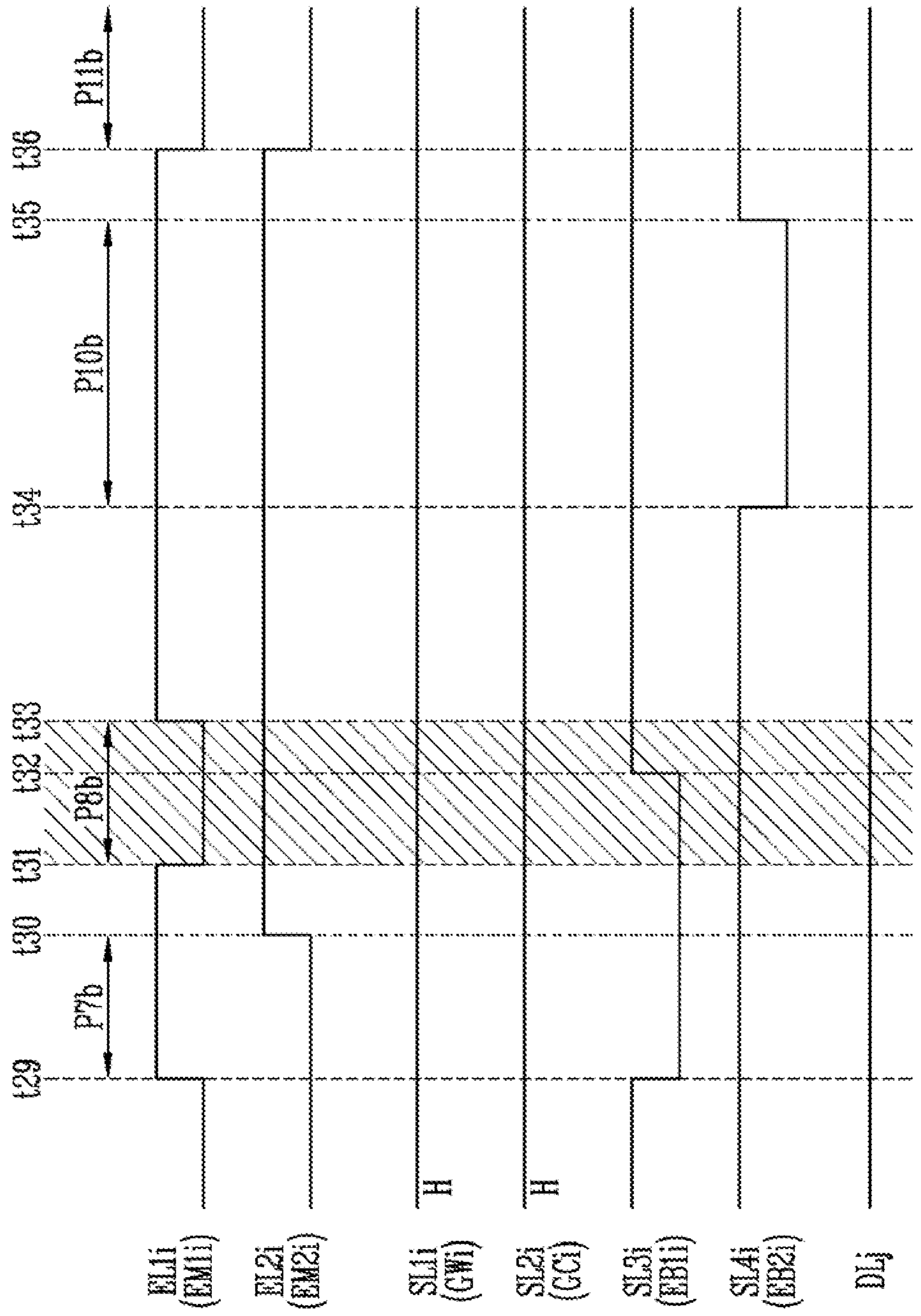

Since the first emission control signal EM1*i* having the gate-on level is supplied during the seventeenth period P8*b* (or the second on-bias period) from a thirty-first time t31 to a thirty-third time t33, which is highlighted by diagonal lines in FIG. 12C, the fifth transistor T5 may be turned on or maintain the turn-on state. Accordingly, the voltage of the first power source VDD as a high voltage is supplied to the first electrode (or source electrode) of the first transistor T1, so that the first transistor T1 may have an on-bias state.

In addition, since the third scan signal EB1*i* is maintained to have the gate-on level during a period from the twenty-ninth time t29 to a thirty-second time t32, the seventh transistor T7 may be turned on or maintain the turn-on state. Accordingly, the voltage of the initialization power source Vint is supplied to the fourth node N4 (or the first electrode of the light emitting element LD), so that the fourth node N4 can be initialized to the voltage of the initialization power source Vint.

Figure 12D:
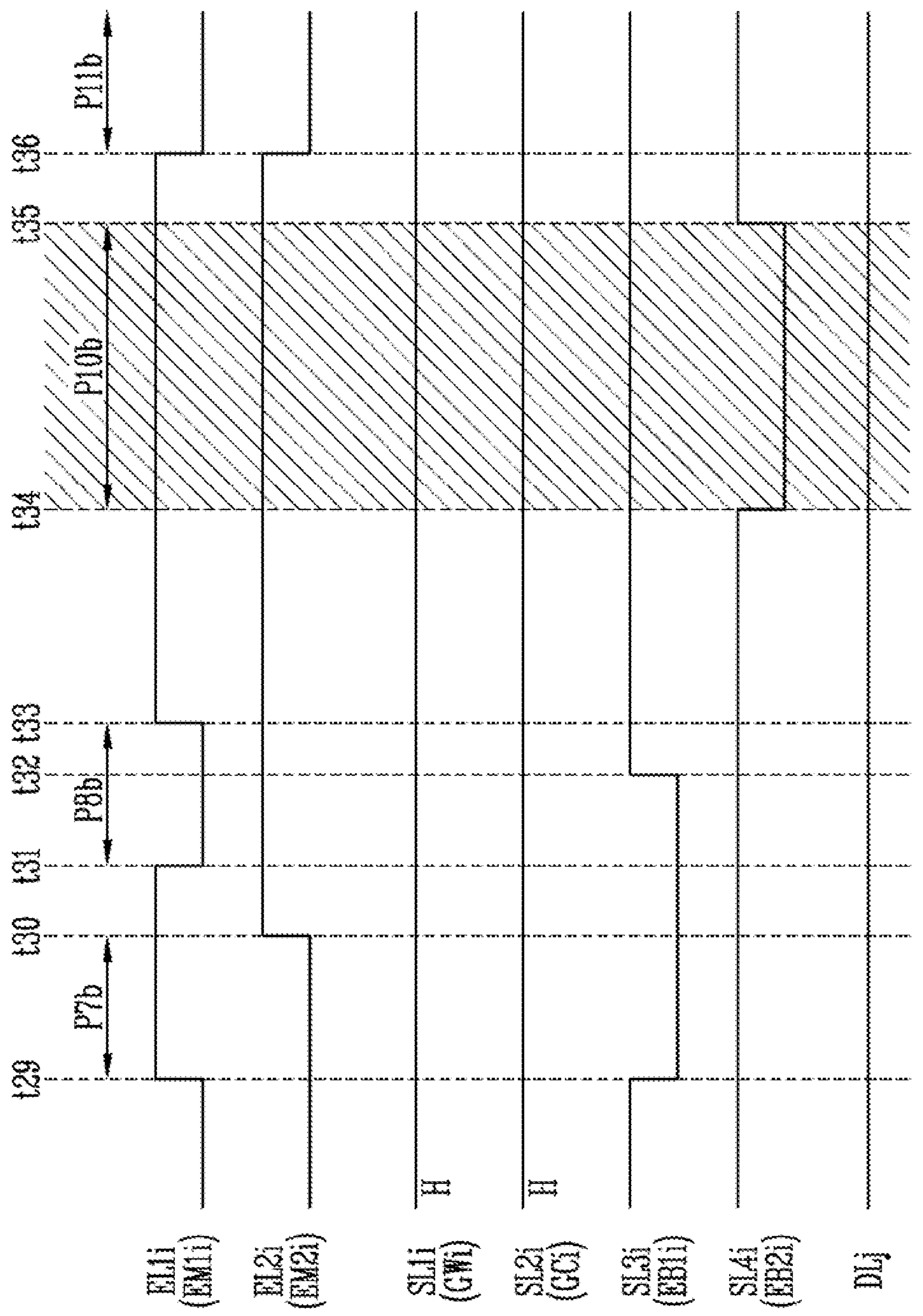

Since the fourth scan signal EB2*i* having the gate-on level during the eighteenth period P10*b* (or the third on-bias period) from a thirty-fourth time t34 to a thirty-fifth time t35, which is highlighted by diagonal lines in FIG. 12D, the eighth transistor T8 may be turned on or maintain the turn-on state. The eighteenth period P10*b* may be greater than each of the sixteenth and seventeenth periods P7*b* and P8*b*. In addition, the second emission control signal EM2*i* having a high voltage (or gate-off level) may be supplied to the second emission control line EL2*i*. Accordingly, the high voltage of the second emission control signal EM2*i* is supplied to the second electrode (or drain electrode) of the first transistor T1, so that the first transistor T1 can have the on-bias state.

Figure 12E:
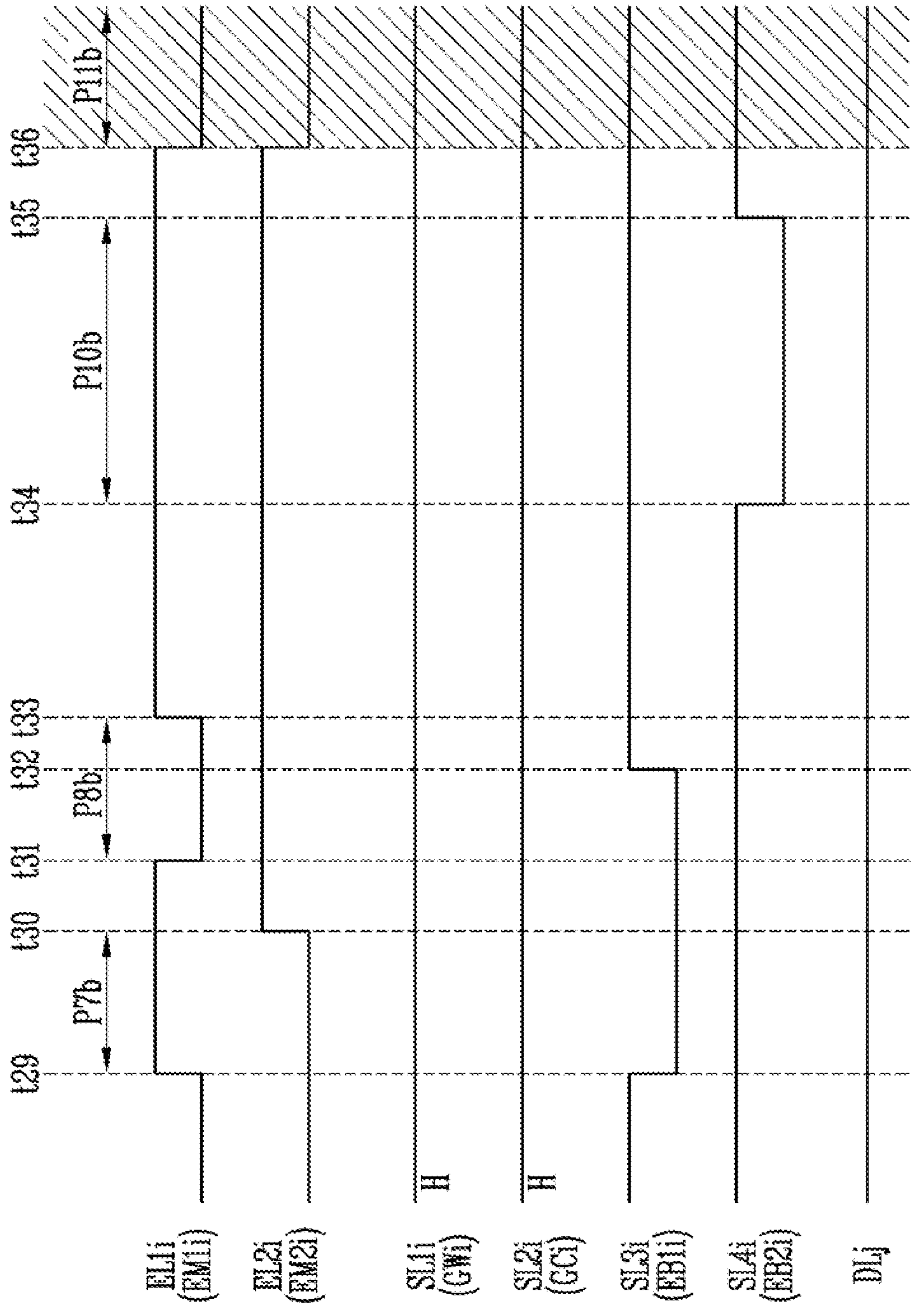

Since both the first emission control signal EM1*i* and the second emission control signal EM2*i* have the gate-on level in the nineteenth period P11*b* (or the second emission period) after a thirty-sixth time t36, which is highlighted by diagonal lines in FIG. 12E, the fifth and sixth transistors T5 and T6 are turned on, so that the pixel PX3 can emit light.

The third and fourth scan signals EB1*i* and EB2*i* and the first and second emission control signals EM1*i* and EMi2 may be supplied at a first frequency, regardless of the image refresh rate. Thus, even when the image refresh rate is changed, an initialization operation of the light emitting element LD, on-bias application in an on-bias period (e.g., the fourteenth period P10*a* and/or the seventeenth period P8*b*, and/or the eighteenth period P10*b*), and off-bias application in an off-bias period (e.g., the sixteenth period P7*b*) can be always performed periodically. Accordingly, a flicker can be minimized corresponding to various image refresh rates (e.g., low frequency driving).

In addition, the data driver 800 shown in FIG. 1) may not supply any data signal to the pixel PX3 in the self-scan period SSP. Thus, power consumption can be further reduced.

Figure 13:
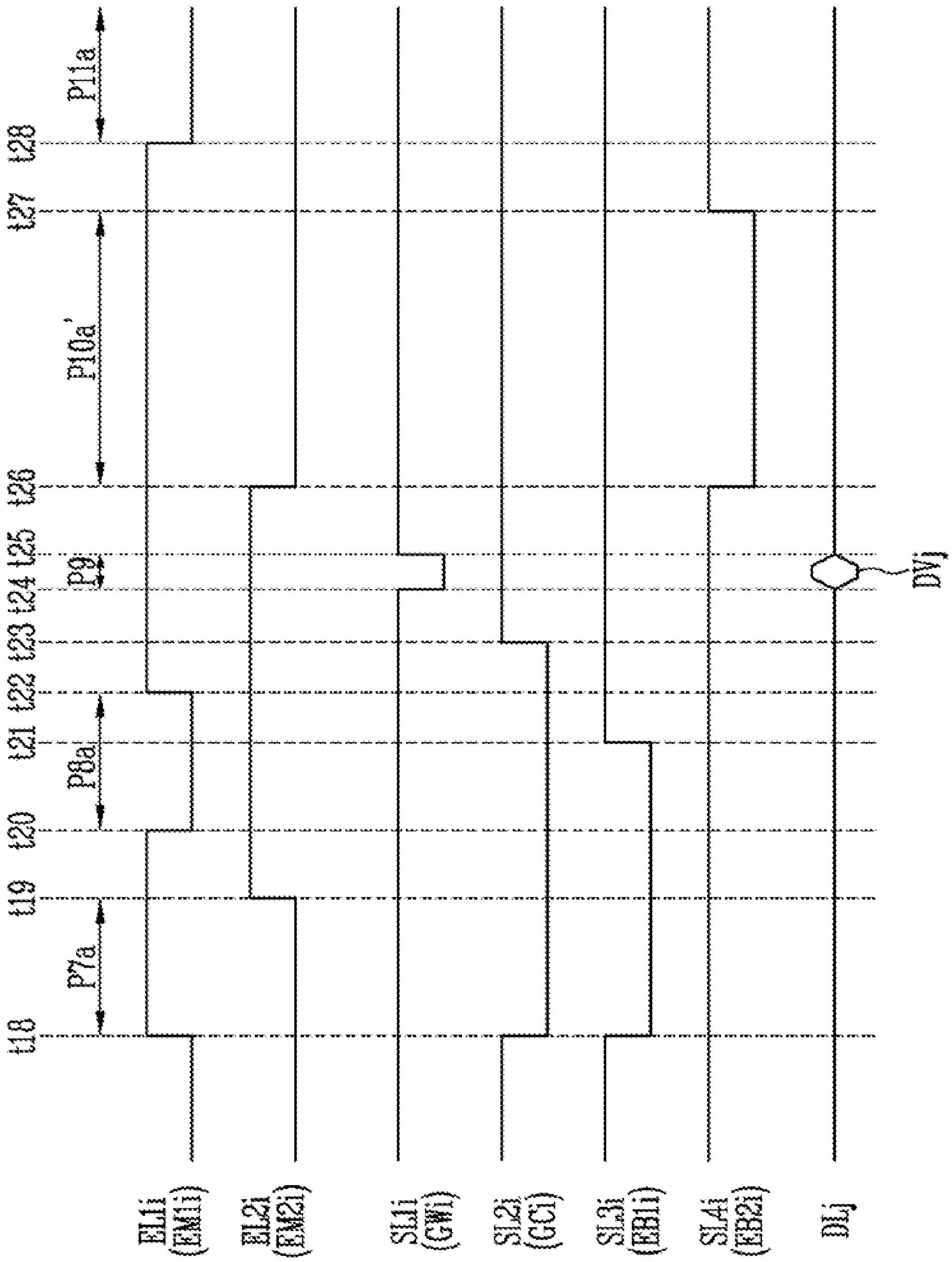
FIG. 13 is a waveform diagram illustrating an example of the operation of the pixel shown in FIG. 10.

FIG. 13 is a waveform diagram illustrating an example of the operation of the pixel shown in FIG. 10.

Referring to FIGS. 11A and 13, signals EM1*i*, GWi, GCi, EB1*i*, EB2*i*, and DVj shown in FIG. 13 are substantially identical to the first emission signal EM1*i*, the first scan signal GWi, the second scan signal GCi, the third scan signal EB1*i*, the fourth scan signal EB2*i*, and the data signal DVj shown in FIG. 11A, except for the second emission control signal EM2*i* shown in FIGS. 11A and 13, and therefore, overlapping descriptions may not be repeated.

Referring to FIGS. 10 and 13, the second emission control signal EM2*i* may be changed from the gate-off level to the gate-on level at a twenty-sixth time t26. In FIG. 11A, however, the second control signal EM2*i* maintains the gate-off level until the twenty-eighth time t28. Since the eighth transistor T8 is turned on or maintains the turn-on state by the fourth scan signal EB2*i* having a gate-on level, a low voltage (or the gate-on level) of the second emission control signal EM2*i* may be supplied to the second electrode (or drain electrode) of the first transistor T1.

Accordingly, an off-bias may be applied to the first transistor T1 during a fourteenth period P10*a* from the twenty-sixth time t26 to a twenty-seventh time t27. Therefore, the first transistor T1 may have an off-bias state.

Figure 14:
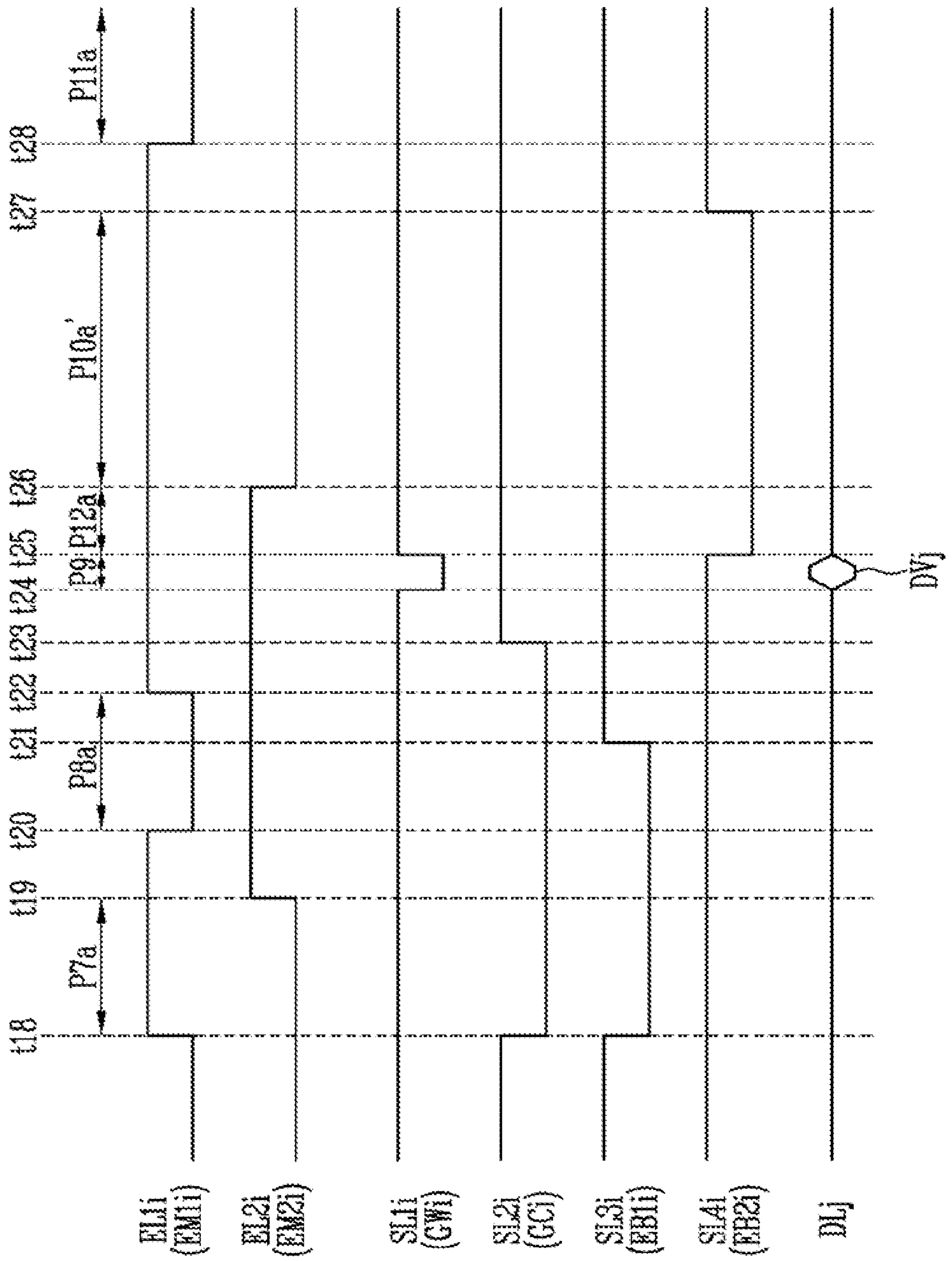
FIG. 14 is a waveform diagram illustrating an example of the operation of the pixel shown in FIG. 10.

FIG. 14 is a waveform diagram illustrating an example of the operation of the pixel shown in FIG. 10.

Referring to FIGS. 13 and 14, signals EM1*i*, EM2*i*, GWi, GCi, EB1*i*, and DVj shown in FIG. 14 are substantially identical to those EM1*i* EM2*i*, GWi, GCi, EB1*i*, and DVj shown in FIG. 13, except for the fourth scan signal EB2*i* shown in FIGS. 13 and 14, and therefore, overlapping descriptions may not be repeated.

Referring to FIGS. 10 and 14, the fourth scan signal EB2*i* may be changed from a gate-off level to a gate-on level at a twenty-fifth time t25. In FIG. 11A, however, the fourth scan signal EB2*i* maintains the gate-of level until the twenty-sixth time t26. Accordingly, the eighth transistor T8 may be turned on. Since the second emission control signal EM2*i* having a high voltage (or the gate-off level) is supplied to the second emission control line EL2, the high voltage (or the gate-off level) of the second emission control signal EM2*i* may be supplied to the second electrode (or drain electrode) of the first transistor T1.

Accordingly, an on-bias may be applied to the first transistor T1 during a twentieth period P12*a* from the twenty-fifth time t25 to a twenty-sixth time t26. In other words, the twentieth period P12*a* may be an on-bias period. As described above, a display device (e.g., the display device 1000 shown in FIG. 1) can apply both the off-bias and the on-bias to the first transistor T1 after a data writing period by adjusting the width of the fourth scan signal EB2*i*. In addition, although a case where the width of the fourth scan signal EB2*i* is adjusted in a display scan period DSP has been described with reference to FIG. 14, the display device (e.g., the display device 1000 shown in FIG. 1) may apply both the off-bias and the on-bias to the first transistor T1 by adjusting the width of the fourth scan signal EB2*i* in a self-scan period SSP.

Figure 15:
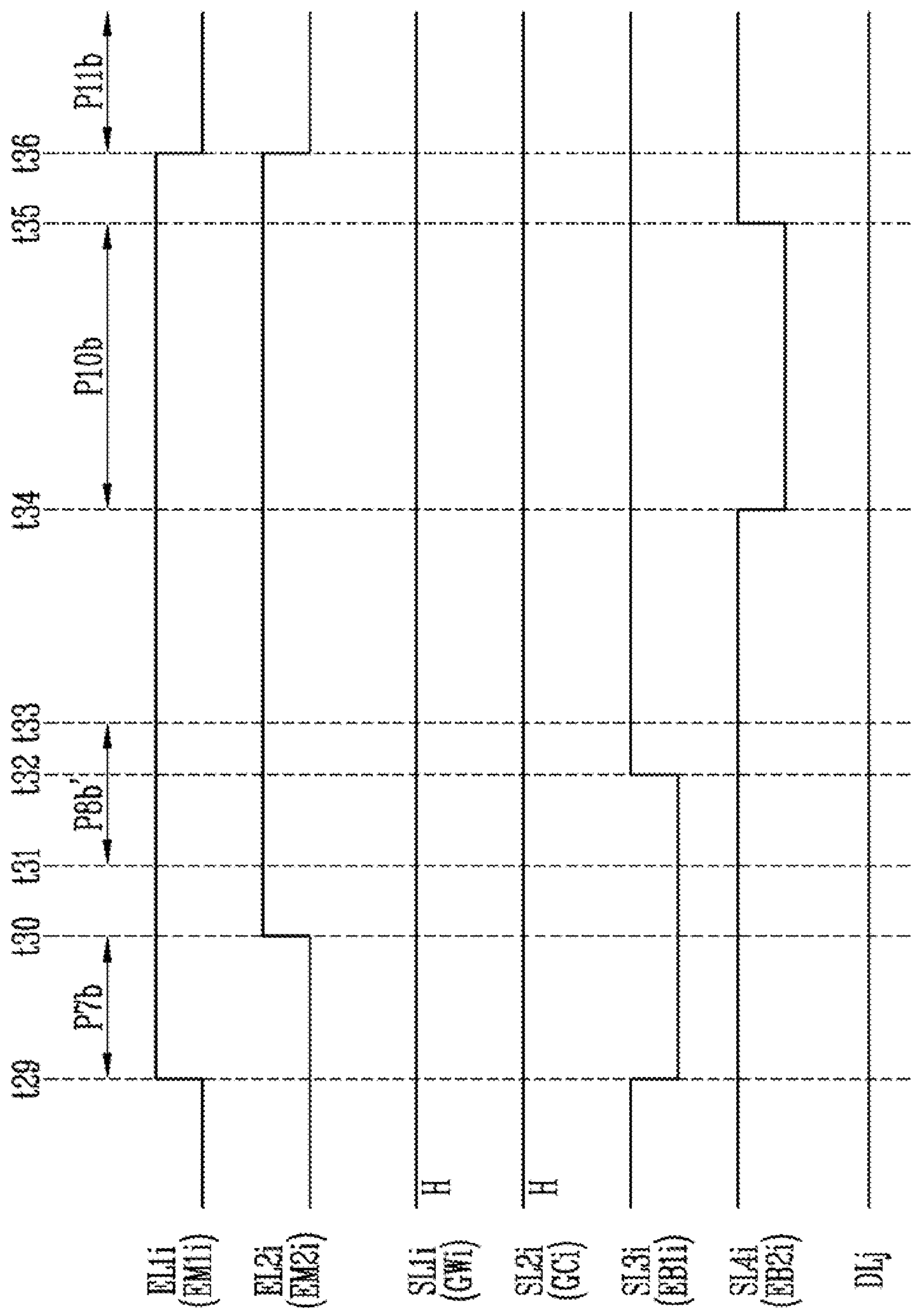
FIG. 15 is a waveform diagram illustrating an example of the operation of the pixel shown in FIG. 10.

FIG. 15 is a waveform diagram illustrating an example of the operation of the pixel shown in FIG. 10.

Referring to FIGS. 12A and 15, signals EM2*i*, GWi, GCi, EB1*i*, EB2*i*, and DVj shown in FIG. 15 are substantially identical to those EM2*i*, GWi, GCi, EB1*i*, EB2*i*, and DVj shown in FIG. 12A, except for the first emission control signal EM1*i* shown in FIGS. 12A and 15, and therefore, overlapping descriptions may not be repeated.

Referring to FIGS. 1, 10, and 15, during a seventeenth period P8*b*' from a thirty-first time t31 to a thirty-third time t33, the first emission control signal EM1*i* may be maintained to have a gate-off level. For example, the first emission control signal EM1*i* may be kept high. Accordingly, the display device 1000 lay not include an on-bias period of the seventeenth period P8*b*' in a self-scan period SSP. However, since the display device 1000 includes an on-bias period of an eighteenth period P10*b* in the self-scan period SSP, an on-bias may be applied to the first transistor T1.

Figure 16:
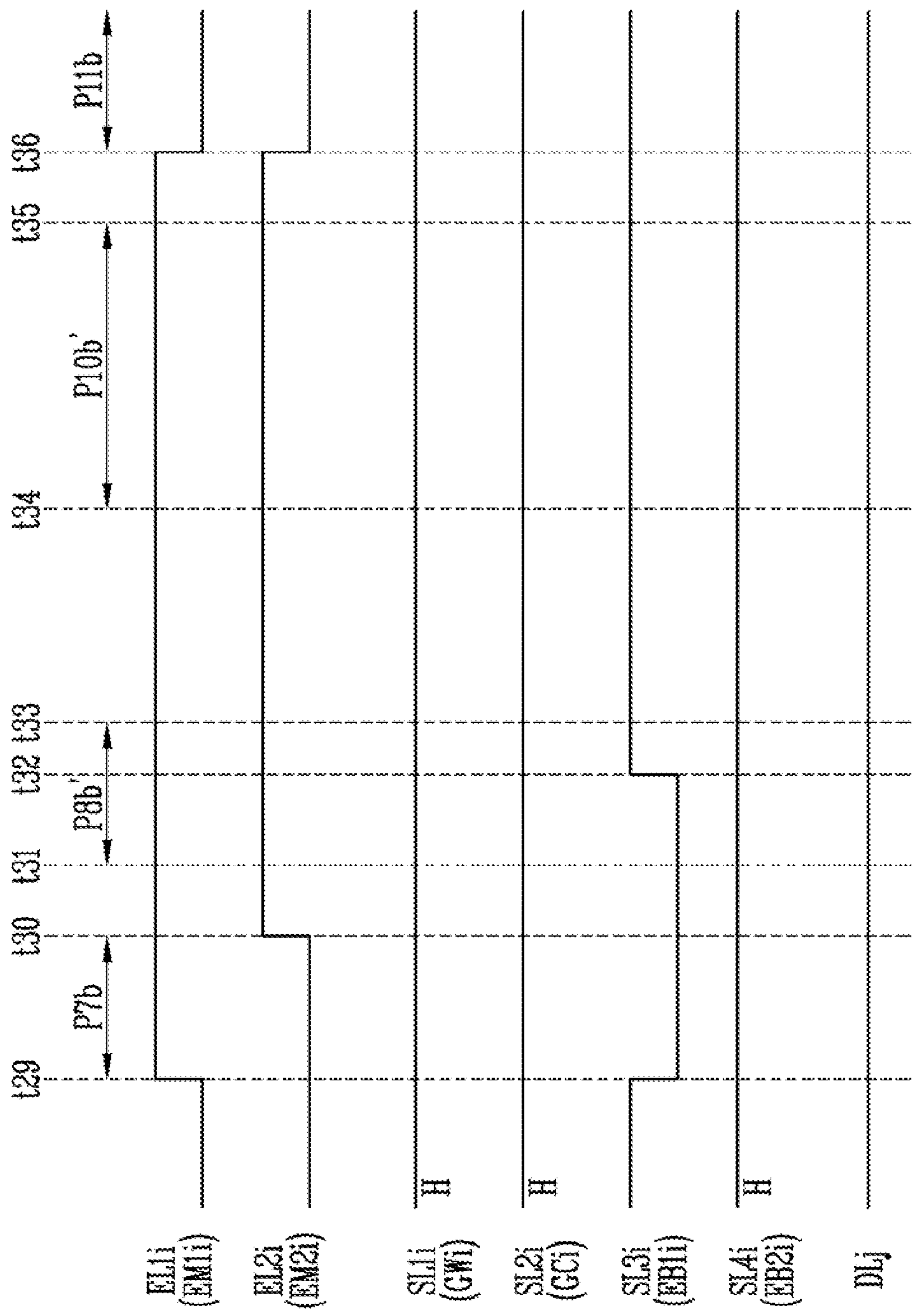
FIG. 16 is a waveform diagram illustrating an example of the operation of the pixel shown in FIG. 10.

FIG. 16 is a waveform diagram illustrating an example of the operation of the pixel shown in FIG. 10.

Referring to FIGS. 15 and 16, signals EM1*i*, EM2*i*, GWi, GCi, EB1*i*, and DVj shown in FIG. 16 are substantially identical to those EM1*i*, EM2*i*, GWi, GCi, EB1*i*, and DVj shown in FIG. 15, except for the fourth scan signal EB2*i* shown in FIGS. 15 and 16, and therefore, overlapping descriptions may not be repeated. For example, the fourth scan signal EB2*i* is kept high in FIG. 16.

Referring to FIGS. 1, 10, and 16, in a self-can period SSP, the fourth scan signal EB2*i* supplied to the fourth scan line SL4*i* may have a gate-off level (or high level H). Accordingly, the display device 1000 may not include the on-bias period of the eighteenth period P10*b* described with reference to FIG. 12A. As described with reference to FIGS. 8 to 9B, the pixel PX3 may not include eighth transistor T8, and the display device 1000 may not include the fourth scan driver 500.

The pixel PX3 applies an off-bias voltage to the first transistor T1 in the sixteenth period P7*b* by using the voltage of the initialization power source Vint, without including the eighth transistor T8, so that the hysteresis characteristic (e.g., the threshold voltage shift) of the first transistor T1 can be improved.

Figure 17:
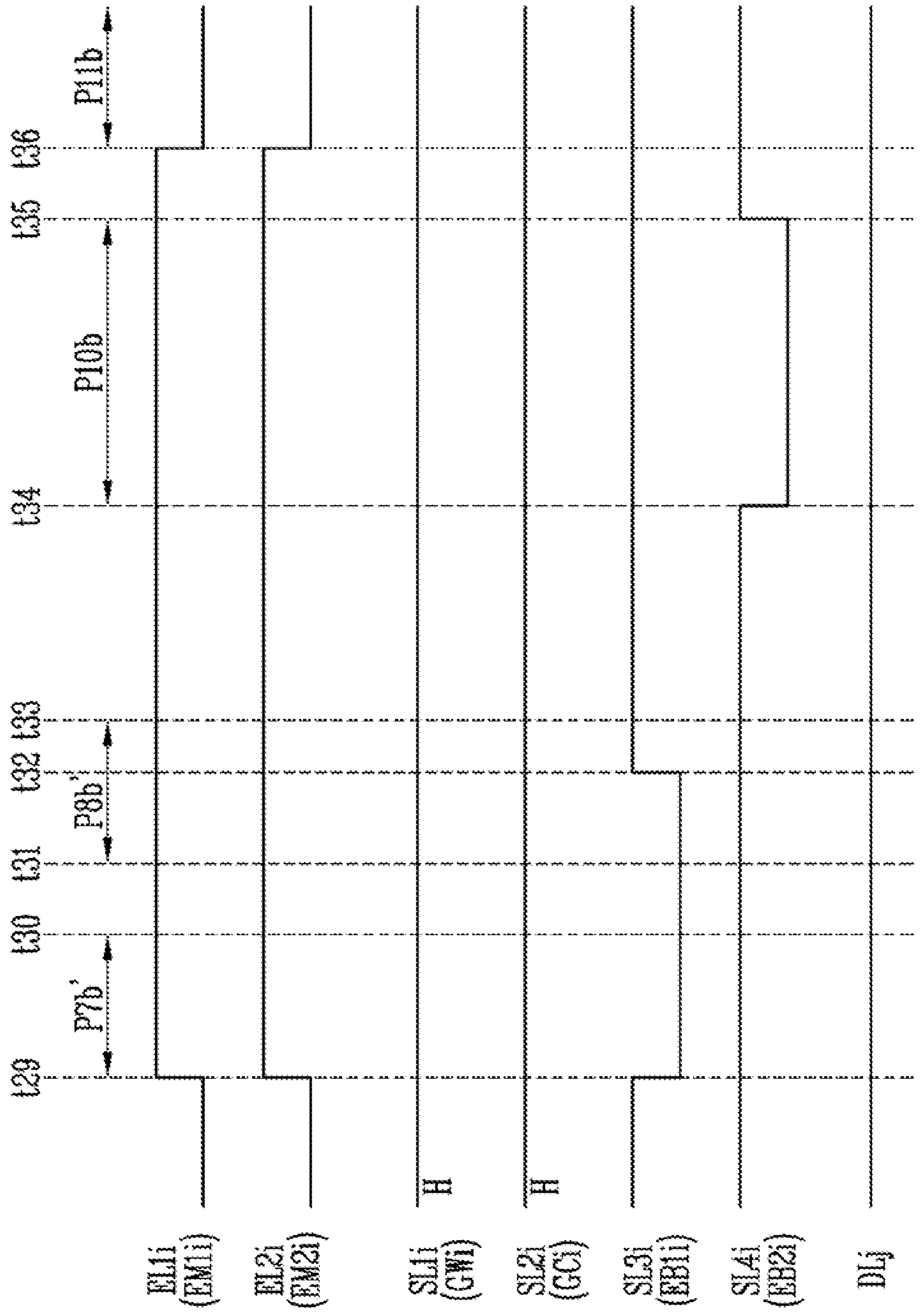
FIG. 17 is a waveform diagram illustrating an example of the operation of the pixel shown in FIG. 10.
Figure 18:
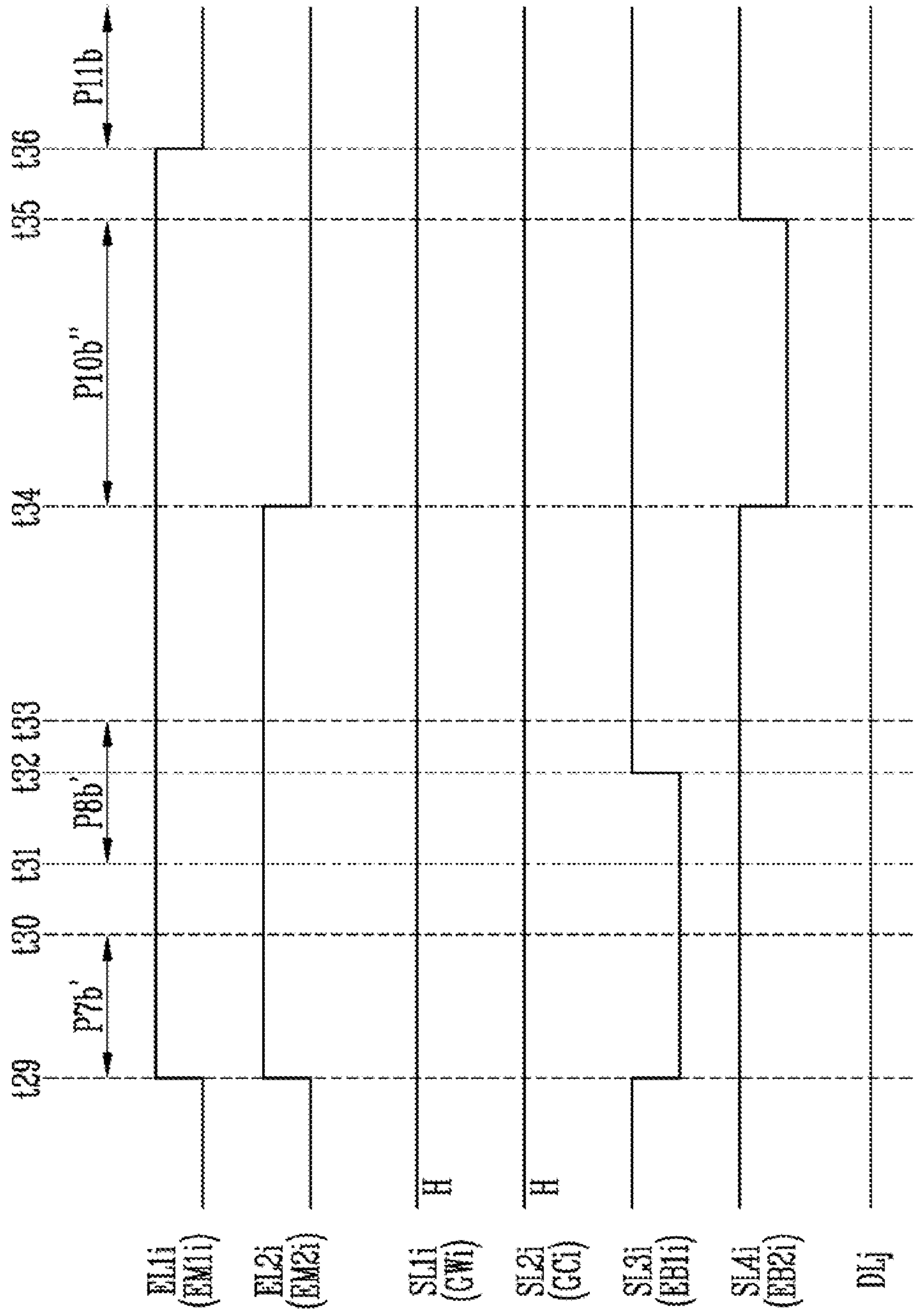
FIG. 18 is a waveform diagram illustrating an example of the operation of the pixel shown in FIG. 10.

FIG. 17 is a waveform diagram illustrating an example of the operation of the pixel shown in FIG. 10. FIG. 18 is a waveform diagram illustrating an example of the operation of the pixel shown in FIG. 10.

Referring to FIGS. 15, 17, and 18, signals EM1*i*, GWi, GCi, EB1*i*, EB2*i*, and DVj shown in FIGS. 17 and 18 are substantially identical to those EM1*i*, GWi, GCi, EB1*i*, EB2*i*, and DVj shown in FIG. 15, except for the second emission control signal EM2*i* shown in FIGS. 15, 17, and 18, and therefore, overlapping descriptions may not be repeated. For example, the second emission control signal EM2*i* is kept high from the twenty-ninth time t29 to the thirty-sixth time t36 in FIG. 17 and the second emission control signal EM2*i* transitions high at the twenty-ninth time t29 and low at the thirty-fourth time t34 in FIG. 18.

Referring to FIGS. 1, 10, 17, and 18, during a sixteenth period P7*b*' from a twenty-ninth time t29 to a thirtieth time t30, the second emission control signal EM2*i* having a gate-off level may be supplied to the second emission control line EL2. Accordingly, since the sixth transistor T6 is turned off or maintains the turn-off state during the sixteenth period P7*b*', the voltage (e.g., an off-bias) of the initialization power source having a low voltage may not be applied to the second electrode (or drain electrode) of the first transistor T1 in the sixteenth period P7*b*'.

During an eighteenth period (P10*b* shown in FIG. 17 or P10*b*" shown in FIG. 18) in which the fourth scan single EB2*i* having a gate-on level is supplied, the eighth transistor T8 is turned on. The display device 1000 supplies the second emission control signal EM2*i* having a high voltage (or the gate-off level) as shown in FIG. 17, or supplies the second emission control signal EM2*i* having a low voltage (or the gate-on level) as shown in FIG. 18, so that an on-bias or an off-bias can be selectively applied to the first transistor T1.

Figure 19:
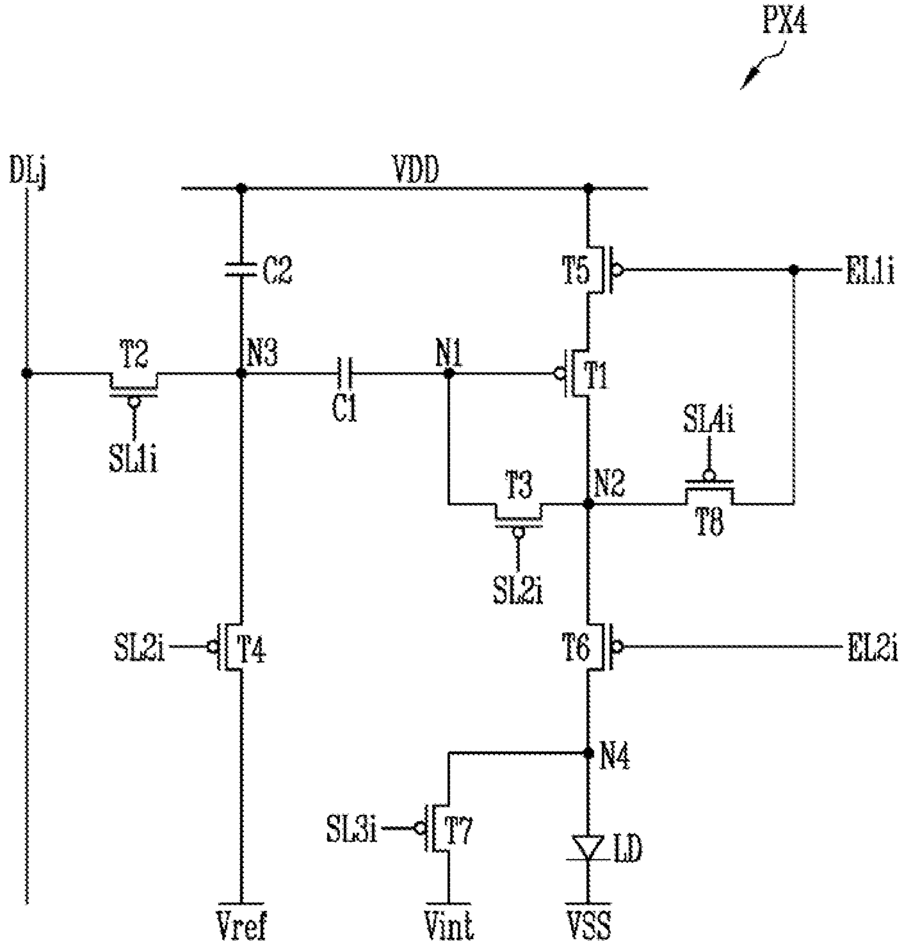
FIG. 19 is a circuit diagram illustrating a pixel in accordance with embodiments of the present invention.

FIG. 19 is a circuit diagram illustrating a pixel in accordance with embodiments of the present invention.

Referring to FIGS. 10 and 19, a pixel PX4 shown in FIG. 19 is substantially identical to the pixel PX3 shown in FIG. 10, except for a connection relationship of the eighth transistor T8, and therefore, overlapping descriptions may not be repeated. In FIG. 19, for example, the eighth transistor T8 is connected to the first emission control line EL1*i* instead of the second emission control line EL2*i*.

Referring to FIG. 19, the eighth transistor T8 may be connected between the second electrode (or the second node N2) of the first transistor T1 and the first emission control line EL1*i*. Since the first emission control signal and the second emission control signal have the same waveform in a period (e.g., the fourteenth period P10*a* shown in FIG. 11A and/or the eighteenth period P10*b* shown in FIG. 12A) in which the fourth scan signal EB2*i* having a gate-on level is supplied, so that the eighth transistor T8 is turned on, the pixel PX4 shown in FIG. 19 may perform the same operation as the pixel PX3 shown in FIG. 10.

Figure 20:
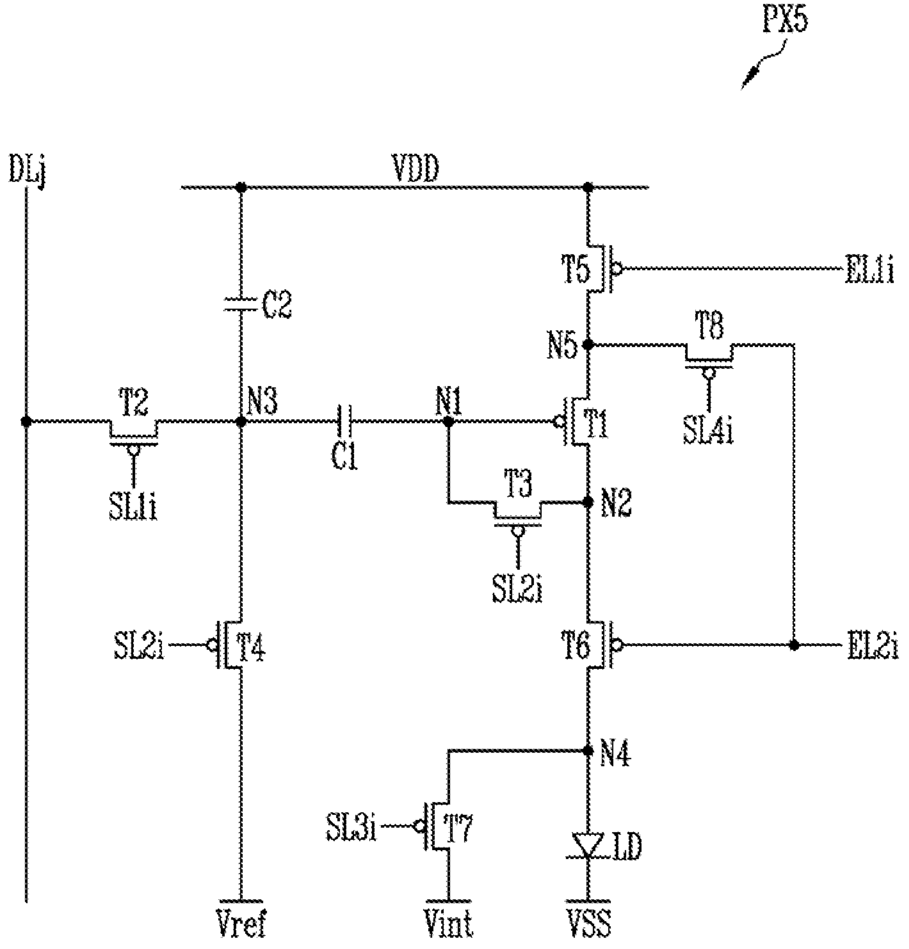
FIG. 20 is a circuit diagram illustrating a pixel in accordance with embodiments of the present invention.

FIG. 20 is a circuit diagram illustrating a pixel in accordance with embodiments of the present invention.

Referring to FIGS. 10 and 20, a pixel PX5 shown in FIG. 20 is substantially identical to the pixel PX3 shown in FIG. 10, except for a connection relationship of the eighth transistor T8, and therefore, overlapping descriptions may not be repeated.

Referring to FIG. 20, the eighth transistor T8 may be connected between the first electrode (or a fifth node N5) of the first transistor T1 and the second emission control line EL2*i*. When the second emission control signal EM2*i* having a high voltage (or gate-off level) is supplied or the second emission control signal EM2*i* having a low voltage (or gate-on level) is supplied, in a period (e.g., the fourteenth period P10*a* shown in FIG. 11A and/or the eighteenth period P10*b* shown in FIG. 12A) in which the fourth scan signal EB2*i* having the gate-on level is supplied, so that the eighth transistor T8 is turned on, the high voltage or the low voltage is supplied to the first electrode (or source electrode) of the first transistor T1, so that the first transistor T1 can have an on-bias state or an off-bias state.

Figure 21:
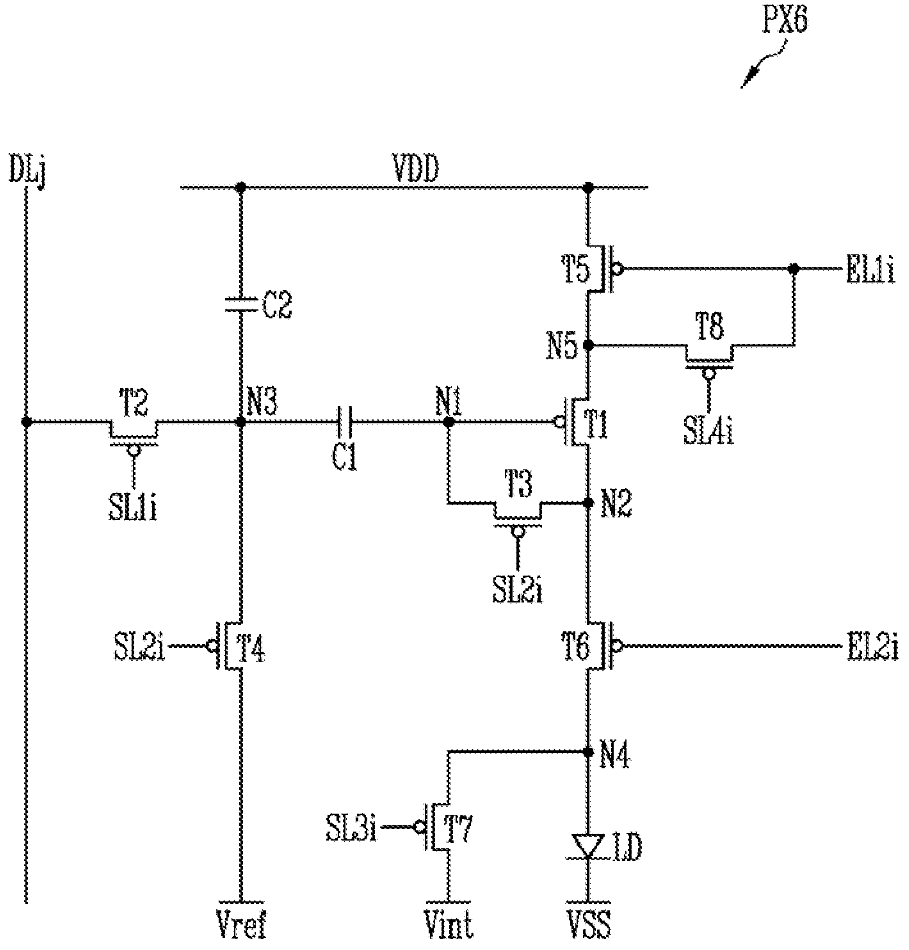
FIG. 21 is a circuit diagram illustrating a pixel in accordance with embodiments of the present invention.

FIG. 21 is a circuit diagram illustrating a pixel in accordance with embodiments of the present invention.

Referring to FIG. 21, the eighth transistor TB may be connected between the first electrode (or a fifth node N5) of the first transistor T1 and the first emission control line EL1*i*. As described with reference to FIGS. 19 and 20, in a period (e.g., the fourteenth period P10*a* shown in FIG. 11A and/or the eighteenth period P10*b* shown in FIG. 12A) in which the fourth scan signal EB2*i* having a gate-on level is supplied, so that the eighth transistor T8 is turned on, a high voltage or a low voltage is supplied to the first electrode (or source electrode) of the first transistor T1 by the first emission control signal having the same waveform as the second emission control signal, so that the first transistor T1 can have an on-bias state or an off-bias state.

In the pixel and the display device having the same in accordance with embodiments of the present invention, one display scan period and at least one self-scan period are included in one frame, so that an image output using various driving frequencies can be supported. In addition, a number of self-scan periods increases as the driving frequency decreases, so that a decrease in luminance and viewing of a flicker can be minimized.

Further, a bias is applied, using a constant voltage, to the first transistor through the eighth transistor, so that a hysteresis characteristic (or a difference in threshold voltage shift) due to a bias difference (and a grayscale difference) between adjacent pixels can be improved. Thus, screen attraction (e.g., a ghost phenomenon) caused by a hysteresis variation can be minimized.

In the display device in accordance with embodiments of the present invention, the second electrode of the driving transistor is initialized to a low voltage after data writing, so that unintended emission of the light emitting element before an emission period can be prevented.

While the present invention has been shown and described with reference to embodiments thereof, it will be understood by those of skill in the art that various changes in form and details may be made thereto without departing from the spirit and scope of the present invention as set forth in the following claims.

What is claimed is:

1. A pixel, comprising:
- a light emitting element;
- a first transistor connected between a first power source and a second node, the first transistor controlling a driving current supplied to the light emitting element;
- a first capacitor including a first electrode connected to one of a first node and the second node and a second electrode connected to a third node;
- a second transistor connected between the third node and a data line, the second transistor being turned on by a first scan signal;
- a third transistor connected between the first node and the second node, the third transistor being turned on by a second scan signal;
- a fifth transistor connected between the first power source and the first transistor, the fifth transistor being turned on by a first emission control signal;
- a sixth transistor connected between the second node and the light emitting element, the sixth transistor being turned on by a second emission control signal; and
- an eighth transistor connected between the second node and a second emission control line, the eighth transistor being turned on by a fourth scan signal.

2. The pixel of claim 1, further comprising:
- a fourth transistor connected between a reference power source and the third node, the fourth transistor being turned on by a third scan signal; and
- a second capacitor connected between the first power source and the first node,
- wherein the first electrode of the first capacitor is connected to the second node.

3. The pixel of claim 2, further comprising a seventh transistor connected between the light emitting element and an initialization power source, the seventh transistor being turned on by the third scan signal.

4. The pixel of claim 3, wherein a frame includes an initialization period in which the initialization power source is supplied to the first node and a fourth node between the light emitting element and the seventh transistor, a compensation period in which the first node and the second node are electrically connected to each other, a writing period in which a data signal is supplied to the third node, a bias period in which a bias voltage is supplied to the first transistor, and an emission period in which the light emitting element emits light.

5. The pixel of claim 4, wherein the bias period includes an on-bias period in which the first transistor has an on-bias state, and
- during the on-bias period, the third and sixth transistors are turned off, and the eighth transistor is turned on.

6. The pixel of claim 4, wherein the bias period includes an off-bias period in which the first transistor has an off-bias state, and
- during the off-bias period, the third transistor is turned off, and the eighth transistor is turned on.

7. The pixel of claim 4, wherein the bias period includes an off-bias period in which the first transistor has an off-bias state, and
- during the off-bias period, the third transistor is turned off, and the sixth and seventh transistors are turned on.

8. The pixel of claim 4, wherein, in response to the second scan signal, the third transistor is turned on in the initialization period, the compensation period, and the writing period, and is turned off in the bias period and the emission period, and
- in response to the third scan signal, the seventh transistor is turned on in the initialization period and the compensation period, and is turned off in the writing period, the bias period, and the emission period.

9. The pixel of claim 7, wherein, in response to the second scan signal, the third transistor is turned on in the initialization period, the compensation period, and the writing period, and is turned off in the bias period and the emission period, and
- in response to the third scan signal, the seventh transistor is turned on in the initialization period, the compensation period, and the off-bias period, and is turned off in the writing period, a period except the off bias period in the bias period, and the emission period.

10. The pixel of claim 1, further comprising:
- a second capacitor connected between the first power source and the third node; and
- a fourth transistor connected between a reference power source and the third node, the fourth transistor being turned on by the second scan signal,
- wherein the first electrode of the first capacitor is connected to the first node.

11. The pixel of claim 10, further comprising a seventh transistor connected between the light emitting element and an initialization power source, the seventh transistor being turned on by a third scan signal.

12. The pixel of claim 11, wherein a frame includes an initialization period in which the initialization power source is supplied to the first node and a fourth node between the light emitting element and the seventh transistor, a compensation period in which the first node and the second node are electrically connected to each other, a writing period in which a data signal is supplied to the third node, a bias period in which a bias voltage is supplied to the first transistor, and an emission period in which the light emitting element emits light.

13. The pixel of claim 12, wherein the bias period includes an on-bias period in which the first transistor has an on-bias state, and
- during the on-bias period, the fifth and sixth transistors are turned off, and the eighth transistor is turned on.

14. The pixel of claim 12, wherein the bias period includes an off-bias period in which the first transistor has an off-bias state, and
- during the off-bias period, the fifth transistor is turned off, and the eighth transistor is turned on.

15. The pixel of claim 12, wherein the bias period includes an on-bias period in which the first transistor has an on-bias state, and during the on-bias period, the sixth transistor is turned off, and the fifth transistor is turned on.

16. The pixel of claim 12, wherein the bias period includes an off-bias period in which the first transistor has an off-bias state, and during the off-bias period, the fifth transistor is turned off, and the sixth and seventh transistors are turned off.

17. A display device, comprising:

a display panel including pixels connected to first scan lines, second scan lines, third scan lines, first emission control lines, second emission control lines, and data lines;

a scan driver configured to supply a first scan signal to the first scan lines, supply a second scan signal to the second scan lines, and supply a third scan signal to the third scan lines;

an emission driver configured to supply a first emission control signal to the first emission control lines, and supply a second emission control signal to the second emission control lines;

a data driver configured to supply a data signal to the data lines; and a timing controller configured to control the scan driver, the emission driver, and the data driver, wherein at least one of the pixels includes:

a light emitting element;

a first transistor connected between a first power source and a second node, the first transistor controlling a driving current supplied to the light emitting element;

a first capacitor connected between the second node and a third node;

a second transistor connected between the third node and a corresponding data line among the data lines, the second transistor being switched on by the first scan signal;

a third transistor connected between a first node and the second node, the third transistor being switched on by the second scan signal;

a fourth transistor connected between a reference power source and the third node, the fourth transistor being switched on by the third scan signal;

a fifth transistor connected between the first power source and the first transistor, the fifth transistor being switched on by the first emission control signal;

a sixth transistor connected between the second node and the light emitting element, the sixth transistor being switched on by the second emission control signal;

a seventh transistor connected between the light emitting element and an initialization power source, the seventh transistor being switched on by the third scan signal;

an eighth transistor connected between the second node and a corresponding second emission control line among the second emission control lines, the eighth transistor being switched on by a fourth scan signal; and a second capacitor connected between the first power source and the first node.

18. The display device of claim 17, wherein the scan driver includes a first scan driver which supplies the first scan signal to the first scan lines at a second frequency corresponding to an image refresh rate of the pixels, a second scan driver which supplies the second scan signal to the second scan lines at the second frequency, and a third scan driver which supplies the third scan signal to the third scan lines at a first frequency, wherein the emission driver includes a first emission driver which supplies the first emission control signal to the first emission control lines at the first frequency and a second emission driver which supplies the second emission control signal to the second emission control lines at the first frequency, and wherein the data driver supplies a data signal to the data lines according to the second frequency.

19. The display device of claim 18, wherein the first scan driver and the second scan driver supply the first scan signal and the second scan signal during a display scan period in a frame, and do not supply the first scan signal and the second scan signal during a self-scan period in the frame, wherein, during the display scan period, the data signal is written to the pixels, and wherein, during the display scan period and the self-scan period, the first transistor is biased by the initialization power source, the third scan signal, and the second emission control signal.

20. The display device of claim 18, wherein the pixels are further connected to fourth scan lines, wherein the scan driver further includes a fourth scan driver which supplies the fourth scan signal to the fourth scan lines at the first frequency.

21. The display device of claim 20, wherein the first scan driver and the second scan driver supply the first scan signal and the second scan signal during a display scan period in a frame, and do not supply the first scan signal and the second scan signal during a self-scan period in the frame, wherein, during the display scan period, the data signal is written to the pixels, and wherein, during the display scan period and the self-scan period, the first transistor is biased by the fourth scan signal and the second emission control signal.

22. The display device of claim 18, wherein an image refresh rate of the pixels decreases as a number of self-scan periods increases.

23. The display device of claim 18, wherein the second frequency corresponds to a divisor of the first frequency.

24. A display device, comprising:

a display panel including pixels connected to first scan lines, second scan lines, third scan lines, first emission control lines, second emission control lines, and data lines;

a scan driver configured to supply a first scan signal to the first scan lines, supply a second scan signal to the second scan lines, and supply a third scan signal to the third scan lines;

an emission driver configured to supply a first emission control signal to the first emission control lines, and supply a second emission control signal to the second emission control lines;

a data driver configured to supply a data signal to the data lines; and a timing controller configured to control the scan driver, the emission driver, and the data driver, wherein at least one of the pixels includes:

a light emitting element;

a first transistor connected between a first power source and a second node, the first transistor controlling a driving current supplied to the light emitting element;

a first capacitor connected between a first node and a third node;

a second capacitor connected between the first power source and the third node;

a second transistor connected between the third node and a corresponding data line among the data lines, the second transistor receiving the first scan signal;

a third transistor connected between the first node and the second node, the third transistor receiving the second scan signal;

a fourth transistor connected between a reference power source and the third node, the fourth transistor receiving the second scan signal;

a fifth transistor connected between the first power source and the first transistor, the fifth transistor receiving the first emission control signal;

a sixth transistor connected between the second node and the light emitting element, the sixth transistor receiving the second emission control signal;

a seventh transistor connected between the light emitting element and an initialization power source, the seventh transistor receiving the third scan signal; and an eighth transistor connected between the second node and a corresponding second emission control line among the second emission control lines, the eighth transistor receiving a fourth scan signal.

25. The display device of claim 24, wherein the scan driver includes a first scan driver which supplies the first scan signal to the first scan lines at a second frequency corresponding to an image refresh rate of the pixels, a second scan driver which supplies the second scan signal to the second scan lines at the second frequency, and a third scan driver which supplies the third scan signal to the third scan lines at a first frequency, wherein the emission driver includes a first emission driver which supplies the first emission control signal to the first emission control lines at the first frequency and a second emission driver which supplies the second emission control signal to the second emission control lines at the first frequency, and wherein the data driver supplies a data signal to the data lines according to the second frequency.

26. The display device of claim 25, wherein the first scan driver and the second scan driver supply the first scan signal and the second scan signal during a display scan period in a frame, and do not supply the first scan signal and the second scan signal during a self-scan period in the frame, during the display scan period, the data signal is written to the pixels, and during the self-scan period, the first transistor is biased by a first power provided from the first power source and the first emission control signal.

27. The display device of claim 25, wherein the pixels are further connected to fourth scan lines, wherein the scan driver further includes a fourth scan driver which supplies the fourth scan signal to the fourth scan lines at the first frequency.

28. The display device of claim 27, wherein the first scan driver and the second scan driver supply the first scan signal and the second scan signal during a display scan period in a frame, and do not supply the first scan signal and the second scan signal during a self-scan period in the frame, during the display scan period, the data signal is written to the pixels, and during the display scan period and the self-scan period, the first transistor is biased by the fourth scan signal and the second emission control signal.

* * * * *